United States Patent
Ki et al.

(10) Patent No.: US 12,413,243 B2
(45) Date of Patent: Sep. 9, 2025

(54) SYSTEMS, METHODS, AND APPARATUS FOR DIVIDING AND COMPRESSING DATA

(71) Applicant: Samsung Electronics Co., Ltd., Suwon-si (KR)

(72) Inventors: Yang Seok Ki, Palo Alto, CA (US); Sungwook Ryu, Palo Alto, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 17/677,989

(22) Filed: Feb. 22, 2022

(65) Prior Publication Data
US 2023/0055535 A1  Feb. 23, 2023

Related U.S. Application Data

(60) Provisional application No. 63/231,710, filed on Aug. 10, 2021, provisional application No. 63/231,715, (Continued)

(51) Int. Cl.
| G06F 16/00 | (2019.01) |
| G06F 16/21 | (2019.01) |
| H03M 7/40 | (2006.01) |

(52) U.S. Cl.
CPC ............ *H03M 7/40* (2013.01); *G06F 16/217* (2019.01)

(58) Field of Classification Search
CPC .... H03M 7/40; H03M 7/3059; H03M 7/6047; H03M 7/3095; H03M 7/3086; G06F 16/217
See application file for complete search history.

(56) References Cited

U.S. PATENT DOCUMENTS 5,396,595 A * 3/1995 Standley ............... H03M 7/42
                                                          710/68
6,351,776 B1   2/2002 O'Brien et al.
(Continued)

FOREIGN PATENT DOCUMENTS

| CN | 105242879 A | 1/2016 |
| WO | 2013136584 A1 | 9/2013 |

(Continued)

OTHER PUBLICATIONS

Adams, Ian F. et al., "Respecting the Block Interface-Computational Storage Using Virtual Objects," USENIX Association, 11th USENIX Workshop on Hot Topics in Storage and File Systems (HotStorage 19), (https://www.usenix.org/system/files/hotstorage19-paper-adams.pdf), 2019, 7 pages.

(Continued)

*Primary Examiner* — Paul Kim
(74) *Attorney, Agent, or Firm* — Renaissance IP Law Group LLP

(57) ABSTRACT

A method for data compression may include scanning input data, performing, based on the scanning, a compression operation to generate compressed data using the input data, finding, based on the scanning, a delimiter in the input data, and generating, based on a position of the delimiter in the input data, a portion of data using the compressed data. The input data may include a record, the delimiter indicates a boundary of the record, and the portion of data may include the record. The generating may include generating the portion of data based on a portion size. The portion size may be a default portion size. The portion size may be based on a default portion size and a length of a match in the input data.

20 Claims, 27 Drawing Sheets

Related U.S. Application Data filed on Aug. 10, 2021, provisional application No. 63/231,709, filed on Aug. 10, 2021, provisional application No. 63/231,711, filed on Aug. 10, 2021.

(56) References Cited

U.S. PATENT DOCUMENTS

| | | | |
|---|---|---|---|
| 6,938,204 B1* | 8/2005 | Hind | G06F 16/80 |
| | | | 707/999.102 |
| 7,065,618 B1 | 6/2006 | Ghemawat et al. | |
| 7,315,923 B2 | 1/2008 | Retnamma et al. | |
| 7,447,865 B2 | 11/2008 | Uppala | |
| 7,464,247 B2 | 12/2008 | Uppala | |
| 7,571,346 B2 | 8/2009 | Illowsky et al. | |
| 7,587,569 B2 | 9/2009 | Uppala | |
| 7,640,363 B2 | 12/2009 | Teodosiu et al. | |
| 7,681,240 B2 | 3/2010 | Maheshwari et al. | |
| 7,716,180 B2 | 5/2010 | Vermeulen et al. | |
| 7,921,087 B2 | 4/2011 | Uppala | |
| 8,028,106 B2 | 9/2011 | Bondurant et al. | |
| 8,195,978 B2 | 6/2012 | Flynn et al. | |
| 8,214,517 B2 | 7/2012 | Dubnicki et al. | |
| 8,380,681 B2 | 2/2013 | Oltean et al. | |
| 8,468,345 B2 | 6/2013 | Auradkar et al. | |
| 8,509,315 B1 | 8/2013 | Petranovich | |
| 8,533,231 B2 | 9/2013 | Aizman et al. | |
| 8,645,335 B2 | 2/2014 | Gupta et al. | |
| 8,689,279 B2 | 4/2014 | Basmov et al. | |
| 8,712,978 B1 | 4/2014 | Shilane et al. | |
| 8,762,743 B2 | 6/2014 | Cannon et al. | |
| 8,799,238 B2 | 8/2014 | Eshghi et al. | |
| 8,799,746 B2 | 8/2014 | Baker et al. | |
| 8,832,043 B2 | 9/2014 | Koifman et al. | |
| 8,838,541 B2 | 9/2014 | Camble et al. | |
| 8,886,914 B2 | 11/2014 | Huang | |
| 8,909,657 B2 | 12/2014 | Mensch et al. | |
| 8,954,654 B2 | 2/2015 | Yu et al. | |
| 8,972,672 B1 | 3/2015 | Wallace et al. | |
| 9,002,907 B2 | 4/2015 | Martin et al. | |
| 9,110,936 B2 | 8/2015 | Li et al. | |
| 9,165,154 B2 | 10/2015 | Auradkar et al. | |
| 9,195,851 B1 | 11/2015 | Chandra | |
| 9,201,800 B2 | 12/2015 | Bolla et al. | |
| 9,253,166 B2 | 2/2016 | Gauda | |
| 9,298,951 B2 | 3/2016 | Barney et al. | |
| 9,400,610 B1 | 7/2016 | Wallace et al. | |
| 9,426,219 B1* | 8/2016 | Keyser | G06F 16/254 |
| 9,537,650 B2 | 1/2017 | Auradkar et al. | |
| 9,823,981 B2 | 11/2017 | Kalach et al. | |
| 10,187,358 B2 | 1/2019 | Fahey et al. | |
| 10,296,494 B2 | 5/2019 | Davis et al. | |
| 10,310,765 B1 | 6/2019 | Laurence | |
| 10,318,389 B2 | 6/2019 | Arslan et al. | |
| 10,346,066 B2 | 7/2019 | Danilov et al. | |
| 10,348,693 B2 | 7/2019 | Auradkar et al. | |
| 10,387,673 B2 | 8/2019 | Surla et al. | |
| 10,394,757 B2 | 8/2019 | Cheung et al. | |
| 10,552,062 B2 | 2/2020 | Ki | |
| 10,572,161 B2 | 2/2020 | Subramanian et al. | |
| 10,608,784 B2 | 3/2020 | Yanovsky et al. | |
| 10,664,165 B1 | 5/2020 | Faibish et al. | |
| 10,776,321 B1 | 9/2020 | Balcha et al. | |
| 10,809,945 B2 | 10/2020 | Patwardhan et al. | |
| 10,838,990 B1 | 11/2020 | Shilane et al. | |
| 10,852,989 B1 | 12/2020 | Patel et al. | |
| 10,949,303 B2 | 3/2021 | Kohli | |
| 10,977,136 B2 | 4/2021 | Patel et al. | |
| 11,017,127 B2 | 5/2021 | Secatch et al. | |
| 11,023,318 B1 | 6/2021 | Volkov et al. | |
| 11,177,012 B1 | 11/2021 | Avraham et al. | |
| 12,106,455 B2 | 10/2024 | Chiyoda et al. | |
| 2003/0088783 A1 | 5/2003 | DiPierro | |
| 2004/0049700 A1 | 3/2004 | Yoshida | |
| 2006/0020605 A1 | 1/2006 | Chan et al. | |
| 2006/0182274 A1 | 8/2006 | Nicolai et al. | |
| 2009/0132760 A1 | 5/2009 | Flynn et al. | |
| 2012/0089775 A1 | 4/2012 | Ranade et al. | |
| 2012/0159098 A1 | 6/2012 | Cheung et al. | |
| 2012/0254689 A1 | 10/2012 | Resch | |
| 2014/0250119 A1 | 9/2014 | Bhattiprolu et al. | |
| 2014/0281146 A1 | 9/2014 | Horn | |
| 2015/0378616 A1 | 12/2015 | Khadiwala et al. | |
| 2015/0379072 A1 | 12/2015 | Dirac et al. | |
| 2015/0379425 A1* | 12/2015 | Dirac | G06N 20/00 |
| | | | 706/12 |
| 2017/0185625 A1 | 6/2017 | Cheru et al. | |
| 2018/0024746 A1 | 1/2018 | Jagadeesh et al. | |
| 2018/0026655 A1 | 1/2018 | Gopal et al. | |
| 2018/0152733 A1 | 5/2018 | Karaje et al. | |
| 2018/0267856 A1 | 9/2018 | Hayasaka et al. | |
| 2018/0285014 A1 | 10/2018 | Li et al. | |
| 2018/0314710 A1 | 11/2018 | Peloski | |
| 2018/0365102 A1 | 12/2018 | Li et al. | |
| 2019/0005262 A1 | 1/2019 | Surla et al. | |
| 2019/0007493 A1 | 1/2019 | Gray et al. | |
| 2019/0196907 A1 | 6/2019 | Khan et al. | |
| 2020/0042500 A1 | 2/2020 | Li et al. | |
| 2020/0117362 A1 | 4/2020 | McCarthy et al. | |
| 2020/0117518 A1 | 4/2020 | Costa et al. | |
| 2020/0134049 A1 | 4/2020 | Bassov et al. | |
| 2020/0162101 A1* | 5/2020 | Beckman | G06F 3/0613 |
| 2020/0201789 A1 | 6/2020 | Durham et al. | |
| 2020/0241960 A1 | 7/2020 | Yanovsky et al. | |
| 2020/0274855 A1 | 8/2020 | Xin | |
| 2020/0296100 A1 | 9/2020 | Prahlad et al. | |
| 2020/0341690 A1 | 10/2020 | Saad et al. | |
| 2020/0372163 A1 | 11/2020 | Chung | |
| 2021/0004166 A1 | 1/2021 | Luo et al. | |
| 2021/0011799 A1 | 1/2021 | Chen et al. | |
| 2021/0019067 A1 | 1/2021 | Miller et al. | |
| 2021/0064477 A1 | 3/2021 | Patel et al. | |
| 2021/0064582 A1 | 3/2021 | Wang et al. | |
| 2021/0072899 A1 | 3/2021 | Furuta et al. | |
| 2021/0096962 A1 | 4/2021 | Yang et al. | |
| 2021/0200469 A1 | 7/2021 | Kim et al. | |
| 2021/0232310 A1 | 7/2021 | Pitchumani et al. | |
| 2022/0188028 A1 | 6/2022 | Mesnier et al. | |
| 2022/0276785 A1 | 9/2022 | Deguchi et al. | |
| 2023/0011742 A1 | 1/2023 | Merritt | |

FOREIGN PATENT DOCUMENTS

| | | |
|---|---|---|
| WO | 2020186081 A1 | 9/2020 |
| WO | 2020189081 A1 | 9/2020 |

OTHER PUBLICATIONS

Chen, Shengbo, et al., "When Queueing Meets Coding: Optimal-Latency Data Retrieving Scheme in Storage Clouds", IEEE INFOCOM 2014—IEEE Conference on Computer Communications, 2014, pp. 1042-1050.

European Extended Search Report for Application No. 22186187.5, mailed Dec. 15, 2022.

European Extended Search Report for Application No. 22187681.6, mailed Dec. 19, 2022.

European Extended Search Report for Application No. 22187683.2, mailed Dec. 19, 2022.

European Extended Search Report for Application No. 22189731.7, mailed Jan. 3, 2023.

Liang, Guanfeng et al., "Fast Cloud: Pushing the Envelope on Delay Performance of Cloud Storage With Coding" IEEE/ACM Transactions on Networking, vol. 22, No. 6, 2014, pp. 2012-2025.

Liang, Guanfeng et al., "TOFEC: Achieving Optimal Throughput-Delay Trade-Off of Cloud Storage Using Erasure Codes", IEEE Infocom 2014—IEEE Conference on Computer Communications, 2014, pp. 826-834.

Mukhopadhyay, Sinjoni et al., "Efficient Reconstruction Techniques for Disaster Recovery in Secret-Split Datastores", 2018 IEEE 26th International Symposium on Modeling, Analysis, and Simulation of Computer and Telecommunication Systems (MASCOTS), 2018, pp. 66-78.

(56) References Cited

OTHER PUBLICATIONS

Pritchard, Stephen, "Computational Storage: What is it and What are Its Key Use Cases?", (https://www.computerweekly.com/feature/Computational-storage-What-is-it-and-what-are-its-key-use-cases), 2020, retrieved 2022, 7 pages.
Wikipedia, "Block Cipher", (https://en.wikipedia.org/w/index.php?title=Block_ciphe%20&oldid=1036074863), retrieved 2022, 17 pages.
Wikipedia, "Data Deduplication", (https:/en.wikipedia.org/w/index.php?title=Data_deduplication&oldid=1025113325), retrieved 2022, 7 pages.
Wu, Xingbo, "Supporting Efficient Large-Scale Key-Value Systems with an Optimized Storage Hierarchy", Dissertation, The University of Texas at Arlington, 2018, 123 pages.
Zhang, Xingyu et al., "Data Deduplication Cluster Based on Similarity-Locality Approach", 2013 IEEE International Conference on Green Computing and Communications and IEEE Internet of Things and IEEE Cyber, Physical and Social Computing, 2013, pp. 2168-2172.
Zuo, Chunxue et al., "PFCG: Improving the Restore Performance of Package Datasets in Deduplication Systems", 2018 IEEE 36th International Conference on Computer Design (ICCD), 2018, pp. 553-560.
Zuo, Chunxue et al., "RepEC-Duet: Ensure High Reliability and Performance for Deduplicated and Delta-Compressed Storage Systems", 2019 IEEE 37th International Conference on Computer Design (ICCD), 2019, pp. 190-198.
Office Action for U.S. Appl. No. 17/572,621, mailed May 4, 2023.
Office Action for U.S. Appl. No. 17/591,597, mailed May 25, 2023.
Office Action for U.S. Appl. No. 17/666,548, mailed Jul. 19, 2023.
Final Office Action for U.S. Appl. No. 17/572,621, mailed Oct. 10, 2023.
Final Office Action for U.S. Appl. No. 17/666,548, mailed Dec. 19, 2023.
Office Action for U.S. Appl. No. 17/677,991, mailed Sep. 27, 2023.
Advisory Action for U.S. Appl. No. 17/572,621, mailed Dec. 28, 2023.
Anisimov, Anatoly V. et al., "Variable-Length Prefix Codes With Multiple Delimiters," IEEE Transactions on Information Theory, vol. 63, No. 5, May 2017, pp. 2885-2895.
Corrected Notice of Allowability for U.S. Appl. No. 17/677,991, mailed Apr. 10, 2024.
Final Office Action for U.S. Appl. No. 17/591,597, mailed Feb. 23, 2024.
Notice of Allowance for U.S. Appl. No. 17/677,991, mailed Mar. 5, 2024.
Corrected Notice of Allowability for U.S. Appl. No. 17/677,991, mailed Jun. 13, 2024.
Office Action for U.S. Appl. No. 17/572,621, mailed Jun. 12, 2024.
Office Action for U.S. Appl. No. 17/591,597, mailed Jun. 18, 2024.
Corrected Notice of Allowability for U.S. Appl. No. 17/677,991, mailed May 8, 2024.
Office Action for U.S. Appl. No. 17/666,548, mailed May 17, 2024.
European Office Action for Application No. 22189257.3, mailed Sep. 25, 2024.
Final Office Action for U.S. Appl. No. 17/572,621, mailed Oct. 31, 2024.
Final Office Action for U.S. Appl. No. 17/591,597, mailed Jan. 13, 2025.
Corrected Notice of Allowability for U.S. Appl. No. 17/677,991, mailed Jul. 22, 2024.
Notice of Allowance for U.S. Appl. No. 17/666,548, mailed Apr. 8, 2025.
Office Action for U.S. Appl. No. 17/591,597, mailed Jun. 26, 2025.
Office Action for U.S. Appl. No. 17/572,621, mailed Aug. 6, 2025.

* cited by examiner

SYSTEMS, METHODS, AND APPARATUS FOR DIVIDING AND COMPRESSING DATA

REFERENCE TO RELATED APPLICATIONS

This application claims priority to, and the benefit of, U.S. Provisional Patent Application Ser. No. 63/231,709 titled "Object Processing and Filtering for Computational Storage" filed Aug. 10, 2021 which is incorporated by reference, U.S. Provisional Patent Application Ser. No. 63/231,711 titled "Data Placement with Spatial Locality and Hierarchical Aggregation for Computational Storage" filed Aug. 10, 2021, which is incorporated by reference, U.S. Provisional Patent Application Ser. No. 63/231,710 titled "Integrated Data Chunking and Compression for Near Data Processing" filed Aug. 10, 2021 which is incorporated by reference, and U.S. Provisional Patent Application Ser. No. 63/231,715 titled "Integrated Data Chunking and Encryption for Near Data Processing" filed Aug. 10, 2021 which is incorporated by reference.

TECHNICAL FIELD

This disclosure relates generally to computational storage systems, and more specifically to systems, methods, and apparatus for dividing and compressing data.

BACKGROUND

A computational storage device may include one or more processing resources that may operate on data stored at the device. A host may offload a processing task to the storage device, for example, by sending a command to the storage device indicating an operation to perform on data stored at the device. The storage device may use the one or more processing resources to execute the command. The storage device may send a result of the operation to the host and/or store the result at the device.

The above information disclosed in this Background section is only for enhancement of understanding of the background of the inventive principles and therefore it may contain information that does not constitute prior art.

SUMMARY

A method for data compression may include receiving input data, finding a delimiter in the input data, generating, based on a position of the delimiter in the input data, a portion of data using a part of the input data, and compressing the portion of data. The input data may include a record, the delimiter indicates a boundary of the record, and the portion of data may include the record. The position of the delimiter may be in the part of the input data. Generating the portion of data may include generating the portion of data based on a subset of the part of the input data. The part of the input data may be a first part of the input data, and the position of the delimiter may be in a second part of the input data. Generating the portion of data may include generating the portion of data based on the first part of the input data and the second part of the input data. The size of the part of input data may be based on a default portion size. The method may further include modifying a size of the portion of data based on the position of the delimiter. Modifying the size of the portion of data may include extending the size of the portion of data. The receiving may include receiving a stream of input data. Finding a delimiter in the input data may include performing a first scan operation on the input data, and compressing the portion of data may include performing a second scan operation on the portion of data.

A method for data compression may include scanning input data, performing, based on the scanning, a compression operation to generate compressed data using the input data, finding, based on the scanning, a delimiter in the input data, and generating, based on a position of the delimiter in the input data, a portion of data using the compressed data. The input data may include a record, the delimiter indicates a boundary of the record, and the portion of data may include the record. The generating may include generating the portion of data based on a portion size. The portion size may be a default portion size. The portion size may be based on a default portion size and a length of a match in the input data. The match may include the delimiter. The delimiter may be a first delimiter, the method may further include keeping the first delimiter, and finding a second delimiter in the input data, wherein the generating may include generating the portion of data based on the first delimiter and the second delimiter. The method may further include setting an indication based on a size of the compressed data. The indication may include a termination indication. The generating may include generating the portion of data based on the indication and the delimiter. The scanning may include scanning the input data based on the indication. The scanning may include scanning the input data based on the delimiter. The performing may include performing the compression operation based on the delimiter. The input data may include a stream of input data. The compression operation may include a stream-based compression operation.

A system may include a host comprising host logic configured to perform a scanning operation on input data, perform, based on the scanning operation, a data compression operation to generate compressed data using the input data, find, based on the scanning operation, a delimiter in the input data, and generate, based on the delimiter, a portion of data using the compressed data. The host logic may be further configured to generate the portion of data based on a default portion size and a position of the delimiter in the input data. The delimiter may be a first delimiter, and the host logic may be further configured to generate the portion of data based on a position of a second delimiter in the input data. The system may further include a device configured to receive the portion of data from the host, the device comprising device logic configured to decompress the portion of data to generate a decompressed portion of data, and perform an operation on the decompressed portion of data.

A method for data encryption may include receiving input data, finding a delimiter in the input data, generating, based on a position of the delimiter in the input data, a portion of data using a part of the input data, and encrypting the portion of data. The input data may include a record, the delimiter indicates a boundary of the record, and the portion of data may include the record. The position of the delimiter may be in the part of the input data. Generating the portion of data may include generating the portion of data based on a subset of the part of the input data. The part of the input data may be a first part of the input data, and the position of the delimiter may be in a second part of the input data. Generating the portion of data may include generating the portion of data based on the first part of the input data and the second part of the input data. The size of the part of input data may be based on a default portion size. The method may further include modifying a size of the portion of data based on the position of the delimiter. Modifying the size of the portion of data may include extending the size of the portion of data. Receiving input data may include receiving a stream of input data. Finding a delimiter in the input data may include performing a first scan operation on the input data, and encrypting the portion of data may include performing a second scan operation on the portion of data.

A method for data encryption may include scanning input data, performing, based on the scanning, an encryption operation to generate encrypted data using the input data, finding, based on the scanning, a delimiter in the input data, and generating, based on a position of the delimiter in the input data, a portion of data using the encrypted data. The input data may include a record, the delimiter indicates a boundary of the record, and the portion of data may include the record. The generating may include generating the portion of data based on a portion size. The portion size may be a default portion size. The generating may include extending a size of the portion of data based on the position of the delimiter in the input data. The encryption operation may include a block-based encryption operation, and the performing may include performing the encryption operation on a first block of the input data to generate a first block of encrypted data. The delimiter may be located in a second block of input data, the method further comprising extending a size of the portion of data based on the position of the delimiter. The method may further include extending the size of the portion of data based on a size of the second block of input data. The extending may include padding the portion of data based on the size of the second block of input data. The size of the second block of input data may be based on a key length for the encryption operation. The performing may further include performing the encryption operation on the second block of the input data to generate a second block of encrypted data. The generating may include generating the portion of data using the first block of encrypted data and the second block of encrypted data.

A system may include a host comprising host logic configured to perform a scanning operation on input data, perform, based on the scanning operation, a data encryption operation to generate encrypted data using the input data, find, based on the scanning operation, a delimiter in the input data, and generate, based on the delimiter, a portion of data using the encrypted data. The host logic may be further configured to generate the portion of data based on a default portion size and a position of the delimiter in the input data. The host logic may be further configured to generate the portion of data based on a key length of the encryption operation. The system may further include a device configured to receive the portion of data from the host, the device comprising device logic configured to decrypt the portion of data to generate a decrypted portion of data, and perform an operation on the decrypted portion of data.

A method of dividing data may include scanning input data, performing, based on the scanning, an operation using the input data to generate processed data, finding, based on the scanning, a delimiter in the input data, and generating, based on a position of the delimiter in the input data, a portion of data using the processed data. The operation may include a data compression operation. The operation may include a data encryption operation. The generating may include generating the portion of data based on a default portion size. The input data may include a stream of input data, and the operation may include a streaming-based operation. The operation may include a block-based operation. The performing may include performing the operation using a block of the input data. The generating may include modifying the portion of data based on the position of the delimiter in the input data. The modifying may include extending the portion of data. The extending may include extending the portion of data based on a block size of the operation. The extending may include padding the portion of data.

A system may include a host comprising host logic configured to perform a scanning operation on input data, perform, based on the scanning operation, a processing operation to generate processed data using the input data, find, based on the scanning operation, a delimiter in the input data, and generate, based on the delimiter, a portion of data using the processed data. The host logic may be further configured to generate the portion of data based on a default portion size and a position of the delimiter in the input data. The system may further include a device configured to receive the portion of data from the host, the device comprising device logic configured to restore the portion of data to generate a restored portion of data, and perform an operation on the restored portion of data.

BRIEF DESCRIPTION OF THE DRAWINGS

The figures are not necessarily drawn to scale and elements of similar structures or functions may generally be represented by like reference numerals or portions thereof for illustrative purposes throughout the figures. The figures are only intended to facilitate the description of the various embodiments described herein. The figures do not describe every aspect of the teachings disclosed herein and do not limit the scope of the claims. To prevent the drawings from becoming obscured, not all of the components, connections, and the like may be shown, and not all of the components may have reference numbers. However, patterns of component configurations may be readily apparent from the drawings. The accompanying drawings, together with the specification, illustrate example embodiments of the present disclosure, and, together with the description, serve to explain the principles of the present disclosure.

DETAILED DESCRIPTION

Figure 1A:
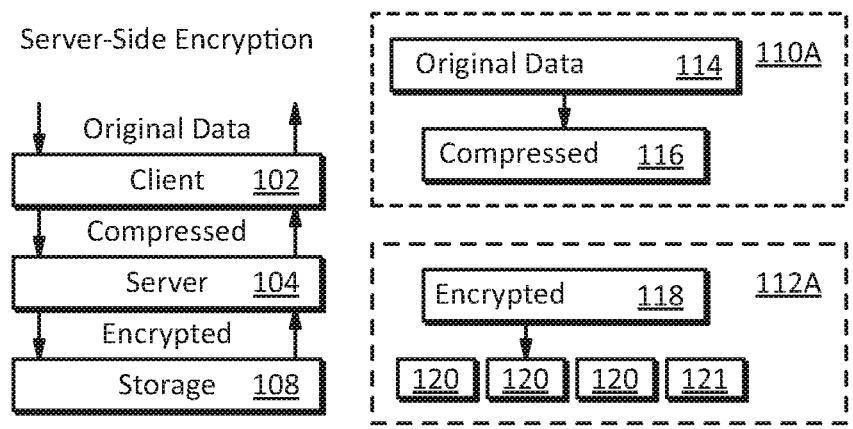
FIG. 1A illustrates an embodiment of an object storage scheme with server-side encryption in accordance with example embodiments of the disclosure.

An object storage system may implement a data selection feature that may enable a user's device to request a specified subset of data to retrieve from a stored object. To process such a request, a storage server may reconstruct the object from one or more portions of data stored on one or more storage devices. The storage server may also decrypt the object if it was encrypted, and/or decompress the object if it was compressed to restore the object to its original form. The storage server may perform one or more selection operations such as filtering, scanning, and/or the like, on the restored object to find the specified subset of data requested by the user's device. The storage server may return the requested subset of data to the user's device.

In some respects, a computational storage device may be capable of performing one or more selection operations such as filtering, scanning, and/or the like, on an object stored on the device. However, if a portion of the object is stored on the device, and the object was modified (e.g., compressed, encrypted, and/or the like) prior to dividing the data into portions, the portion stored on the device may only include random (to the device) information that the storage device may not be able to restore (e.g., decompress and/or decrypt) to original data. Therefore, the storage device may not be able to perform a meaningful operation locally on the portion of data stored at the device.

This disclosure encompasses numerous principles relating to computational storage. The principles disclosed herein may have independent utility and may be embodied individually, and not every embodiment may utilize every principle. Moreover, the principles may also be embodied in various combinations, some of which may amplify some benefits of the individual principles in a synergistic manner.

Some of the principles disclosed herein relate to dividing data into one or more portions prior to performing one or more modifications on the one or more portions. For example, in a computational storage scheme in accordance with example embodiments of the disclosure, an object or other original data may be divided into portions of data prior to performing modifications such as compression and/or encryption on the data. One or more of the portions of data may be modified individually (e.g., compression and/or encryption may be performed on an individual portion of the data), and the modified version of the portion of data may be sent to a computational storage device for storage and/or processing. The storage device may generate a restored version of the portion of data from the modified portion of data, for example, by decrypting and/or decompressing the modified portion of data. The storage device may perform an operation (e.g., a selection operation) locally on the restored portion of data.

Depending on the implementation details, performing a selection operation locally at a computational storage device may reduce the amount of data that may be sent from one or more storage devices to a server. Moreover, depending on the implementation details, a computational storage device may perform an operation such as a selection operation more efficiently than a server.

In some example embodiments in accordance with the disclosure, a storage device, a storage server, and/or the like, may provide one or more indications of how to divide original data into portions and/or how to modify the portions to facilitate storage and/or processing by one or more computational storage devices. For example, in some embodiments, an indication may include information such as one or more portion sizes, compression algorithms, encryption algorithms, and/or the like, that may be supported by a storage device. In some embodiments, one or more indications may be mandatory, optional (e.g., advisory), or a combination thereof. For example, an indication of an optimal portion size for storage on a particular storage device may be advisory, whereas an indication of a supported compression algorithm may be mandatory to enable a storage device to decompress a portion of data for local processing at the device.

Any of the operations disclosed herein including dividing data, modifying data (e.g., compressing and/or encrypting data), erasure coding data, storing data, processing data, selecting data, and/or the like, may be distributed (e.g., mapped) among various apparatus in unlimited configurations in accordance with example embodiments of the disclosure. For example, in some embodiments, a client may divide original data (e.g., an object) into one or more portions, compress the portions of data, and send the compressed portions of data to a server. The server may encrypt the compressed portions of data, and store the compressed and encrypted portions of data across one or more storage devices. As another example, in some embodiments, a client may divide original data (e.g., an object) into one or more portions, compress and encrypt the portions of data, and send the compressed and encrypted portions of data to a server for storage across one or more storage devices. As a further example, a client may send original data (e.g., an object), to a server which may divide the data into one or more portions, and compress, encrypt, and/or perform erasure coding on the portions of data, and store the individually modified portions of data across one or more storage devices.

Some additional principles of this disclosure relate to content-aware techniques for dividing data into portions. For example, in some embodiments, a portion size may be determined dynamically by analyzing the contents of a portion to find a boundary (indicated, for example, by a delimiter) of a record within the data being divided. The portion size may be determined to align with one or more complete records within the portion. For example, if a portion of data having a default portion size includes a partial record, the size of the portion may be modified (e.g., extended or reduced) so the portion ends with a delimiter of a record within the portion (e.g., the portion may only include complete records). The resulting self-contained portion may be compressed and/or encrypted as a unit.

Some additional content-aware data dividing techniques in accordance with example embodiments of the disclosure may integrate a data dividing operation with another operation that may scan the data to be divided. For example, in some embodiments, a data dividing operation may be combined with a data compression operation such that, as a stream of input data is being scanned for purposes of compression, it may also be scanned for one or more delimiters that indicate one or more boundaries of one or more records. A data portion size may be determined by the location of one or more delimiters so the portion ends at the end of a record. In some embodiments, the data compression operation may also terminate at the end of the portion. Depending on the implementation details, this may improve the efficiency of the data dividing operation because it may exploit the data scanning that was already being performed for purposes of compression.

As another example, in some embodiments, a data dividing operation may be combined with a data encryption operation. As a stream of input data is being read for purposes of encryption, it may also be scanned for one or more delimiters that indicate one or more boundaries of one or more records. A data portion size may be determined by the location of one or more delimiters so the portion ends at the end of a record. In some embodiments, the data encryption operation may also terminate at the end of the portion. If the encryption operation is implemented with a block-cipher algorithm, the size of a portion may be modified (e.g., extended or reduced) so the end of the portion aligns with the end of a block (which may be padded if the size of the data is not an even multiple of the block size).

In some embodiments, a portion of data may also be referred to as a chunk of data, and dividing data into portions or chunks of data may be referred to as chunking data. In some embodiments, a portion or chunk of data may refer to any unit of data that may be obtained by dividing data, for example, for purposes of storage at one or more storage devices. In some situations, if an amount of original data is less than or equal to a portion or chunk size (e.g., a default portion or chunk size) a unit of the original data generated by a dividing or chunking operation may still be referred to as a portion or chunk of data, even if it is the same size as the amount of original data.

For purposes of illustration, some embodiments may be described in the context of object storage systems that may implement a data selection feature and/or may store data in one or more key-value (KV) storage devices. However, the principles described in this disclosure are not limited to any particular data format, data processing features, storage device interfaces, and/or the like. For example, systems, methods, and/or apparatus in accordance with example embodiments of the disclosure may also be implemented with storage systems that may provide file storage, database storage, block storage, and/or the like, may implement any type of processing features such as acceleration, graph processing, graphics processing, machine learning, and/or the like, and may operate with any type of storage devices including KV storage devices, block storage devices, and/or the like.

An object storage system may enable a user's device to store data in the form of objects. The data in an object may be modified in various ways prior to being stored. For example, the data may be compressed to reduce the amount of space it occupies in storage media and/or to reduce the time, bandwidth, power, and/or the like, required to transmit the data from a client to one or more storage devices (e.g., over a network). As another example, the data in an object may be encrypted to prevent unauthorized access to the data during transmission and/or storage of the data.

An object may include a relatively large amount of data, and thus, for purposes of reliability, accessibility, and/or the like, the object may be divided into chunks that may be stored across multiple storage devices. (Dividing data into chunks may also be referred to as chunking the data.) For example, after compression and/or encryption, an object may be divided into fixed-size chunks to fit in a block size used by one or more block-based storage devices in the storage system. In some embodiments, an erasure coding scheme may be used to divide the data into data chunks and generate one or more parity chunks that may enable a storage system to recover a lost or corrupted data chunk.

FIG. 1A illustrates an embodiment of an object storage scheme with server-side encryption in accordance with example embodiments of the disclosure. The left side of FIG. 1A illustrates data flow between components of a system during read and/or write operations, and the right side of FIG. 1A illustrates operations on data during a write operation.

The system illustrated on the left side of FIG. 1A may include a client 102, one or more servers 104 (which may be referred to collectively as a server), and one or more storage devices 108 (which may be referred to collectively as storage). The operations illustrated on the right side of FIG. 1A are shown in a first group 110A performed by the client 102 and a second group 112A performed by the server 104.

During a write operation, the client 102 may begin with original data 114 which may be, for example, an object. The client 102 may perform one or more compression operations on the original data 114 to generate compressed data 116. The client 102 may send the compressed data 116 to the server 104 which may encrypt the compressed data 116 to generate encrypted data 118. The server 104 may divide the compressed and encrypted data 118 into one or more data chunks 120 and send the one or more data chunks 120 to one or more storage devices 108. In some embodiments, the server 104 may perform erasure coding on the one or more data chunks 120 to generate one or more parity chunks 121 which may also be stored on the one or more storage devices 108.

During a read operation, the operations shown in FIG. 1A may be performed in reverse. For example, the server 104 may read the one or more data chunks 120 from the one or more storage devices 108. If one of the data chunks is missing or corrupted, for example, due to a failed storage device, the server 104 may recover the missing or corrupted data chunk using the one or more parity chunks 121. The server 104 may reconstruct the compressed and encrypted data 118 from the data chunks 120. The server 104 may decrypt the compressed and encrypted data 118 and send the compressed and decrypted data 116 to the client 102. The client 102 may decompress the compressed and decrypted data 116 to restore the original data 114 which may be, for example, an object.

Figure 1B:
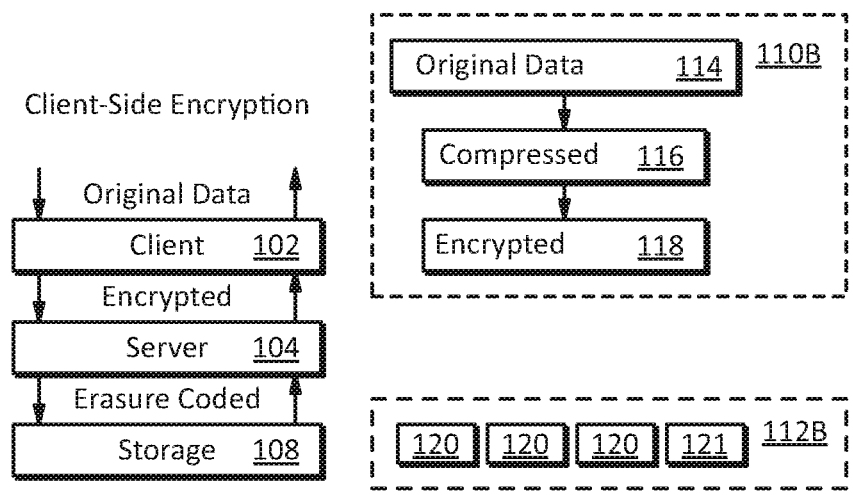
FIG. 1B illustrates an embodiment of an object storage scheme with client-side encryption in accordance with example embodiments of the disclosure.

FIG. 1B illustrates an embodiment of an object storage scheme with client-side encryption in accordance with example embodiments of the disclosure. The left side of FIG. 1B illustrates data flow between components of a system during read and/or write operations, and the right side of FIG. 1B illustrates operations on data during a write operation.

The system illustrated on the left side of FIG. 1B and the operations illustrated on the right side of FIG. 1B may include some components and/or operations that may be similar to those illustrated in FIG. 1A and may be indicated by the same or similar reference numerals. However, in the embodiment illustrated in FIG. 1B, the client 102 may encrypt the compressed data 116 to generate compressed and encrypted data 118 as shown by the first group 110B of operations performed by the client 102. The client 102 may send the compressed and encrypted data 118 to the server 104 which may divide the compressed and encrypted data 118 into one or more data chunks 120 as shown by the second group of operations 112B performed by the server 104. The server 104 may send the one or more data chunks 120 to one or more storage devices 108. In some embodiments, the server 104 may perform erasure coding on the one or more data chunks 120 to generate one or more parity chunks 121 which may also be stored on the one or more storage devices 108.

During a read operation, the operations shown in FIG. 1B may be performed in reverse. For example, the server 104 may reconstruct the compressed and encrypted data 118 from the data chunks 120 (recovering any missing or corrupted data chunk using the one or more parity chunks 121 if needed) and send the compressed and encrypted data 118 to the client 102. The may decrypt the compressed and encrypted data 118 to generate the compressed and decrypted data 116. The client 102 may decompress the compressed and decrypted data 116 to restore the original data 114 which may be, for example, an object.

The embodiments illustrated in FIG. 1A and FIG. 1B are example embodiments only, and the number, order, and/or arrangement of components and/or operations may be varied. For example, in some implementations, the original data 114 may be stored without compression and/or without encryption. In some embodiments, the one or more servers 104 may be implemented with a first server that may be configured as an object storage server and a second server that may be configured as a storage server (which may also be referred to as a storage node) to manage the one or more storage devices 108. Thus, the first and second servers may implement an object storage service. If any or all of the original data 114 is encrypted, encryption keys may be generated by the storage service and/or by a user of the service. In some embodiments, performing the chunking operation at or near the end of a write operation may enable the server 104 to divide the data into chunks having sizes that may correspond to one or more blocks sizes of the one or more storage devices 108.

In some situations, a user in association with a user's device may only need to retrieve a subset of data stored in an object. Some object storage systems may require the user to retrieve the entire object and process the object to find the subset of data. This may result in relatively large amounts of unneeded data being transmitted to the user's device, which in turn, may consume unnecessary resources such as time, bandwidth, power, and/or the like.

To reduce and/or prevent the transmission of unneeded data, some object storage systems may provide a data selection feature that may enable a user to request a specified subset of data to retrieve from a stored object. Rather than sending the entire object to the user's device, the object storage system may perform a scanning, filtering, and/or other data selection operation on the object to find the specified subset of data. The object storage system may return the specified subset of data to the user's device.

Figure 2A:
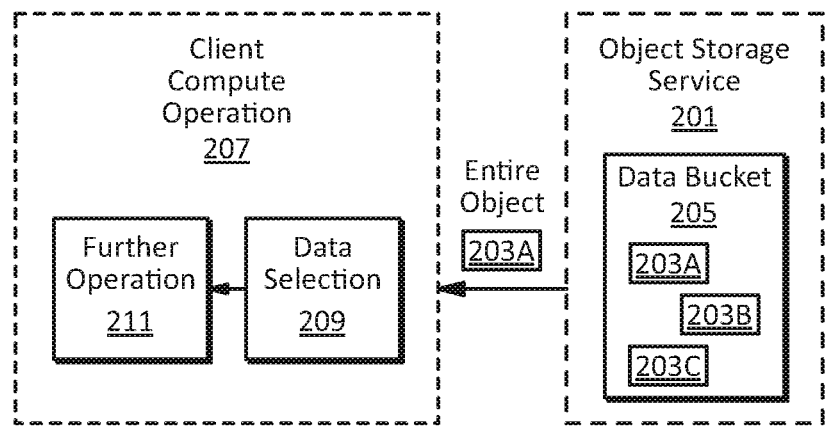
FIG. 2A illustrates an embodiment of an object storage scheme that may return an object to a user's device in accordance with example embodiments of the disclosure.

FIG. 2A illustrates an embodiment of an object storage scheme that may return an object to a user's device in accordance with example embodiments of the disclosure.

Figure 2B:
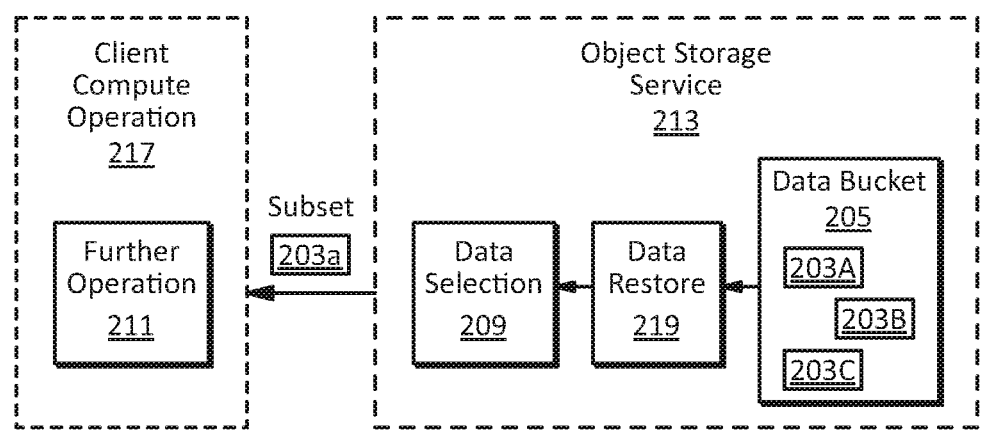
FIG. 2B illustrates an embodiment of an object storage scheme having a data selection feature in accordance with example embodiments of the disclosure.

FIG. 2B illustrates an embodiment of an object storage scheme having a data selection feature in accordance with example embodiments of the disclosure.

Referring to FIG. 2A, an object storage service 201 may store objects 203A, 203B, and 203C for a user in a data bucket or container 205. If the user needs to retrieve a subset of data (e.g., one or more records) from one of the objects 203A, the object storage service 201 may require the user to request the entire object 203A which may be sent to a client compute operation 207 over a network. The client compute operation 207 may perform a data selection operation 209 such as scanning, filtering, and/or the like, on the object 203A to find the subset of data. The client compute operation 207 may use the subset of data for a further operation 211.

Referring to FIG. 2B, an object storage service 213 having a data selection feature may enable a user to request a subset of data from a stored object 203A. For example, the object storage service 213 may enable a user to submit a request, for example, by sending a query (e.g., an expression using a database language such as SQL) that may operate on the object 203A which may be stored, for example, in a format such as comma separated variables (CSV), JavaScript Object Notation (JSON), Parquet, and/or the like. In some embodiments, the query may be sent to the object storage service 213, for example, using an application programming interface (API), software development kit (SDK), and/or the like.

Rather than sending the entire object 203A, the object storage service 213 may perform a data selection operation 209 such as scanning, filtering, and/or the like on the object 203A to find the subset of data specified by the user in the request. The object storage service 213 may send the subset of data 213a to a client compute operation 217 for a further operation 211. Depending on the implementation details, the object storage service 213 may perform one or more restore operations 219 on the object 203A such as decompression, decryption, and/or the like, to reverse a compression operation, encryption operation, and/or the like that may have been performed on the object 203A when it was stored.

Figure 3A:
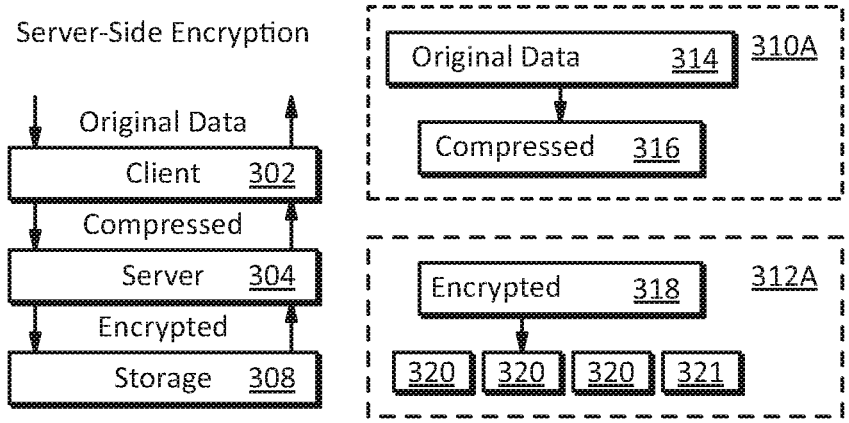
FIG. 3A illustrates an embodiment of a write operation of an object storage scheme having a data selection feature in accordance with example embodiments of the disclosure.
Figure 3B:
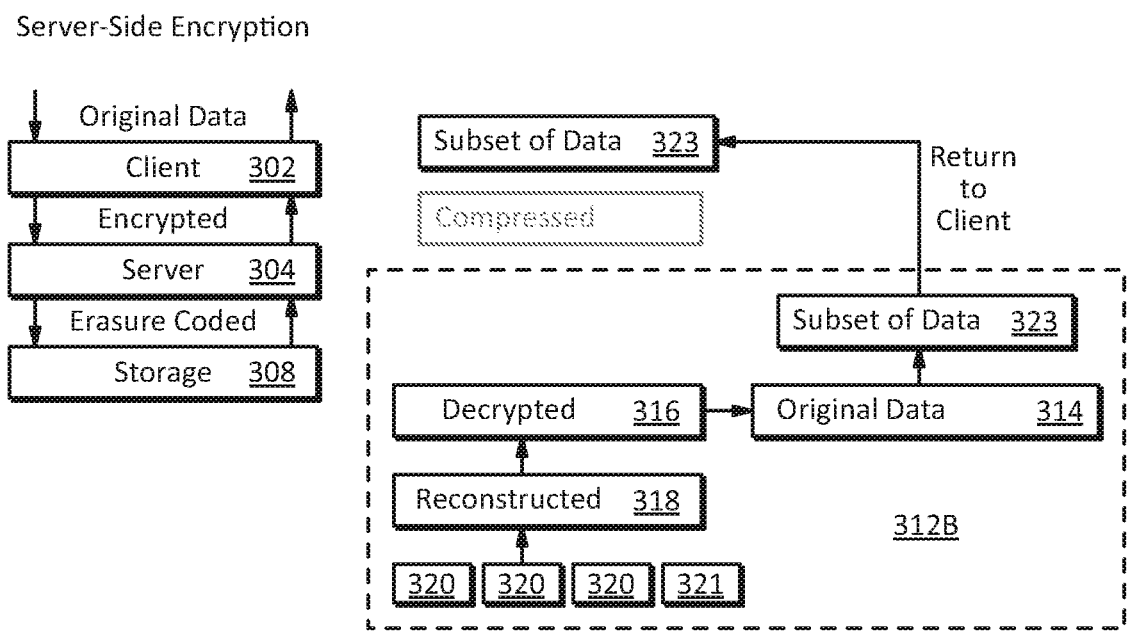
FIG. 3B illustrates an embodiment of a read operation of an object storage scheme having a data selection feature in accordance with example embodiments of the disclosure.

FIG. 3A illustrates an embodiment of a write operation of an object storage scheme having a data selection feature in accordance with example embodiments of the disclosure. FIG. 3B illustrates an embodiment of a read operation of an object storage scheme having a data selection feature in accordance with example embodiments of the disclosure. The embodiments illustrated in FIG. 3A and FIG. 3B may be used, for example, to implement the object storage scheme illustrated in FIG. 2B.

The left side of FIG. 3A illustrates data flow between components of an object storage system during read and/or write operations, and the right side of FIG. 3A illustrates operations on data during a write operation.

The system illustrated on the left side of FIG. 3A may include a client 302, one or more servers 304 (which may be referred to collectively as a server), and one or more storage devices 308 (which may be referred to collectively as storage). The operations illustrated on the right side of FIG. 3A are shown in a first group 310A performed by the client 302 and a second group 312A performed by the server 304. The data flow between components and/or operations on data illustrated in FIG. 3A may be similar to the embodiment with server-side encryption illustrated in FIG. 1A or the embodiment with client-side encryption illustrated in FIG. 1B in which elements having reference numerals ending in the same digits may be similar. Thus, in FIG. 3A, the compressed and encrypted data 318 may be part of group 310A for an implementation with client-side encryption, or part of group 312A for an implementation with server-side encryption.

Referring to FIG. 3B, a user may request a subset of data from an object or other original data stored on the one or more storage devices 308. To process such a request, the server 304 may read one or more data chunks 320 from the one or more storage devices 308. If one of the data chunks is missing or corrupted, the server 304 may recover the missing or corrupted data chunk using the one or more parity chunks 321. The server 304 may reconstruct the compressed and encrypted data 318 from the data chunks 320.

The server 304 may decrypt the compressed and encrypted data 318 to generate the compressed and decrypted data 316, which may be decompressed to restore the original data 314 (e.g., an object). The server 304 may perform a data selection operation (e.g., scanning, filtering, and/or the like) on the original data 314 to obtain the requested subset of data 323. The server 304 may send the subset of data 323 to the client 302. Because the decompression operation of the client may be bypassed, it is grayed-out. The operations illustrated on the right side of FIG. 3B are shown in a group 312B performed by the server 304.

As with the embodiments illustrated in FIG. 1A and FIG. 1B, the server 304 illustrated in FIG. 3A and FIG. 3B may be implemented with a first server that may be configured as an object storage server and a second server that may be configured as a storage server to manage the one or more storage devices 308. Thus, in some embodiments, a storage server may reconstruct the compressed and encrypted data 318 from the one or more data chunks 320, and an object storage server may perform the decryption, decompression, and/or data selection operations. Moreover, although the embodiments illustrated in FIG. 3A and FIG. 3B may implement server-side encryption, other embodiments may implement client-side encryption.

Depending on the implementation details, the embodiments illustrated in FIG. 3A and FIG. 3B may reduce network traffic, for example, by reducing the amount of data transferred between a storage system and a client. However, the data processing flow for the architecture illustrated in FIG. 3A and FIG. 3B may prevent the storage system from taking advantage of computational storage devices which, depending on the implementation details, may be well-suited to performing some or all of the operations performed by the server 304. For example, in some embodiments, a computational storage device may include processing resources that may perform decompression, decryption, and/or other operations such as data selection operations more efficiently than the general purpose processing resources that may be present in a server. However, because the original data 314 may be modified (e.g., compressed, encrypted, and/or the like) prior to chunking, an individual storage device 308 on which a data chunk is stored may not be able to decrypt, decompress, and/or otherwise restore the chunk of data to a form on which a meaningful operation may be performed locally at the device.

Figure 4:
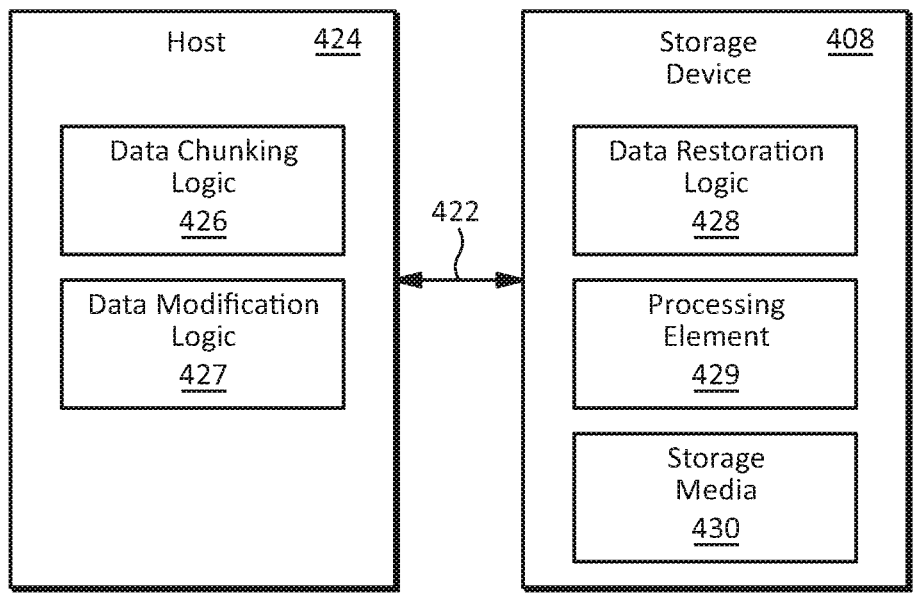
FIG. 4 illustrates an embodiment of a storage system having local data restoration in accordance with example embodiments of the disclosure.

FIG. 4 illustrates an embodiment of a storage system having local data restoration in accordance with example embodiments of the disclosure. The system illustrated in FIG. 4 may include a host 424 and a computational storage device 408 that may communicate through a connection 422. The host 424 may include data chunking logic 426 (which may also be referred to as data dividing logic) and data modification logic 427 that may be configured to provide one or more chunks of data to the storage device 408 in a form in which the storage device 408 may restore a chunk of data to a form on which the storage device may perform an operation. For example, the data chunking logic 426 may divide an object or other original data into one or more chunks of data prior to modification by the data modification logic 427. The data chunking logic 426 may or may not be content aware. For example, in an embodiment in which the data chunking logic 426 is not content aware, the data chunking logic 426 may divide data in to fixed sized chunks, and thus, one or more chunks may include one or more fragments of records. As another example, in an embodiment in which the data chunking logic 426 is content aware, the data chunking logic 426 may look for a record delimiter in the data to divide the data into variable sized chunks such that a chunk may end with a record delimiter, and therefore, end with a complete record.

The data modification logic 427 may perform one or more data modification operations such as compression, encryption, erasure coding, and/or the like, on one or more of the chunks individually to generate one or more modified chunks of the original data. The host 424 may send one or more of the modified chunks of the original data to the computational storage device 408 and/or to one or more additional computational storage devices for storage and/or processing.

The computational storage device 408 may include data restoration logic 428, one or more processing elements 429, and storage media 430. The data restoration logic 428 may be configured to restore a modified chunk of data to a form on which the one or more processing elements 429 may perform an operation. For example, the data restoration logic 428 may decrypt a modified chunk of data if it was encrypted, decompress a modified chunk of data if it was compressed, and/or the like. The one or more processing elements 429 may be configured to perform any type of operation such as data selection (e.g., scanning, filtering, and/or the like), compute acceleration, graph processing, graphics processing, machine learning, and/or the like. The storage media 430 may be used to store any data including or more modified chunks of data sent by the host 424.

In some embodiments, the data restoration logic 428 and/or one or more processing elements 429 may be configured to read and restore one or more chunks of data from the storage media 430 and return a specified subset of the data, or perform any other operation on the restored chunk of data, in response a request which may include a query (e.g., an expression) received at the storage device 408.

In some embodiments, a restored chunk of data may or may not be the exact same as the original data prior to chunking. For example, if a chunk of data stored at the storage device 424 contains financial information such as bank account transactions, balances, and/or the like, and the user requests just the account balances, the restoration logic 428 and/or one or more processing elements 429 may need to restore the chunk of data to the original form to find the exact account balances and send them to the user's device. However, if a chunk of data stored at the storage device 424 contains a photographic image, and the user requests a list of features in the image, the restoration logic 428 and/or one or more processing elements 429 may only need to decompress the image to an extent that may enable the one or more processing elements 429 to identify the features requested by the user.

The host 424 may be implemented with any component or combination of components that may provide one or more chunks of data to the storage device 408 in a form in which the storage device 408 may restore and/or perform an operation on. For example, in some embodiments, the host 424 may include a client, an object storage server, and/or a storage node. The data chunking logic 426 and/or data modification logic 427 may be distributed between any components of the host 424 in any manner. For example, in some embodiments, the data chunking logic 426 may be implemented at a client whereas the data modification logic 427 may be implemented at an object storage server and/or a storage node. As another example, the data chunking logic 426 and a portion of the data modification logic 427 including compression logic may be implemented at a client, whereas a portion of the data modification logic 427 including encryption and/or erasure coding logic may be implemented at a server. Thus, the client may divide original data into chunks, individually compress the chunks of data, and send the compressed chunks of data to the server. The server may individually encrypt the compressed chunks of data, perform erasure coding on the chunks of data to generate one or more parity chunks, and store the chunks of data and/or parity chunks over one or more storage devices including the computational storage device 408.

The storage device 408, and/or any other storage devices disclosed herein, may be implemented in any form factor such as 3.5 inch, 2.5 inch, 1.8 inch, M.2, Enterprise and Data Center SSD Form Factor (EDSFF), NF1, and/or the like, using any connector configuration such as Serial ATA (SATA), Small Computer System Interface (SCSI), Serial Attached SCSI (SAS), M.2, U.2, U.3 and/or the like.

The storage device 408, and/or any other storage devices disclosed herein, may be implemented with any storage media 430 including solid state media, magnetic media, optical media, and/or the like, or any combination thereof. Examples of solid state media may include flash memory such as not-AND (NAND) flash memory, low-latency NAND flash memory, persistent memory (PMEM) such as cross-gridded nonvolatile memory, memory with bulk resistance change, phase change memory (PCM), and/or the like, or any combination thereof.

The storage device 408, and/or any other storage devices disclosed herein, may communicate using any type of storage interface and/or protocol such as Peripheral Component Interconnect Express (PCIe), NVMe, NVMe-over-fabric (NVMe-oF), NVMe Key-Value (NVMe-KV), SATA, SCSI, and/or the like, or any combination thereof. In some embodiments, the storage device 408, and/or any other storage devices disclosed herein, may implement a coherent (e.g., memory coherent, cache coherent, and/or the like) or memory semantic interface such as Compute Express Link (CXL), and/or a coherent protocol such as CXL.mem, CXL.cache, and/or CXL.IO. Other examples of coherent and/or memory semantic interfaces and/or protocols may include Gen-Z, Coherent Accelerator Processor Interface (CAPI), Cache Coherent Interconnect for Accelerators (CCIX), and/or the like.

The storage device 408, and/or any other storage devices disclosed herein, as well as any components of the host 424 (e.g., a client, an object storage server, a storage node, and/or the like) may be implemented entirely or partially with, and/or used in connection with, a server chassis, server rack, dataroom, datacenter, edge datacenter, mobile edge datacenter, and/or any combinations thereof.

The communication connection 422, and/or any other connections disclosed herein, including any connections between components such as clients, servers, storage devices, and/or the like, may be implemented with any interconnect and/or network interfaces and/or protocols including PCIe, Ethernet, Transmission Control Protocol/

Internet Protocol (TCP/IP), remote direct memory access (RDMA), RDMA over Converged Ethernet (ROCE), Fibre-Channel, InfiniBand, iWARP, and/or the like, or any combination thereof.

Any of the functionality disclosed herein, including any of the logic such as the data chunking logic 426, data modification logic 427, data restoration logic 428, one or more processing elements, 429, indication logic 531, and/or the like, may be implemented with hardware, software or a combination thereof including combinational logic, sequential logic, one or more timers, counters, registers, and/or state machines, one or more complex programmable logic devices (CPLDs), field programmable gate arrays (FPGAs), application specific integrated circuits (ASICs), central processing units (CPUs) such as complex instruction set computer (CISC) processors such as x86 processors and/or reduced instruction set computer (RISC) processors such as ARM processors, graphics processing units (GPUs), neural processing units (NPUs), tensor processing units (TPUs) and/or the like, executing instructions stored in any type of memory, or any combination thereof. In some embodiments, one or more of the data restoration logic 428, processing elements 429, and/or the like may include fixed and/or programmable functionality to perform any functions such as compression and/or decompression, encryption and/or decryption, microservices, erasure coding, video encoding and/or decoding, database acceleration, searching, machine learning, graph processing, and/or the like. In some embodiments, one or more components may be implemented as a system-on-chip (SOC).

In some embodiments, one or more of the data restoration logic 428, processing elements 429, and/or the like may be integrated with one or more other components of a storage device such as a storage device controller, a flash translation layer (FTL) and/or the like.

Any of the data modification operations disclosed herein such as compression, encryption, and/or the like (or reverse operations thereof), may be implemented with any suitable techniques. For example, data compression and/or decompression may be implemented with LZ77, gzip, Snappy, and/or the like. Encryption and/or decryption may be implemented with Advanced Encryption Standard (AES) such as AES-256, Rivest-Shamir-Adleman (RSA), and/or the like.

Figure 5:
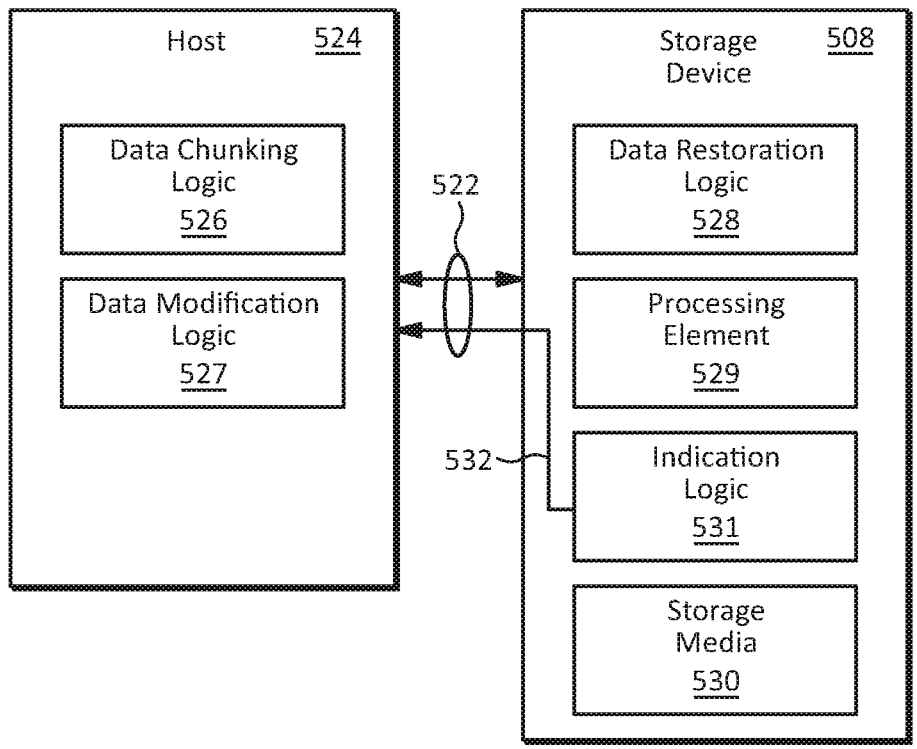
FIG. 5 illustrates another embodiment of a storage system having local data restoration in accordance with example embodiments of the disclosure.

FIG. 5 illustrates another embodiment of a storage system having local data restoration in accordance with example embodiments of the disclosure. The system illustrated in FIG. 5 may include components and/or implement operations similar to those described with respect to the embodiment illustrated in FIG. 4 in which elements having reference numerals ending in the same digits may be similar. However, in the embodiment illustrated in FIG. 5, the computational storage device 508 may further include indication logic 531 that may be configured to provide one or more indications 532 to the data chunking logic 526 and/or the data modification logic 527 at the host 524.

The one or more indications 532 may include information that may be used by the data chunking logic 526 to determine how to divide original data into chunks. For example, the one or more indications 532 may include one or more storage hyper-parameters such as a minimum chunk size, maximum chunk size, optimal chunk size, and/or the like for storage utilization, processing efficiency (e.g., chunk decompression, decrypting, data selection, and/or other operations), bandwidth utilization, and/or the like.

The one or more indications 532 (e.g., storage hyper-parameters) may include information that may be used by the data modification logic 527 to determine how to modify the individual chunks of data provided by the data chunking logic 526. For example, the one or more indications 532 may include a list of the types of compression algorithms, encryption algorithms, and/or the like, supported by the data restoration logic 528 at the storage device 508.

In some embodiments, one or more indications may be mandatory, optional (e.g., provided as a suggestion), or a combination thereof. For example, an indication of an optimal chunk size for storage on the storage device 508 may be provided as a suggestion, whereas an indication of one or more compression algorithms, encryption algorithms, and/or the like supported by the data restoration logic 528, may be mandatory to enable the storage device 508 to decompress and/or decrypt a chunk of data for local processing by the one or more processing elements 529 at the storage device 508.

In some embodiments, the indication logic 531 may be located entirely at the computational storage device 508. In some other embodiments, however, the indication logic 531 may be located at the host 524, distributed between the host 524 and the storage device 508 or multiple storage devices, or located entirely at a different apparatus (e.g., a separate server, a management controller, and/or the like, that may maintain a list or database of characteristics of storage devices in a system). For example, in some embodiments, one or more storage nodes may include indication logic 531 that may maintain a list or database of indications for each storage device installed at the storage node and provide the indications to one or more clients, object storage servers, and/or the like. As a further example, one or more storage nodes may include a portion of indication logic 531 that may maintain indications for each storage device installed at the storage node, and an object storage server may include a portion of indication logic 531 that may aggregate indications from one or more storage nodes and provide the indications to one or more clients.

Any of the indications 532 may be provided to any apparatus such as a client, an object storage server, a storage node, and/or the like, by the indication logic 531, for example, in response to a query, a command, and/or the like (e.g., an NVMe command, a query through an API, an SDK, and/or the like). In some embodiments, the one or more indications 532 (e.g., one or more storage hyper-parameters) may be provided to a user's device (e.g., by a client) through a client library.

Figure 6A:
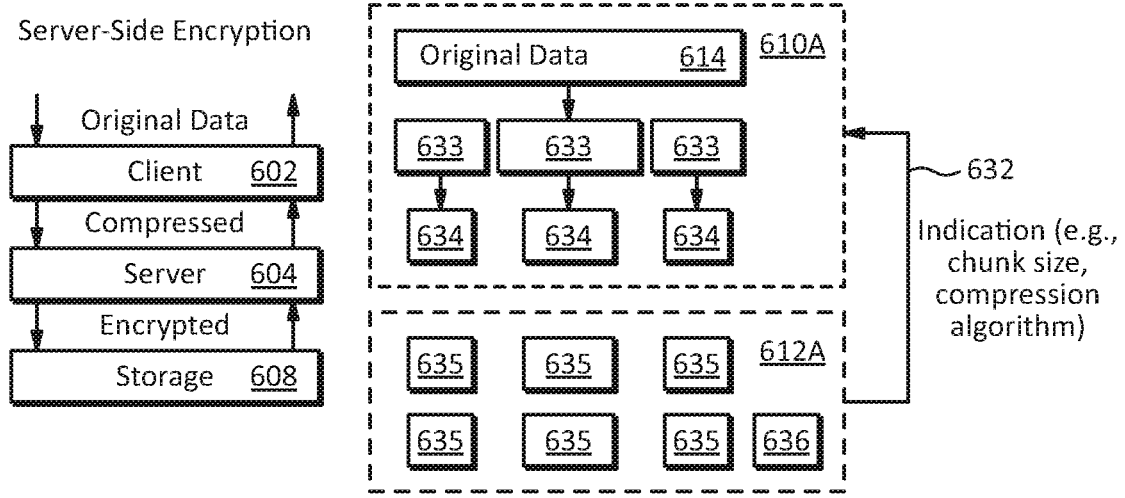
FIG. 6A illustrates an example embodiment of a write operation for a storage scheme having local data restoration and server-side encryption in accordance with example embodiments of the disclosure.

FIG. 6A illustrates an example embodiment of a write operation for a storage scheme having local data restoration and server-side encryption in accordance with example embodiments of the disclosure. The embodiment illustrated in FIG. 6A may be used, for example, to implement any of the storage schemes illustrated in FIG. 4 and FIG. 5. The left side of FIG. 6A illustrates data flow between components of a storage system, and the right side of FIG. 3A illustrates operations on data during the write operation.

The system illustrated on the left side of FIG. 6A may include a client 602, one or more servers 604 (which may be referred to collectively as a server), and one or more storage devices 608 (which may be referred to collectively as storage). The operations illustrated on the right side of FIG. 6A are shown in a first group 610A performed by the client 602 and a second group 612A performed by the server 604.

A write operation may begin when a storage device 608 and/or server 604 provide one or more indications 632 to the client 602 indicating a data chunk size, compression algorithm, and/or the like. The client 602 may divide original data 614 into one or more chunks 633 based, for example, on the one or more indications 632.

Referring back to FIG. 3A and FIG. 3B, the data chunks 320 may be essentially the same size which may be required, for example, when the storage 308 is implemented with one or more block-based storage devices. In the embodiment illustrated in FIG. 6A, however, the data chunks 633 may be different sizes, for example, to take advantage of one or more of the storage devices 608 that may be implemented with KV interfaces. Additionally, or alternatively, the server 604 may implement software emulation of a key-value interface (e.g., RocksDB, LevelDB, and/or the like) on top of one or more block-based storage devices 608. Although the data chunks illustrated in FIG. 3A and FIG. 3B are shown with different sizes, the principles may also be applied to systems in which some or all of the storage devices have block-based interfaces, which may be considered a subset of variable sized chunks.

In some embodiments, an advisory and/or mandatory chunk size may be determined, for example, based on a chunk size that may be the best known size for a specific storage device. For example, with some solid state drives (SSDs), a 128 KB chunk size may fully utilize the SSD bandwidth. Additionally, or alternatively, a storage server may provide an optimal chunk size to the client 602 through a library, and the client 602 may internally split an object or other original data into smaller chunks when the user stores the object or other original data. Additionally, or alternatively, the client 602 may analyze the content and dynamically determine the chunk size.

After chunking the original data 614, the client may individually compress one or more of the data chunks 633 to generate one or more compressed chunks 634. The client 602 may send the compressed chunks 634 to the server 604 which may encrypt the one or more compressed chunks 634 to generate one or more compressed and encrypted data chunks 635. The server 604 may perform erasure coding on the one or more compressed and encrypted data chunks 635 to generate one or more parity chunks 636 and store the one or more data chunks 635 and one or more parity chunks 636 across one or more storage devices 608.

Figure 6B:
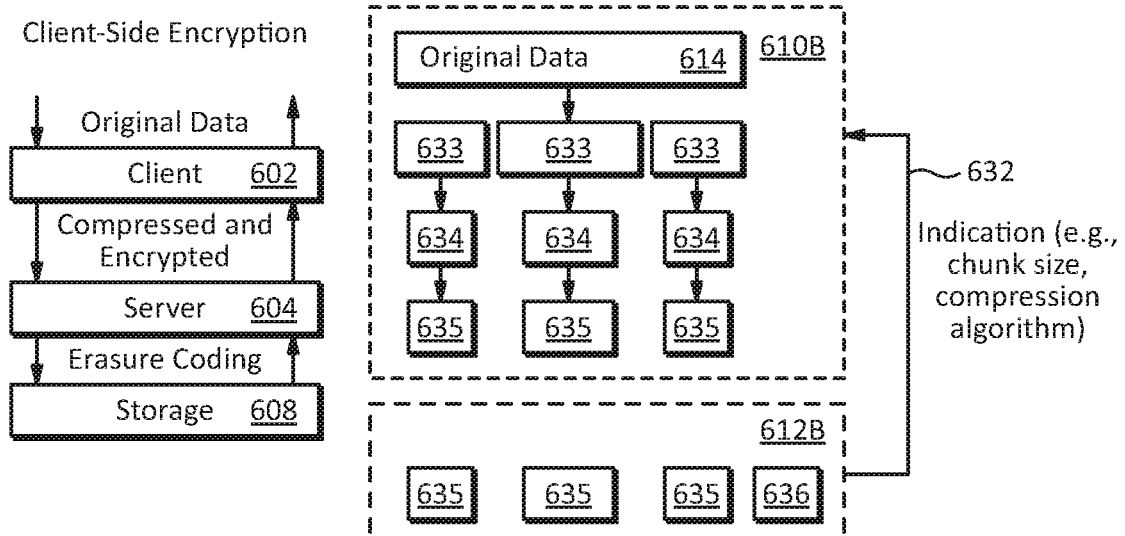
FIG. 6B illustrates an example embodiment of a write operation for a storage scheme having local data restoration and client-side encryption in accordance with example embodiments of the disclosure.

FIG. 6B illustrates an example embodiment of a write operation for a storage scheme having local data restoration and client-side encryption in accordance with example embodiments of the disclosure. The embodiment illustrated in FIG. 6B may be used, for example, to implement any of the storage schemes illustrated in FIG. 4 and FIG. 5. The left side of FIG. 6B illustrates data flow between components of a storage system, and the right side of FIG. 6B illustrates operations on data during the write operation.

The data flow between components and/or operations on data illustrated in FIG. 6B may be similar to the embodiment with server-side encryption illustrated in FIG. 6A, and elements having reference numerals ending in the same digits may be similar. However, in the embodiment illustrated in FIG. 6B, the client 602 may encrypt the one or more compressed chunks of data 634 to generate the one or more compressed and encrypted data chunks 635 as shown in the first operation group 610B. The client 602 may send the one or more compressed and encrypted data chunks 635 to the server 604 which may perform erasure coding on the one or more compressed and encrypted data chunks 635 to generate one or more parity chunks 636 and store the one or more data chunks 635 and one or more parity chunks 636 across one or more storage devices 608 as shown in operation group 612B.

After the one or more chunks of data 633 have been individually modified (e.g., compressed, encrypted, and/or the like) and stored as modified data chunks 636 across one or more storage devices 608, each storage device may be able to restore one or more data chunks (e.g., by decrypting and/or decompressing the one or more data chunks) and perform an operation on the restored data chunk. For example, a user, client 602, server 604, and/or the like, may send a request to one or more of the storage devices 608 to restore one or more of the chunks and perform one or more operations (e.g., a data selection operation) on the restored chunk of data.

Figure 7A:
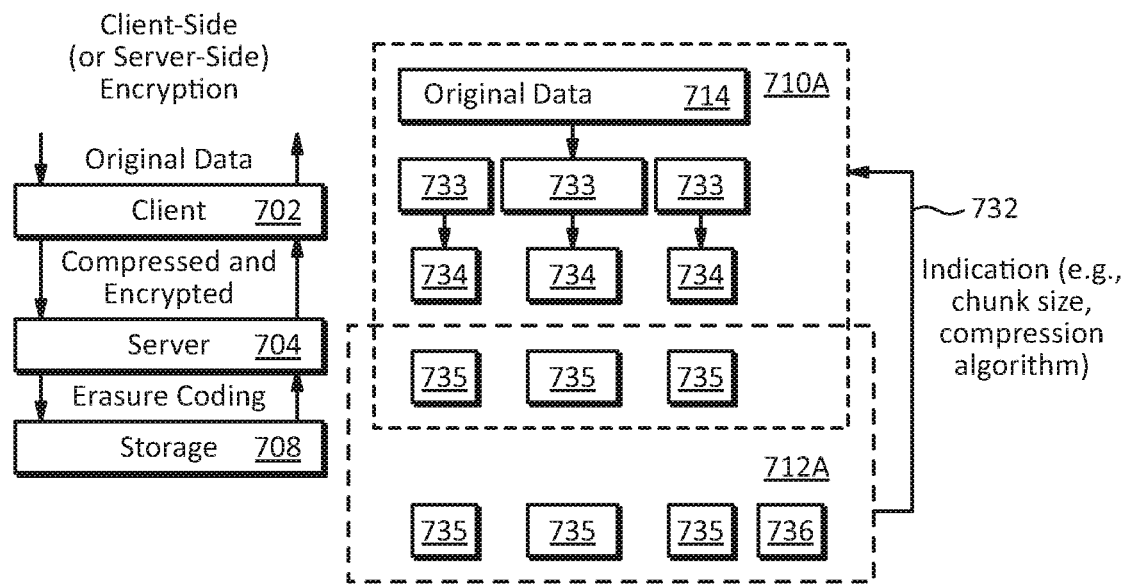
FIG. 7A illustrates an example embodiment of a write operation for a storage scheme having local data restoration in accordance with example embodiments of the disclosure.
Figure 7B:
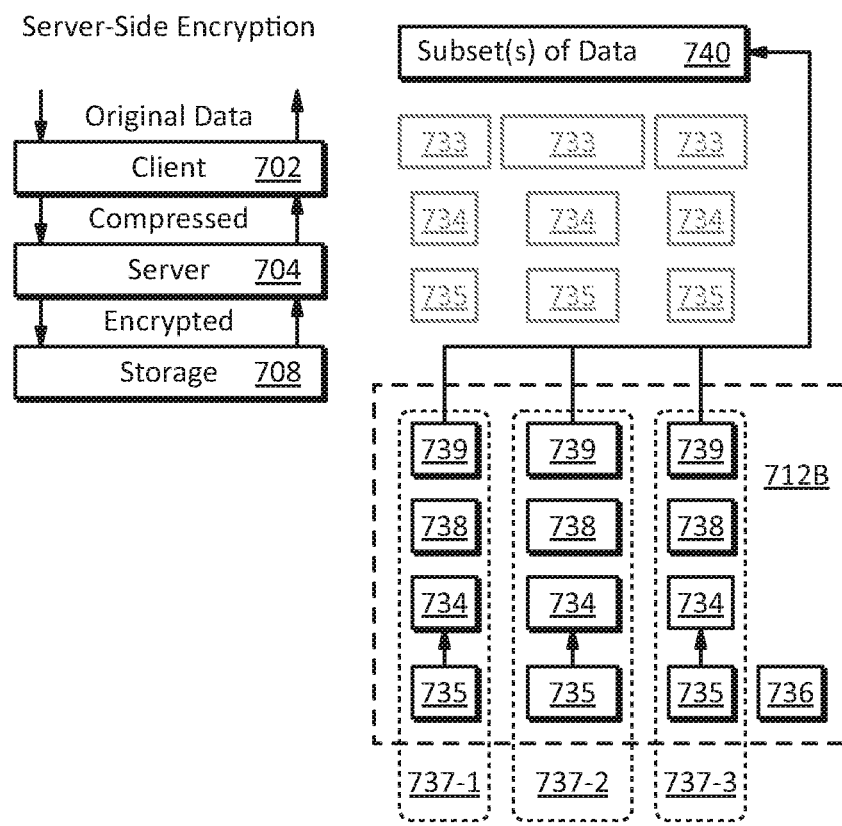
FIG. 7B illustrates an example embodiment of a read operation with data selection for a storage scheme having local data restoration in accordance with example embodiments of the disclosure.

FIG. 7A illustrates an example embodiment of a write operation for a storage scheme having local data restoration in accordance with example embodiments of the disclosure. FIG. 7B illustrates an example embodiment of a read operation with data selection for a storage scheme having local data restoration in accordance with example embodiments of the disclosure. The embodiments illustrated in FIG. 7A and FIG. 7B may be used, for example, to implement any of the storage schemes illustrated in FIG. 4 and FIG. 5.

Referring to FIG. 7A, the left side illustrates data flow between components of a storage system, and the right side illustrates operations on data during the write operation. Referring to FIG. 7B, the left side illustrates data flow between components of a storage system, and the right side illustrates operations on data during the read operation.

The write operation illustrated in FIG. 7A may implement server-side encryption similar to that illustrated in FIG. 6A or client-side encryption similar to that illustrated in FIG. 6B, and elements having reference numerals ending in the same digits may be similar. Thus, the data chunks 734, which have been individually compressed, may be encrypted to generate the compressed and encrypted data chunks 735 as part of the client operations 710A or part of the server operations 712A.

Referring to FIG. 7B, one or more computational storage devices 708 may receive one or more requests to perform a data selection operation to read one or more subsets of data from one or more chunks of data 735 stored at the storage device. The one or more requests may include, for example, one or more expressions to specify the requested subsets of data. The requests may be received, for example, from the client 702 through the server 704.

To process the one or more requests, the one or more storage devices 708 may perform a group of operations 737 locally at the one or more storage devices 708. Each of three different storage devices may perform a group of data restoration and data selection operations 737-1, 737-2, and 737-3, respectively, on a corresponding chunk of data stored at each device. However, in some embodiments, a single storage device may perform data restoration and data selection or other operations on any number of data chunks stored at the device.

Each storage device 708 may read, from a storage media, a corresponding chunk of data 735 that has been individually compressed and encrypted. Each storage device may decrypt the corresponding chunk of data to generate a compressed and decrypted chunk of data 734. Each storage device may decompress the corresponding chunk of data to generate a restored chunk of data 738. In some embodiments, each restored chunk of data 738 may be identical to a corresponding portion of the original data 714. However, in some embodiments, a restored chunk of data 738 may only be restored to a form that may enable the storage device 708 to perform a meaningful operation on the restored data (e.g., some embodiments may be able to perform one or more operations on a chunk of data that has not been completely decompressed).

After the chunks of data have been restored, each storage device 708 may perform a data selection operation (e.g., scanning, filtering, and/or the like) based, for example, on an expression provided with the request, to obtain one or more corresponding results 739. The one or more storage devices 708 may send the results 739 to the client as the one or more requested subsets 740 of the original data 714. Because the decompression and/or decryption operations of the client may be bypassed, they are grayed-out.

In some embodiments, one or more of the storage devices 708 may be able to recover one or more missing data chunks 735 if a parity chunk 736 is stored at the storage device. Alternatively, or additionally, a server 704 may restore one or more missing data chunks 735 using one or more parity chunks 736 stored at one or more other storage devices.

Depending on the implementation details, performing a data recovery and/or a data selection operation at a storage device may reduce the time, bandwidth, power, latency, and/or the like, associated with reading a subset of original data (e.g., a subset of an object) stored in one or more chunks across one or more storage devices.

Figure 8:
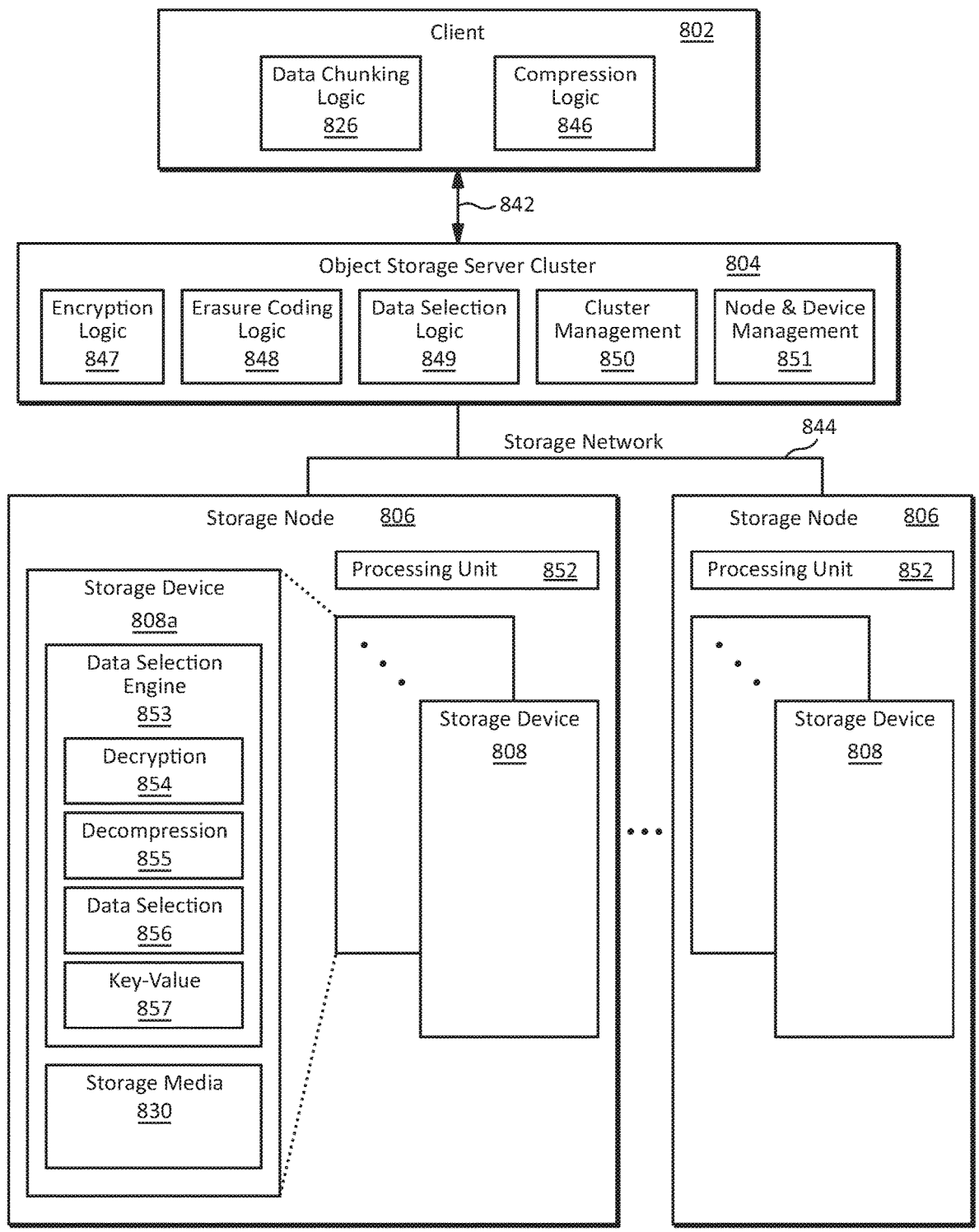
FIG. 8 illustrates an example embodiment of a system architecture for an object storage scheme with local data restoration in accordance with example embodiments of the disclosure.

FIG. 8 illustrates an example embodiment of a system architecture for an object storage scheme with local data restoration in accordance with example embodiments of the disclosure. The system illustrated in FIG. 8 may be used, for example, to implement any of the schemes described with respect to FIG. 4, FIG. 5, FIG. 6A, FIG. 6B, FIG. 7A, FIG. 7B, FIG. 9A, and/or FIG. 9B.

The system illustrated in FIG. 8 may include a client 802 and an object storage server cluster 804 connected through a network connection 842. The system may also include and one or more storage nodes 806 connected to the object storage server cluster 804 through a storage network 844.

The client 802 may include data chunking logic 826 and/or compression logic 846 which may be configured to perform data chunking of original data (e.g., one or more objects) prior to compressing individual chunks of data so the one or more computational storage devices 808 may restore a chunk of data to perform an operation on the restored chunk of data.

The object storage server cluster 804 may include encryption logic 847, erasure coding logic 848, data selection logic 849, cluster management logic 850, and/or node and storage device management logic 851. The encryption logic 847 may be used to individually encrypt chunks of data (e.g., compressed data) received from the client 802. The erasure coding logic 848 may perform erasure coding of data chunks across storage nodes 806 and/or the storage devices 808. The data selection logic 849 may perform various operations related to data restoration, data selection, and/or other processing operations performed by the individual storage devices 808. For example, the data selection logic 849 may receive requests from the client 802 to read one or more subsets of data that may be stored in chunks across one or more storage devices 808. The data selection logic 849 may forward the requests to the corresponding storage nodes 806 and/or storage devices 808, receive and/or aggregate results from the corresponding storage nodes 806 and/or storage devices 808, and send the aggregated results to the client 802. The cluster management logic 850 may perform housekeeping and/or management functions related to maintaining the storage server cluster 804. The node and storage device management logic 851 may perform housekeeping and/or management functions related to maintaining the one or more storage nodes 806 and/or storage devices 808.

Each of the storage nodes 806 may include a processing unit (e.g., a data processing unit (DPU), CPU, and/or the like) 852 and one or more computational storage devices 808. The DPU 852 may perform various functions such as receiving and distributing requests from the client 802 to read one or more subsets of data that may be stored in chunks across one or more storage devices 808. In some embodiments, the DPU 852 may perform data compression, data encryption, erasure coding, and/or the like, on chunks of data received from the object storage server cluster 804 and stored on the one or more computational storage devices 808. In some embodiments, the DPU 852 may aggregate results of one or more data selection operations performed by the one or more computational storage devices 808 and forward the aggregated results to the object storage server cluster 804 and/or client 802.

Computational storage device 808a shows an example of components that may be included in one or more of the computational storage devices 808. The computational storage device 808a may include a data selection engine 853 and storage media 830. The data selection engine 853 may include decryption logic 854 and decompression logic 855 that may be used to decrypt and/or decompress chunks of data, respectively, that have been individually encrypted and/or compressed to restore the chunks of data to a form that may be operated on. The data selection engine 853 may also include data selection logic 856 that may be used to perform a data selection or other operation on a restored chunk of data. The data selection engine 853 may also include KV logic 857 that may be used to implement a KV interface for the storage device 808a.

In some embodiments, the system illustrated in FIG. 8 may be implemented with KV interfaces for some or all of the storage devices 808. Depending on the implementation details, this may facilitate and/or enable the chunks of data to be implemented with variable chunk sizes. For purposes of illustration, the embodiment illustrated in FIG. 8 may be described as implementing a data selection feature with restored data chunks locally at one or more of the storage devices 808, however, the principles may be applied to any type of processing that may be performed on restored data chunks.

Figure 9A:
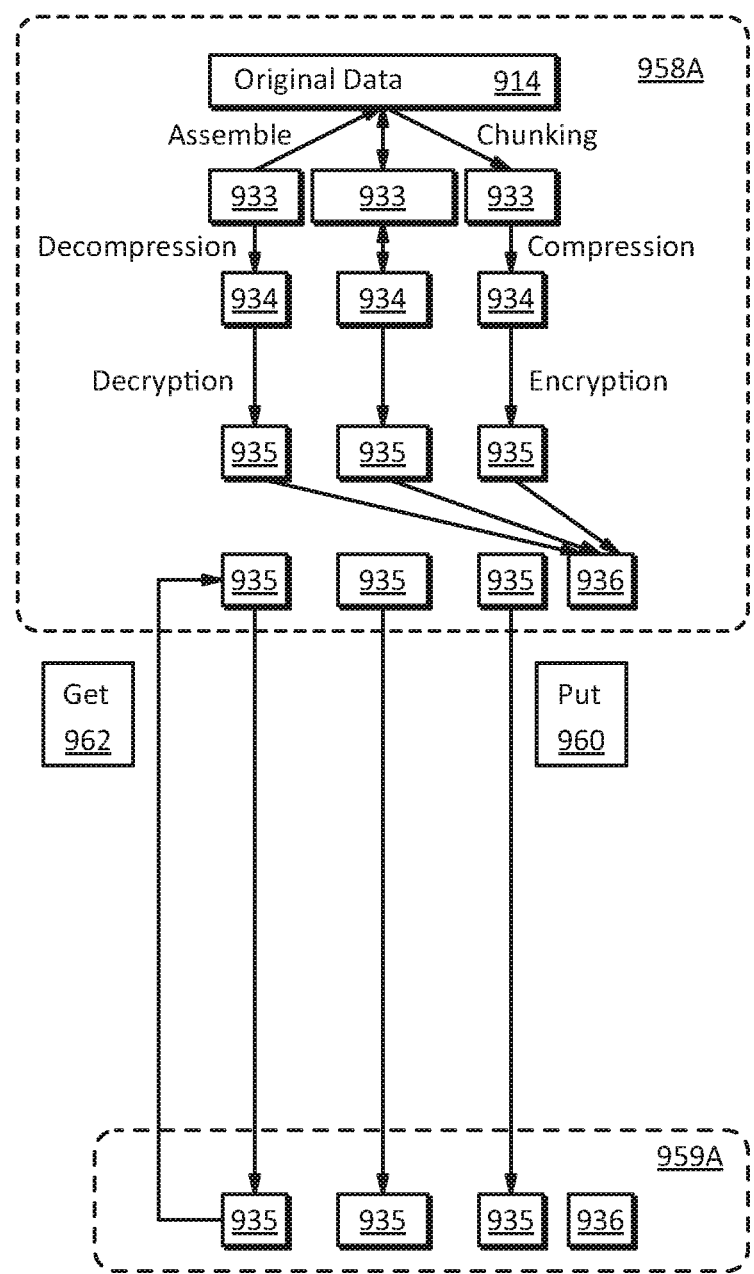
FIG. 9A illustrates example embodiments of read and/or write operations for a storage scheme with local data restoration in accordance with example embodiments of the disclosure.

FIG. 9A illustrates example embodiments of read and/or write operations for a storage scheme with local data restoration in accordance with example embodiments of the disclosure. The operations illustrated in FIG. 9A may be implemented, for example, using the system illustrated in FIG. 8. For purposes of illustration, a first group of operations 958A may be assumed to be performed by the client 802 and object storage server cluster 804 illustrated in FIG. 8, and a second group of operations 959A may be assumed to be performed by the one or more storage nodes 806 and/or storage devices 808 illustrated in FIG. 8, however, in other embodiments, the operations illustrated in FIG. 9A may be performed by any other components.

Referring to FIG. 9A, during a write operation (e.g., a put operation) original data 914 (e.g., one or more objects) may be chunked by a client to generate one or more chunks of data 933. The one or more chunks 933 may be individually compressed by the client to generate one or more compressed chunks 934, which may be sent to, and encrypted individually by, an object storage server to generate one or more compressed and/or encrypted chunks 935. The object storage server may perform erasure coding on the one or more compressed and/or encrypted chunks 935 to generate one or more parity chunks 936.

The object storage server may send the one or more compressed and encrypted chunks 935 and one or more parity chunks 936 (e.g., through a put operation 960) to one or more storage nodes for storage over one or more storage devices. Thus, after the write operation, the original data 914 (e.g., an object) may be stored across one or more storage devices in one or more chunks 935 that may have been individually modified (e.g., compressed and/or encrypted).

During a read operation (e.g., a get operation), for example, in an implementation in which a storage device may not recover and/or perform an operation on a chunk of data, one or more chunks of individually modified data 935 may be read from one or more storage devices. If one or more of the data chunks 935 is missing or corrupted, the missing and/or corrupted chunks may be recovered (e.g., by a storage device and/or a storage node) using the one or more parity chunks 936.

The one or more compressed and/or encrypted chunks 935 may be sent to an object storage server (e.g., through a get operation 962) that may decrypt the one or more compressed and/or encrypted chunks 935 to generate one or more compressed and decrypted chunks 934. The one or more compressed and decrypted chunks 934 may be sent to a client that may decompress the one or more data chunks 934 to generate decrypted and decompressed data chunks 933, and assemble them back into the original data 914.

Figure 9B:
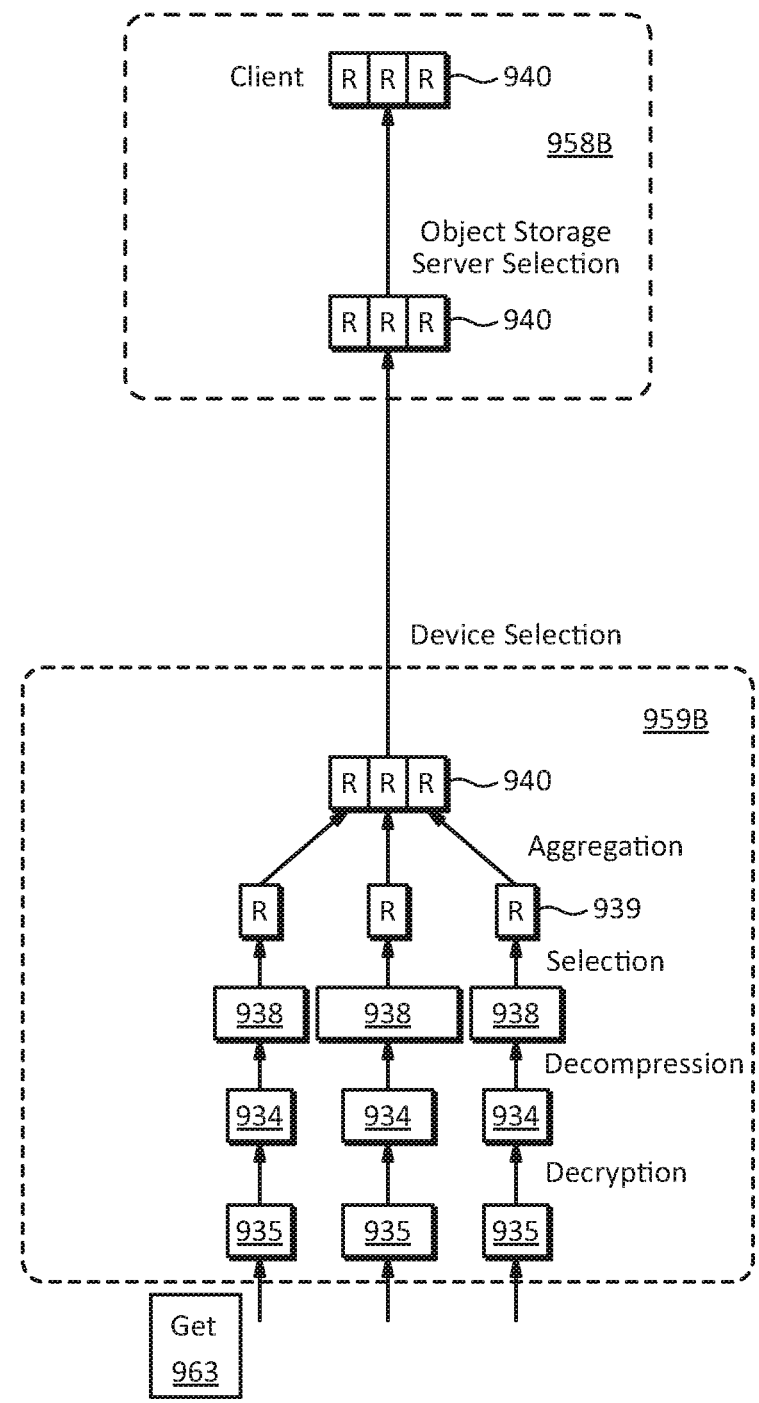
FIG. 9B illustrates an example embodiment of a read operation for a storage scheme with local data restoration and a data selection operation in accordance with example embodiments of the disclosure.

FIG. 9B illustrates an example embodiment of a read operation for a storage scheme with local data restoration and a data selection operation in accordance with example embodiments of the disclosure. The operations illustrated in FIG. 9B may be implemented, for example, using the system illustrated in FIG. 8. For purposes of illustration, a first group of operations 958B may be assumed to be performed by the client 802 and/or object storage server cluster 804 illustrated in FIG. 8, and a second group of operations 959B may be assumed to be performed by the one or more storage nodes 806 and/or storage devices 808 illustrated in FIG. 8, however, in other embodiments, the operations illustrated in FIG. 9B may be performed by any other components.

To begin a read operation (e.g., a get operation 963), one or more computational storage devices may receive one or more requests to perform a data selection operation to read one or more subsets of data from one or more chunks of data 935 stored at the one or more storage devices. The one or more requests may include, for example, one or more expressions to specify the requested subsets of data.

To service the one or more requests, one or more chunks of individually modified data 935 may be read from one or more storage devices. The one or more storage devices may individually decrypt the one or more chunks of data 935 to generate one or more chunks of compressed and decrypted data 934. The one or more storage devices may individually decompress the one or more chunks of compressed and decrypted data 934 to generate one or more chunks of restored data 938. In some embodiments, each restored chunk of data 938 may be identical to a corresponding portion of the original data 914. However, in some embodiments, a restored chunk of data 938 may only be restored to a form that may enable the storage device to perform a meaningful operation on the restored data (e.g., some embodiments may be able to perform one or more operations on a chunk of data that has not been completely decompressed).

The storage device may perform a data selection operation (e.g., scanning, filtering, and/or the like) on the one or more chunks of restored data 938 to find the one or more subsets of data 939 (indicated as results R) specified by the one or more requests. If a storage device has restored and performed a data selection operation on more than one chunk of data, the storage device may aggregate the results of the data selection operation to generate an aggregated result 940 which may be sent to an object storage server and to the client that sent the request. Additionally, or alternatively, the results R (e.g., subsets of data) 939 found by the data selection operations by multiple storage devices may be aggregated by a storage node and sent to an object storage server and to the client that sent the request.

Table 1 illustrates some example data that may be stored in a storage system in accordance with example embodiments of the disclosure. For purposes of illustration, the data shown in Table 1 is for real estate listings, but the principles may be applied to any type of data. Each row of Table 1 may correspond to a record having seven entries: a record index, living space in square feet, number of bedrooms, number of bathrooms, zip code, year built, and list price. Thus, for example, the first eight records may be identified by indexes 1-8, respectively.

TABLE 1

| Index | Living Space (sq ft) | Bedrooms | Bathrooms | Zip Code | Year Built | List Price ($) |
|---|---|---|---|---|---|---|
| 1 | 2222 | 3 | 3.5 | 32312 | 1981 | 250000 |
| 2 | 1628 | 3 | 2 | 32308 | 2009 | 185000 |
| 3 | 3824 | 5 | 4 | 32312 | 1954 | 399000 |
| 4 | 1137 | 3 | 2 | 32309 | 1993 | 150000 |
| 5 | 3560 | 6 | 4 | 32309 | 1973 | 315000 |
| 6 | 2893 | 4 | 3 | 32312 | 1994 | 699000 |
| 7 | 3631 | 4 | 3 | 32309 | 1996 | 649000 |
| 8 | 2483 | 4 | 3 | 32312 | 2016 | 399000 |
| 9 | 2100 | 5 | 3 | 32305 | 1926 | 497000 |
| 10 | ... | | | | | |

Figure 10:
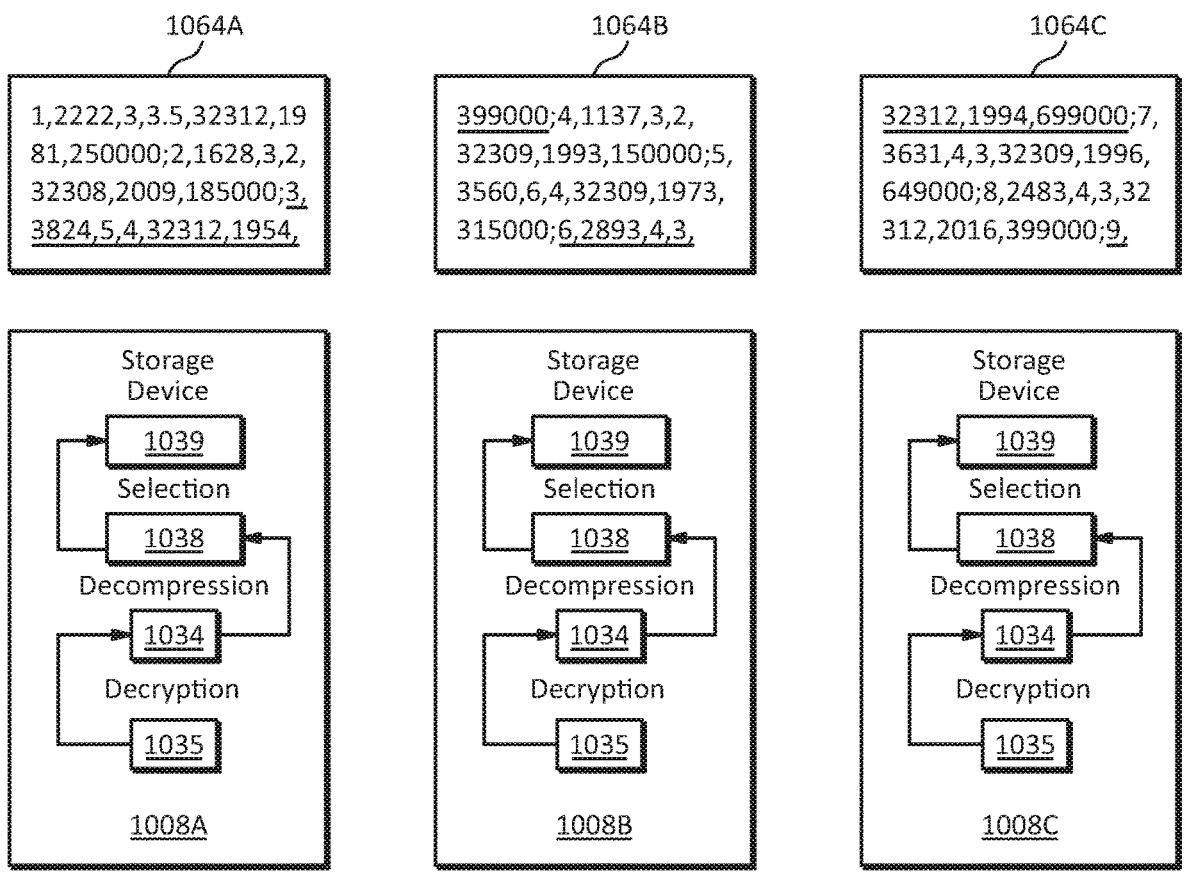
FIG. 10 illustrates an embodiment of a distribution of the data from Table 1 across three data chunks at three computational storage devices in accordance with example embodiments of the disclosure.

FIG. 10 illustrates an embodiment of a distribution of the data from Table 1 across three data chunks at three computational storage devices in accordance with example embodiments of the disclosure. In the embodiment illustrated in FIG. 10, a semicolon is used as a delimiter between the individual records (which may correspond to the rows shown in Table 1), but in other embodiments, other delimiting techniques may be used.

Referring to FIG. 10, the first two records (identified by indexes 1 and 2) may fit entirely within a first data chunk 1064A stored on a first storage device 1008A. The third record (identified by index 3 and indicated by entries with single underlining) may be split (e.g., fragmented) between data chunks 1064A and 1064B stored on the first and second storage devices 1008A and 1008B, respectively. The fourth and fifth records (identified by indexes 4 and 5) may fit entirely within the second data chunk 1064B stored on the second storage device 1008B. The sixth record (identified by index 6 and indicated by entries with single underlining) may be split between data chunks 1064B and 1064C stored on the second and third storage devices 1008B and 1008C. The seventh and eighth records (identified by indexes 7 and 8) may fit entirely within the third data chunk 1064C stored on the third storage device 1008C. The ninth record (identified by index 9 and indicated by entries with single underlining) may be split between the third 1064C stored on the third storage device 1008C and another chunk on another storage device.

For purposes of illustration, the computational storage devices 1008A, 1008B, and 1008C are shown as being implemented with data restoration logic and/or processing elements as described above that may enable the storage devices to restore an individually modified chunk of data 1035, for example, by decryption (to generate a decrypted chunk of data 1034) and/or decompression to generate a restored chunk of data 1038, and perform an operation such as a data selection operation on the restored chunk of data 1038 to obtain a specified subset of data 1039 from one or more of the records in the data chunk stored on the device. However, the principles are not limited to these implementation details and may be applied to any type of operation that may be performed on any type of data chunks stored on any type of computational storage devices. For purposes of illustration, some embodiments described herein may implement fixed size data chunks (e.g., as may be used with block-based storage devices), however, the principles may also be applied to embodiments that may implement variable size data chunks (e.g., as may be used with KV storage devices).

In some embodiments, a record may correspond to an object. In some embodiments described herein, a record (e.g., a JSON object) may be assumed to be smaller than a chunk which, depending on the implementation details, may ensure that an object may span no more than two chunks. In some embodiments, a delimiter can be implemented as a simple character such as a semicolon. For example, for CSV objects, a delimiter may be implemented as a carriage return. Additionally, or alternatively, one or more delimiters may be determined by a hierarchy. Thus, detecting a delimiter may be more complex than a simple comparison. For example, for JSON objects, a pair of curly braces ("{ . . . }") may define the JSON object. Moreover, in some embodiments, JSON objects may have nested JSON arrays, so the outermost pair of curly braces may define a single record. Thus, the delimiter may be defined by the outermost right curly brace ("}").

Referring again to FIG. 10, records that fit entirely within one of the storage devices (e.g., records 1, 2, 4, 5, 7, and 8) may be processed by the corresponding storage device. For example, if a client issues a read request for a data selection operation to return a subset of the data stored in Table 1 (e.g., the client sends a read request with an expression to return all records (or a portion thereof) having a year built after 1980), records 1, 2, 4, 5, 7, and 8 may be processed directly by the corresponding storage device. However, records 3, 6, and 9 may not be processed locally at a storage device because they are fragmented between data chunks at two different storage devices.

Figure 11:
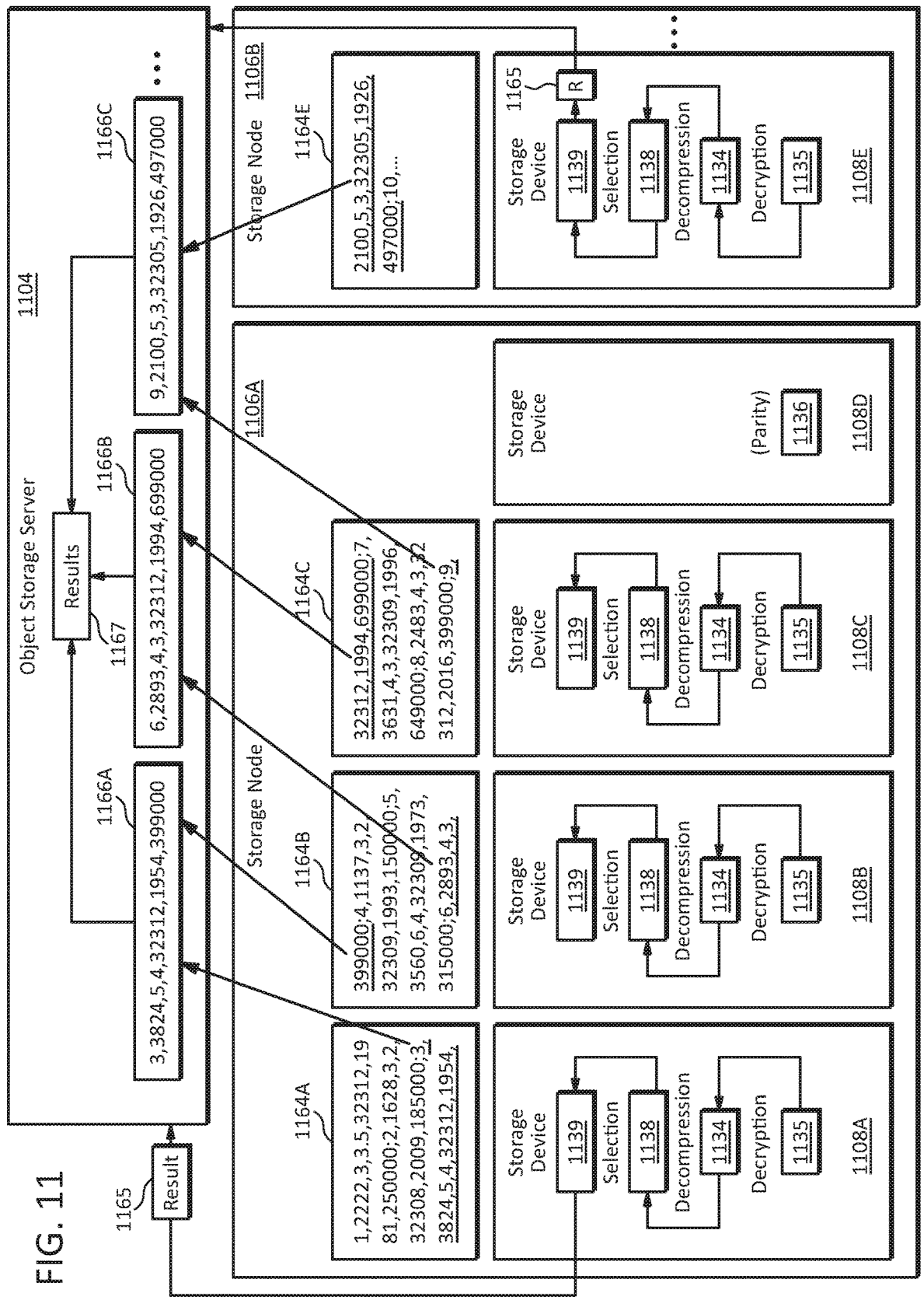
FIG. 11 illustrates an example embodiment of a storage system in which a server may reconstruct records split between data chunks at different storage devices in accordance with example embodiments of the disclosure.

FIG. 11 illustrates an example embodiment of a storage system in which a server may reconstruct records split between data chunks at different storage devices in accordance with example embodiments of the disclosure. The embodiment illustrated in FIG. 11 may include an object storage server 1104, two storage nodes 1106A and 1106B coupled to the object storage server 1104 through a storage network, and computational storage devices 1108A, 1108B, 1108C, 1108D, and 1108E which may store data chunks including records similar to those illustrated in FIG. 10.

Referring to FIG. 11, each of the storage devices 1108A through 1108E may send results 1165 of a data selection operation it may perform on any complete records in its corresponding data chunk 1164A through 1164E, respectively (either directly, or through the storage node at which it is located). However, because records 3, 6, and 9 may not be processed locally at a storage device, the object storage server 1104 may reconstruct the split records in one or more aggregate buffers 1166. In some embodiments, each aggregate buffer 1166 may reconstruct the split record between the ith device and the (i+1)th device. For example, storage device 1108A may send a first portion (which may also be referred to as a fragment) of record 3 (e.g., the index, living space, bedrooms, bathrooms, zip code, and year built) located in data chunk 1164A to the object storage server 1104 to be aggregated in a first buffer 1166A with a second portion of record 3 (list price) located in data chunk 1164B and sent by storage device 1108B. In some embodiments, the object storage server 1104 may include N aggregate buffers where N may be the number of storage devices coupled to the object storage server 1104.

The object storage server 1104 may perform a selection operation on the reconstructed records 3, 6, and 9 in the aggregate buffers 1166A, 1166B, and 1166C, respectively, to generate results 1167. Thus, between the results 1165 sent by the individual storage devices, and the results 1167 generated from the aggregate buffers 1166, the object storage server 1104 may obtain all subsets of data specified by the request and return the subsets to the client.

However, depending on the implementation details, each of the fragments of records sent from the storage devices 1108 to the object storage server 1104 may consume time, bandwidth, and/or power, increase latency, reduce the utilization of processing resources, and/or the like, and/or may result in the object storage server 1104 becoming a potential bottleneck.

Figure 12:
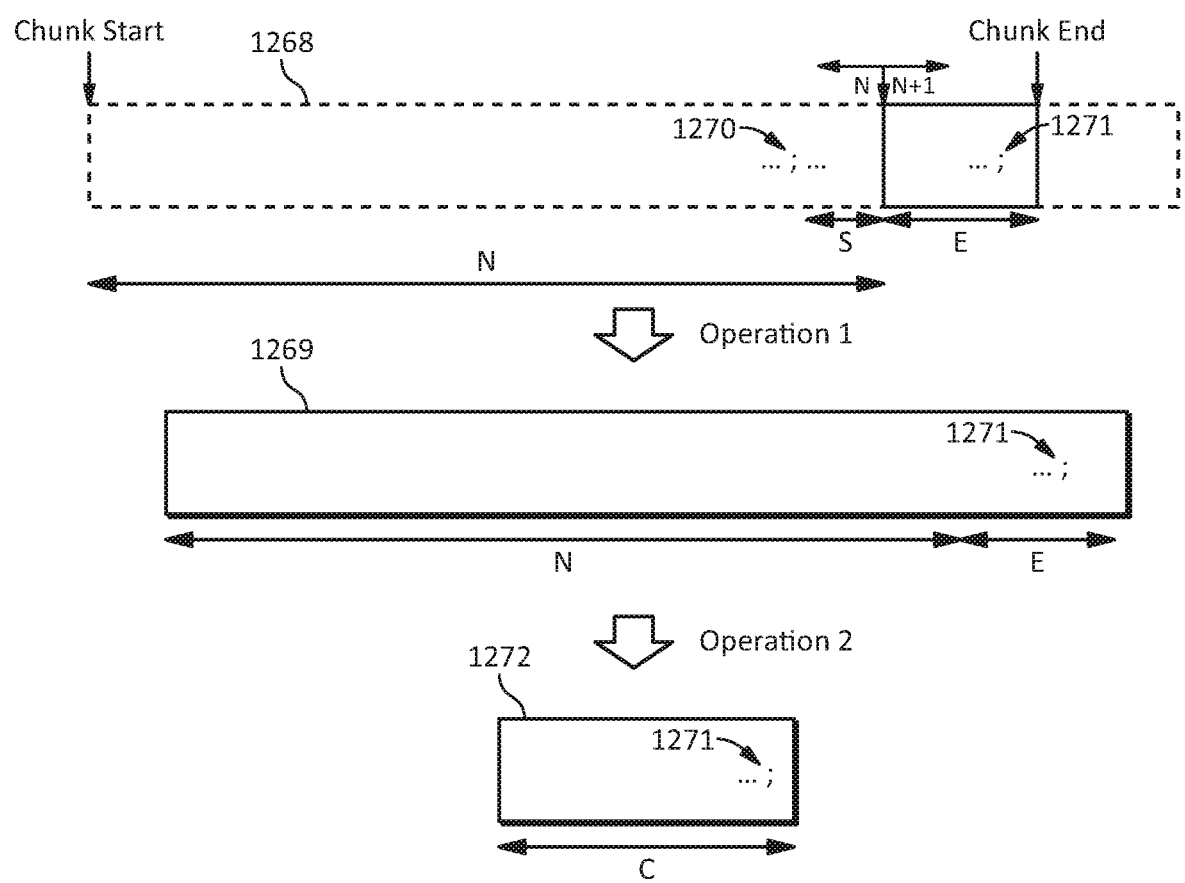
FIG. 12 illustrates an embodiment of a content-aware method for dividing data into chunks and compressing data in accordance with example embodiments of the disclosure.

FIG. 12 illustrates an embodiment of a content-aware method for dividing data into chunks and compressing data in accordance with example embodiments of the disclosure. In the method illustrated in FIG. 12, uncompressed input data 1268 (which may be stored in a buffer) shown at the top of FIG. 12 may include one or more records that may each terminate with a delimiter which, in this example, may be a semicolon. In other embodiments, however, other delimiters such as brackets, carriage return-line feed (CR-LF) sequences, and/or the like, may be used. In some embodiments, one or more records may be included in an array (e.g., a JSON array), a document (e.g., a JSON document), and/or the like within the input data 1268. If a record ends at the end of an array, a document, and/or the like, a different delimiter may be used to indicate the end of the array, document, and/or the like, but the method illustrated in FIG. 12 may also interpret the different delimiter as the end of a record.

During a first pass (Operation 1), the method may scan the input data 1268 and use it to generate a chunk of data until it reaches a default chunk size N. If the last data element in the chunk 1269 is a delimiter, the method may proceed to a second pass (Operation 2). If the last data element in the chunk is not a delimiter, the method may modify the size of the chunk so the end of the chunk aligns with the end of a delimiter. For example, the method may begin at position N+1 in a buffer holding the data 1268 and scan backward until it finds the delimiter 1270. The method may reduce the size of the chunk (e.g., shrink the chunk) until the delimiter 1270 is the last data element in the chunk. Thus, the chunk may be reduced by a size equal to the shrink space S so the chunk may only include one or more complete records.

Alternatively, the method may begin at position N+1 in a buffer holding the data 1268 and scan forward until it finds the delimiter 1271. The method may extend the size of the chunk until the delimiter 1271 is the last data element in the chunk 1269 as shown in the middle of FIG. 12. Thus, the chunk may be extended by a size equal to the extended space E so the chunk may only include one or more complete records.

Once the chunk size is determined, the method may proceed to a second pass (Operation 2) in which the self-contained chunk (e.g., chunk 1269), which may end with a delimiter and only include complete records, may be compressed to a length C using one or more compression algorithms to generate compressed data 1272.

Because the size of a chunk of uncompressed data may be reduced or extended, the size of the chunk of uncompressed data 1269 may be variable, and thus, the size of the chunk of compressed data 1272 may be variable.

Whether the method reduces or extends the length of the chunk may depend on various factors such as a maximum and/or optimal data size for an object or key-value storage device the chunk may be sent to, or a block size for a block-based storage device the chunk may be sent to. In the case of an object or key-value storage device, the resulting chunk of compressed, self-contained data 1272 may be stored without further modification and/or processing.

Depending on the implementation details, the content-aware data chunking method illustrated in FIG. 12 may improve the operation of a storage system such as that shown in FIG. 11, for example, because fewer or no records may be split between chunks on different storage devices, and thus, fewer or no fragments of records may be transferred between storage devices, storage nodes, storage servers, and/or the like, to enable components to restore chunks of data having complete records and/or perform operations on complete records.

The compression method illustrated in FIG. 12 may be implemented, for example, using any of the systems illustrated in FIG. 4, FIG. 5, and/or FIG. 9, in which the chunking logic 426, 526, and/or 826 may include content-aware logic configured to determine a chunk size based on finding boundaries (e.g., delimiters) of records or other units of data in the uncompressed input data 1268.

Although the method illustrated in FIG. 12 may improve the operation of a storage system, in some embodiments, and depending on the implementation details, the overhead associated with the use of two passes may increase the processing burden, especially when scanning relatively large objects.

Some additional content-aware data chunking techniques in accordance with example embodiments of the disclosure may integrate a chunking operation with another operation such as a data compression operation that may scan the data to be chunked. Depending on the implementation details, this may improve the efficiency of the chunking operation because it may exploit a scanning operation that was already being performed for purposes of compression. Thus, in some embodiments, it may reduce or eliminate overhead associated with two scanning passes.

Figure 13:
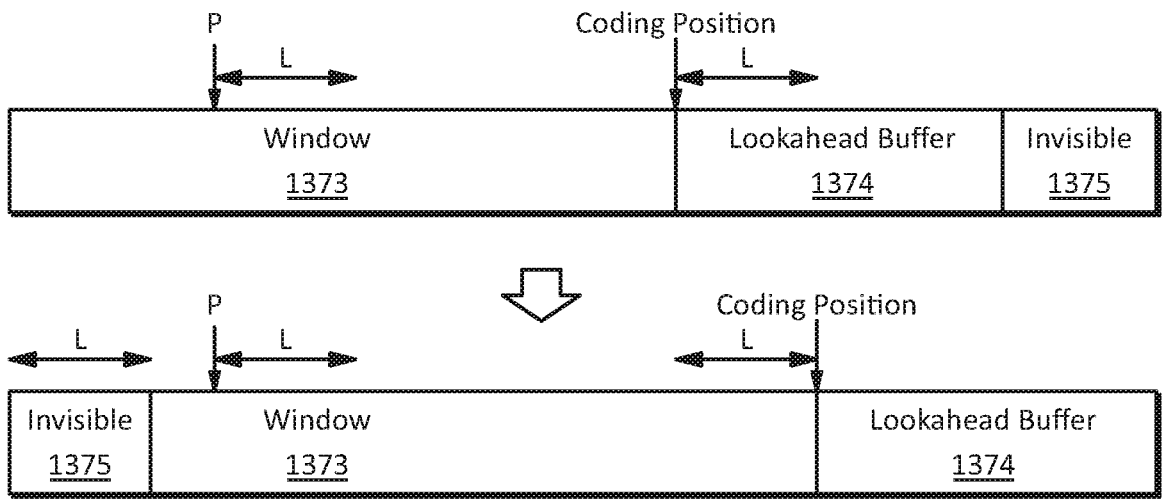
FIG. 13 illustrates an embodiment of a method for compressing data in accordance with example embodiments of the disclosure.
Figure 14:
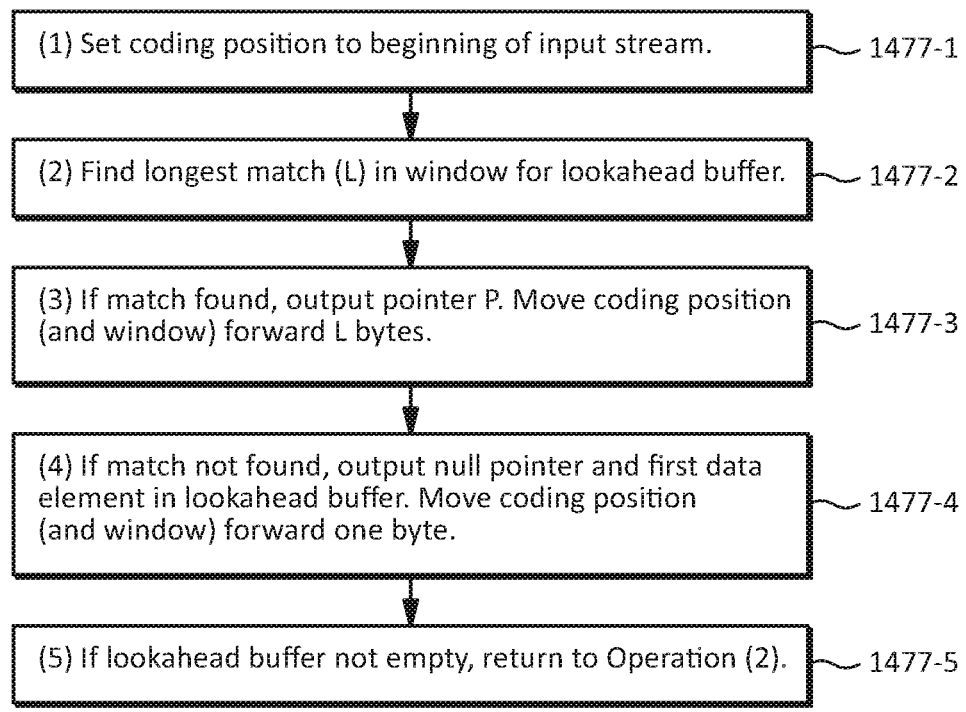
FIG. 14 illustrates an embodiment of operations that may be performed by the method illustrated in FIG. 13.

FIG. 13 illustrates an embodiment of a method for compressing data in accordance with example embodiments of the disclosure. FIG. 14 illustrates an embodiment of operations that may be performed by the method illustrated in FIG. 13. The method illustrated in FIG. 13 and FIG. 14 may be based, for example, on a compression algorithm such as LZ77. As illustrated at the top of FIG. 13, the method may operate on a stream of input data that may pass through a lookahead buffer 1374 and a window 1373 (which may also be implemented as a buffer). A portion (which may also be referred to as a part) of the stream of input data ahead of the lookahead buffer 1374 may be indicated as an invisible part 1375 because it may not be to the logic performing the compression. Depending on how much data has passed through the lookahead buffer 1374 and window 1373, there may be another part of invisible data after the window 1373.

The method illustrated in FIG. 13 may perform the following operations as illustrated in FIG. 14. The embodiments illustrated in FIG. 13 and FIG. 14 may be implemented with data elements of any size, configuration, and/or the like, such as bytes, words, nibbles, and/or the like.

(1) At a first operation 1477-1, the method may set the coding position to the first data element of the stream of input data as shown at the top of FIG. 13.

(2) At a second operation 1477-2, the method may scan the stream of input data to look for a longest match of length L between one or more data elements (which may be referred to as literals) in the lookahead buffer 1374, and one or more data elements in the window 1373 as shown at the top of FIG. 13.

(3) At a third operation 1477-3, if a match was found at the second operation (2) 1477-2, the method may output a pointer P which may include, for example, an offset from the coding position indicating the beginning location of the matched data in the window 1373 and the length L indicating the number of data elements that match as shown at the top of FIG. 13. The method may move the coding position and window 1373 forward by L data elements as shown at the bottom of FIG. 13. The method may proceed to a fifth operation (5) 1477-5. Depending on the length L, this may cause all or part of the invisible part 1375 of the input data stream to enter the lookahead buffer 1374 and a part 1375 of data length L previously in the window 1373 to become invisible (e.g., inaccessible to the logic performing the method).

(4) At a fourth operation 1477-4, if a match was not found at the second operation (2) 1477-2, the method may output a null pointer (e.g., a pointer in which the offset and/or length L are zero) and the next data element (literal) in the lookahead buffer 1374. The method may move the coding position and the window 1373 forward by one data element.

(5) at a fifth operation 1477-5, if the lookahead buffer 1374 is not empty, the method may return to the second operation (2) 1477-2. Otherwise, the method may terminate.

Thus, the compression method illustrated in FIG. 13 and FIG. 14 may operate by checking if a sequence of one or more literals in the lookahead buffer 1374 has ever appeared within the range of the window 1373 and replacing it with a pointer (e.g., an index) an instance of that sequence in the window 1373. The stream of output data generated by the compression operation may be a series of literal data elements (e.g., bytes) and pointers that may indicate a sequence of data elements that is already in the output.

In some embodiments, a record may include any complete data structure (e.g., a row in a database) that may be used and/or operated on as a unit. In some embodiments, a delimiter may be implemented with anything that may indicate a boundary of a record, e.g., one or more data elements (a semicolon, a bracket, a carriage return-line feed (CR-LF) sequence, and/or the like). In some embodiments, a delimiter may be implemented with a data structure such as an index table that may indicate where a record ends.

Because the compression method illustrated in FIG. 13 and FIG. 14 may scan input data as part of its normal operation, a chunking operation in accordance with example embodiments of the disclosure may be integrated into the compression method illustrated in FIG. 13 and FIG. 14 to exploit the data scanning already being performed by the compression operation.

Figure 15:
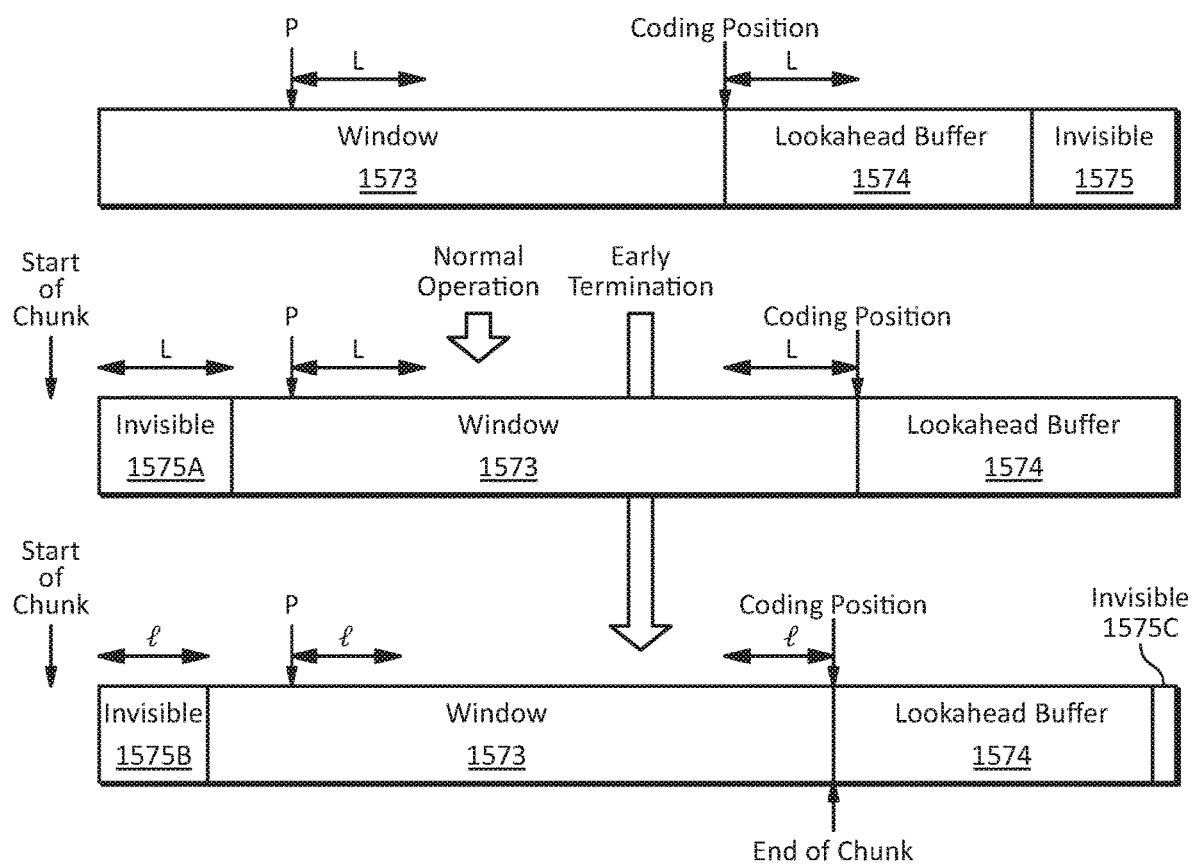
FIG. 15 illustrates an embodiment of an integrated chunking and compression scheme in accordance with example embodiments of the disclosure.

FIG. 15 illustrates an embodiment of an integrated chunking and compression scheme in accordance with example embodiments of the disclosure.

As illustrated at the top of FIG. 15, a stream of input data may pass through a lookahead buffer 1574 and a window 1573 (which may also be implemented as a buffer). A part of the stream of input data ahead of the lookahead buffer 1574 may be indicated as an invisible part 1575 because it may not be to the logic performing the compression. Depending on how much data has passed through the lookahead buffer 1574 and window 1573, there may be another part of invisible data after the window 1573.

Figure 16:
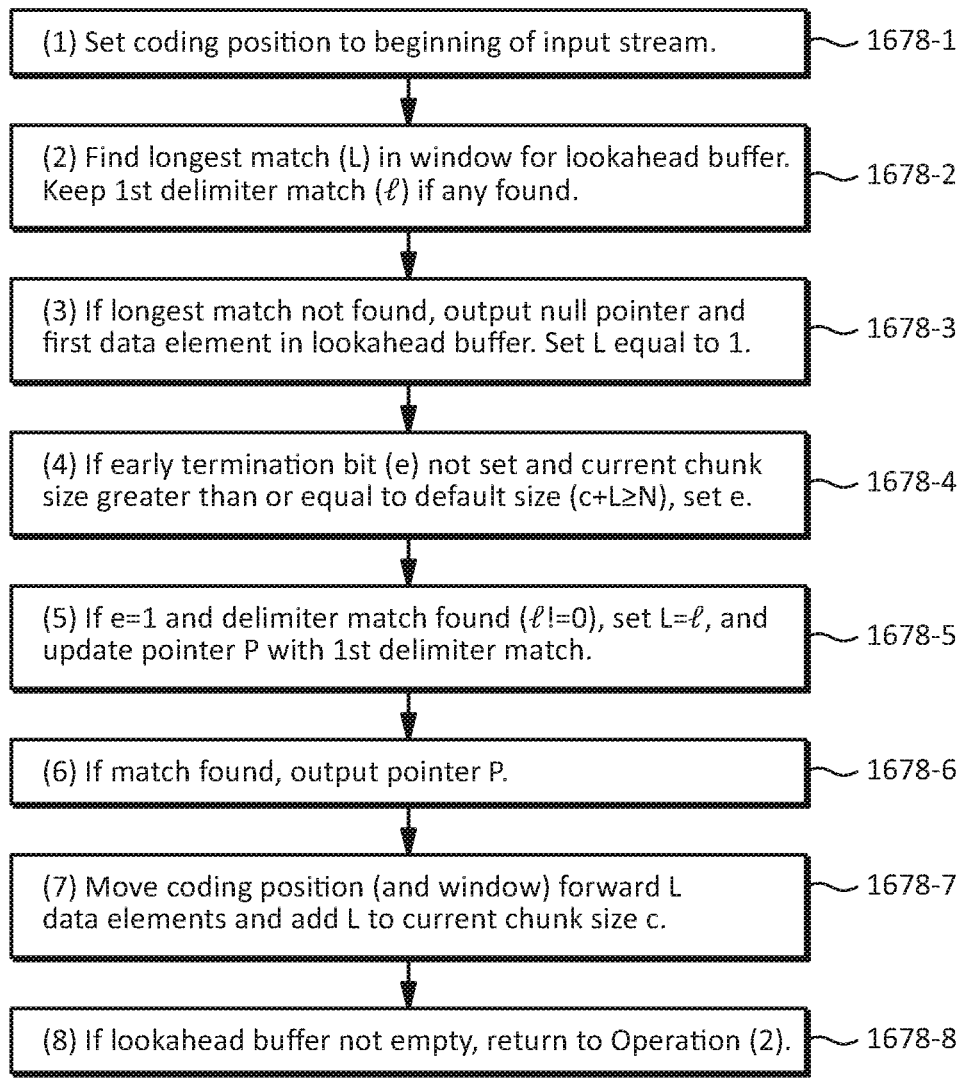
FIG. 16 illustrates an embodiment of an integrated chunking and compression method that may be performed by the scheme illustrated in FIG. 15 in accordance with example embodiments of the disclosure.

FIG. 16 illustrates an embodiment of an integrated chunking and compression method that may be performed with the scheme illustrated in FIG. 15 in accordance with example embodiments of the disclosure.

The embodiments illustrated in FIG. 15 and/or FIG. 16 may be implemented with data elements of any size, configuration, and/or the like, such as bytes, words, nibbles, and/or the like. The embodiments illustrated in FIG. 15 and/or FIG. 16 may use a current chunk size (c), an early termination indicator (e.g., an early termination bit) (e), and a record delimiter length (l). In some embodiments, the scheme illustrated in FIG. 15 may perform the following operations as illustrated in FIG. 16.

(1) At a first operation 1678-1, the method may set the coding position to the first data element of the stream of input data as shown at the top of FIG. 15. In some embodiments, the current chunk size (c), an early termination bit (e), and/or a record delimiter length (l) may be initialized to zero. In some embodiments, the initial coding position may correspond to the start of a chunk of data as shown in the middle and at the bottom of FIG. 15.

(2) At a second operation 1678-2, the method may scan the stream of input data to look for a longest match of length L between one or more data elements in the lookahead buffer 1574, and one or more data elements in the window 1573 as shown at the top of FIG. 15. While scanning the stream of input data to look for a longest match, the method may also look for a match for a delimiter for a record. If a match for a delimiter is found, the method may keep (e.g., record the position of) the first instance of the delimiter match, for example, in the window 1573 and set the delimiter length l to the length of the delimiter match that was found.

(3) At a third operation 1678-3, if a longest match was not found at the second operation (2) 1678-2, the method may output a null pointer (e.g., a pointer in which the offset and/or length L are zero) and the next data element (literal) in the lookahead buffer 1574 to generate a stream of compressed output data. The method may move the coding position and the window 1573 forward by one data element. The method may also set the length L to one which may indicate that the current chunk size will be increased by the one data element output from the lookahead buffer 1574.

(4) At a fourth operation 1678-4, if the early termination bit (e) is not set, and the current chunk size (c+L) is greater than or equal to a default chunk size (N), the method may set the early termination bit to one (e=1).

(5) At a fifth operation 1678-5, if the early termination bit is set (e=1) and a delimiter match has been found (e.g., l!=0), the method may set L equal to l (which is greater than one) and update the pointer P with the first matched delimiter (e.g., with the offset from the coding position indicating the beginning location of the first matched delimiter in the window 1573, and the length l indicating the length of the matched delimiter).

(6) At a sixth operation 1678-6, if a match is found (e.g., a longest match or a delimiter match) the method may output the pointer P, for example, based on the location and length of the longest match (e.g., a normal match) as shown in the middle of FIG. 15 or the location and length of the second delimiter match (e.g., early termination) as shown at the bottom of FIG. 15 to generate the stream of compressed output data.

(7) At a seventh operation 1678-7, the method may move the coding position and window 1573 forward by L data elements, where L may be the length of a longest match as shown in the normal operation in the middle of FIG. 15 or L may be the length l of a delimiter match as shown in the early termination operation at the bottom of FIG. 15. After the seventh operation, the stream of data may have one or more invisible parts 1575A, 1575B, and/or 1575C depending on the lengths of L and l.

(8) At an eighth operation 1678-8, if the lookahead buffer 1574 is not empty, the method may return to the second operation (2) 1678-2. Otherwise, the end of the chunk may be determined by the end of the delimiter as shown at the coding position at the bottom of FIG. 15.

In some embodiments, the scheme illustrated in FIG. 15 and/or the method illustrated in FIG. 16, may initially perform a compression operation by finding longest matches similar to the method illustrated in FIG. 13 and FIG. 14 until the default chunk size N is reached. However, when approaching the default chunk size, the embodiments illustrated in FIG. 15 and/or FIG. 16 may compress the input data record-by-record until it exceeds the default chunk size. For example, in some embodiments, the method may find the smallest chunk that is larger than the default chunk size (and which may be terminated with delimiters). In some embodiments, this may be referred to as a minimum largest chunk. As the method scans the stream of input data, the start of the chunk as shown in the middle and at the bottom of FIG. 15 may progressively move away from the coding position.

Depending on the implementation details, the content-aware data chunking techniques illustrated in FIG. 15 and/or FIG. 16 may improve the operation of a storage system such as that shown in FIG. 11, for example, because fewer or no records may be split between chunks on different storage devices, and thus, fewer or no fragments of records may be transferred between storage devices, storage nodes, storage servers, and/or the like, to enable components to restore chunks of data having complete records and/or perform operations on complete records.

Depending on the implementation details, the embodiments illustrated in FIG. 15 and/or FIG. 16 may also improve the efficiency of a data chunking operation because it may exploit a scanning operation that was already being performed for purposes of compression. Thus, in some embodiments, they may reduce or eliminate overhead associated with two scanning passes.

Figure 17:
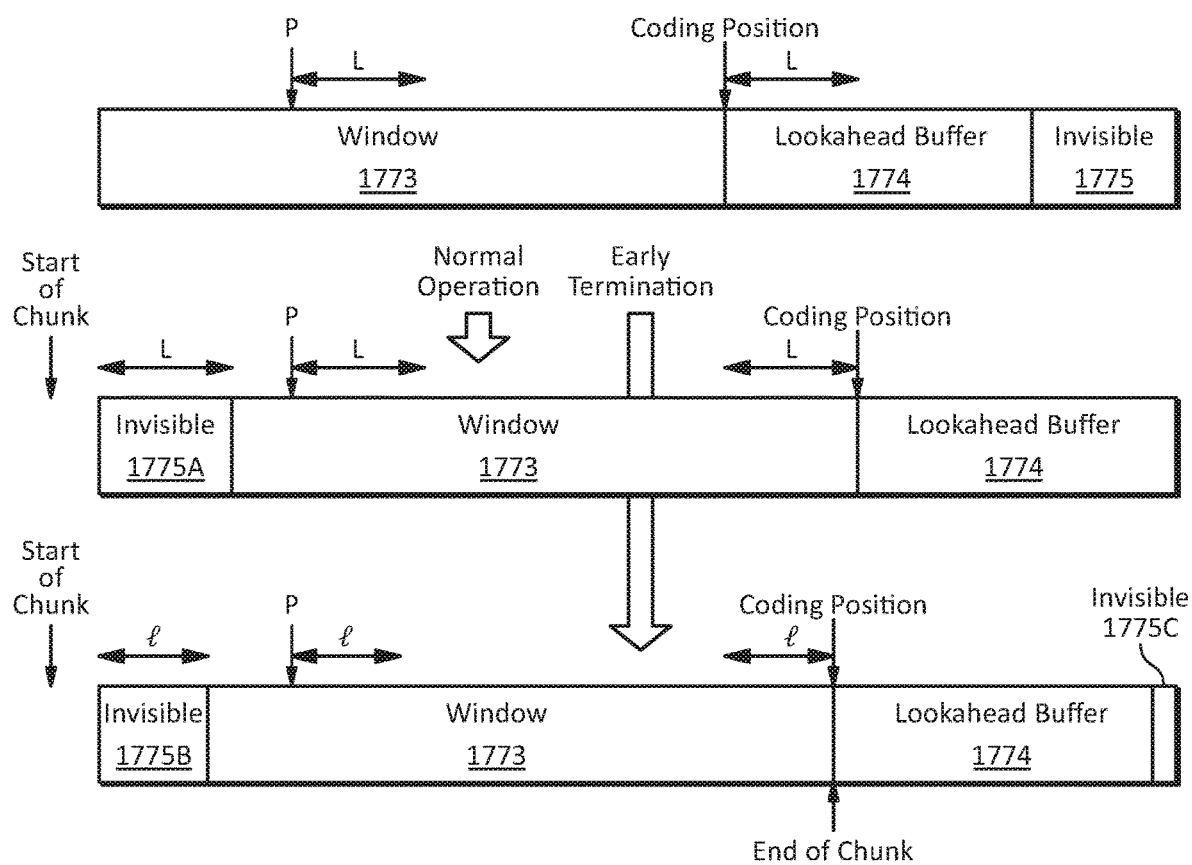
FIG. 17 illustrates another embodiment of an integrated chunking and compression scheme in accordance with example embodiments of the disclosure.

FIG. 17 illustrates another embodiment of an integrated chunking and compression scheme in accordance with example embodiments of the disclosure.

Figure 18:
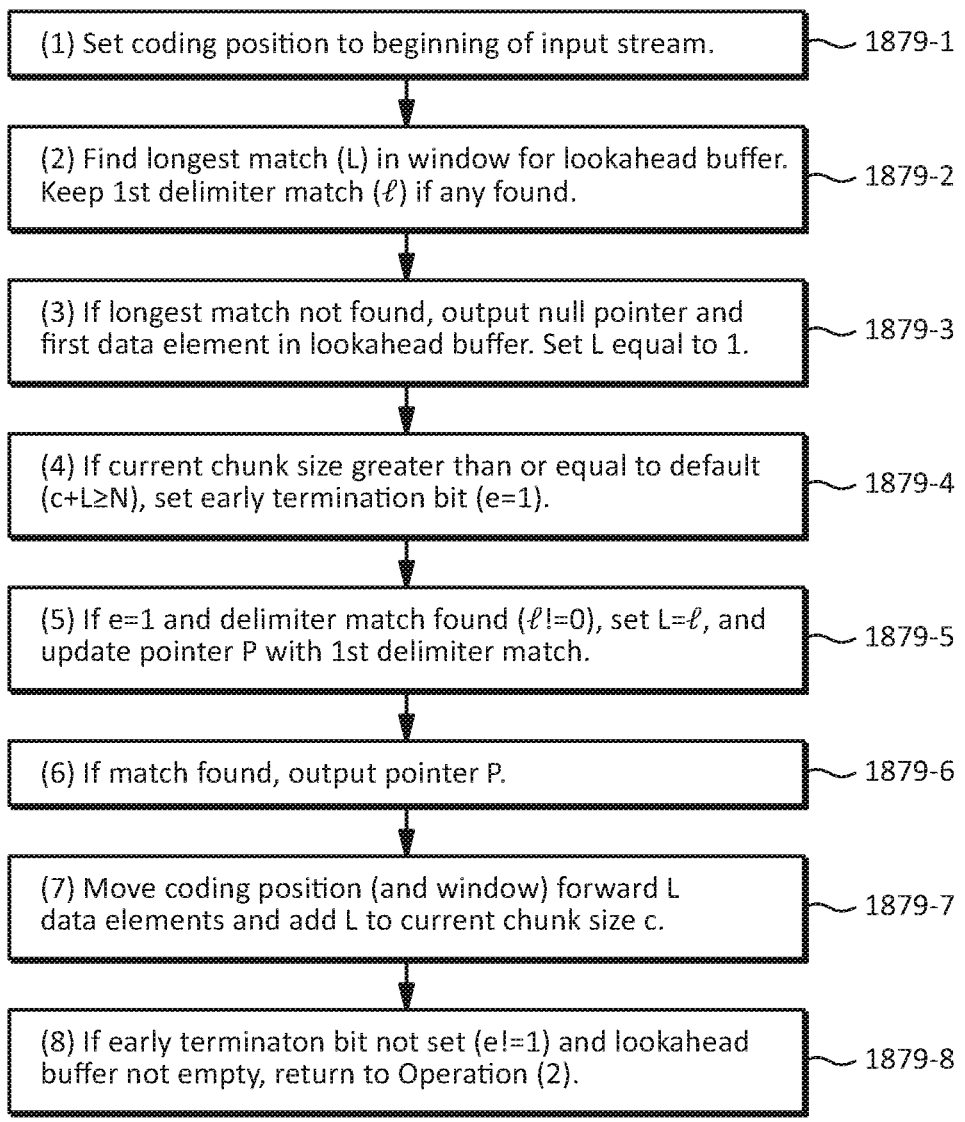
FIG. 18 illustrates an embodiment of an integrated chunking and compression method that may be performed by the scheme illustrated in FIG. 17 in accordance with example embodiments of the disclosure.

FIG. 18 illustrates an embodiment of an integrated chunking and compression method that may be performed with the scheme illustrated in FIG. 17 in accordance with example embodiments of the disclosure.

The scheme illustrated in FIG. 17 may include components and/or implement operations similar to those described with respect to the embodiment illustrated in FIG. 15 in which elements having reference numerals ending in the same digits may be similar. However, in the embodiment illustrated in FIG. 17, rather than compressing input data record-by-record, the method may determine the chunk size when the first record is encountered. For example, in some embodiments, the method may find the largest chunk that is smaller than the default chunk size (and which may be terminated with delimiters). In some embodiments, this may be referred to as a maximum smallest chunk.

As illustrated at the top of FIG. 17, a stream of input data may pass through a lookahead buffer 1774 and a window 1773 (which may also be implemented as a buffer). A part of the stream of input data ahead of the lookahead buffer 1774 may be indicated as an invisible part 1775 because it may not be to the logic performing the compression. Depending on how much data has passed through the lookahead buffer 1774 and window 1773, there may be another part of invisible data after the window 1773.

The embodiment illustrated in FIG. 17 may perform one or more of the following operations as illustrated in FIG. 18. The embodiments illustrated in FIG. 17 and/or FIG. 18 may be implemented with data elements of any size, configuration, and/or the like, such as bytes, words, nibbles, and/or the like. The embodiments illustrated in FIG. 17 and/or FIG. 18 may use a current chunk size (c), an early termination indicator (e.g., an early termination bit) (e), and record delimiter length (l).

(1) At a first operation 1879-1, the method may set the coding position to the first data element of the stream of input data as shown at the top of FIG. 17. In some embodiments, the current chunk size (c), an early termination bit (e), and/or record delimiter length (l) may be initialized to zero.

(2) At a second operation 1879-2, the method may scan the stream of input data to look for a longest match of length L between one or more data elements in the lookahead buffer 1774, and one or more data elements in the window 1773 as shown at the top of FIG. 17. While scanning the stream of input data to look for a longest match, the method may also look for a match for a delimiter for a record. If a match for a delimiter is found, the method may keep the first instance of the delimiter match, for example, in the window 1773 and set the delimiter length l to the length of the delimiter match that was found.

(3) At a third operation 1879-3, if a longest match was not found at the second operation (2) 1879-2, the method may output a null pointer (e.g., a pointer in which the offset and/or length L are zero) and the next data element (literal) in the lookahead buffer 1774 to generate a stream of compressed output data. The method may move the coding position and the window 1773 forward by one data element. The method may also set the length L to one which may indicate that the current chunk size will be increased by the one data element output from the lookahead buffer 1774.

(4) At a fourth operation 1879-4, if the current chunk size (c+L) is greater than or equal to a default chunk size (N), the method may set the early termination bit to one (e=1).

(5) At a fifth operation 1879-5, if the early termination bit is set (e=1) and a delimiter match has been found (e.g., l!=0), the method may set L equal to l (which is greater than one) and update the pointer P with the first matched delimiter (e.g., with the offset from the coding position indicating the beginning location of the first matched delimiter in the window 1773, and the length l indicating the length of the matched delimiter).

(6) At a sixth operation 1879-6, if a match is found (e.g., a longest match or a delimiter match) the method may output the pointer P, for example, based on the location and length of the longest match (e.g., a normal match) as shown in the middle of FIG. 17 or the location and length of the delimiter match (e.g., early termination) as shown at the bottom of FIG. 17 to generate the stream of compressed output data.

(7) At a seventh operation 1879-7, the method may move the coding position and window 1773 forward by L data elements, where L may be the length of a longest match as shown in the normal operation in the middle of FIG. 17 or L may be the length l of a delimiter match as shown in the early termination operation at the bottom of FIG. 17. After the seventh operation, the stream of data may have one or more invisible parts 1775A, 1775B, and/or 1775C depending on the lengths of L and l.

(8) At an eighth operation 1878-8, if the early termination bit is not set (e!=1) and the lookahead buffer 1774 is not empty, the method may return to the second operation (2) 1879-2. Otherwise, the end of the chunk may be determined by the end of the delimiter as shown at the coding position at the bottom of FIG. 17.

In some embodiments, because the scheme illustrated in FIG. 17 and/or the method illustrated in FIG. 18 may determine the chunk size when the first record is encountered (maximum smallest chunk), the chunk size may be based on the first delimiter match as shown in the early termination operation at the bottom of FIG. 17. As the method scans the stream of input data, the start of the chunk as shown in the middle and at the bottom of FIG. 17 may progressively move away from the coding position.

Depending on the implementation details, the embodiments illustrated in FIG. 17 and/or FIG. 18 may improve the efficiency of a data chunking operation because it may exploit a scanning operation that was already being performed for purposes of compression. Thus, in some embodiments, it may reduce or eliminate overhead associated with two scanning passes.

Figure 19:
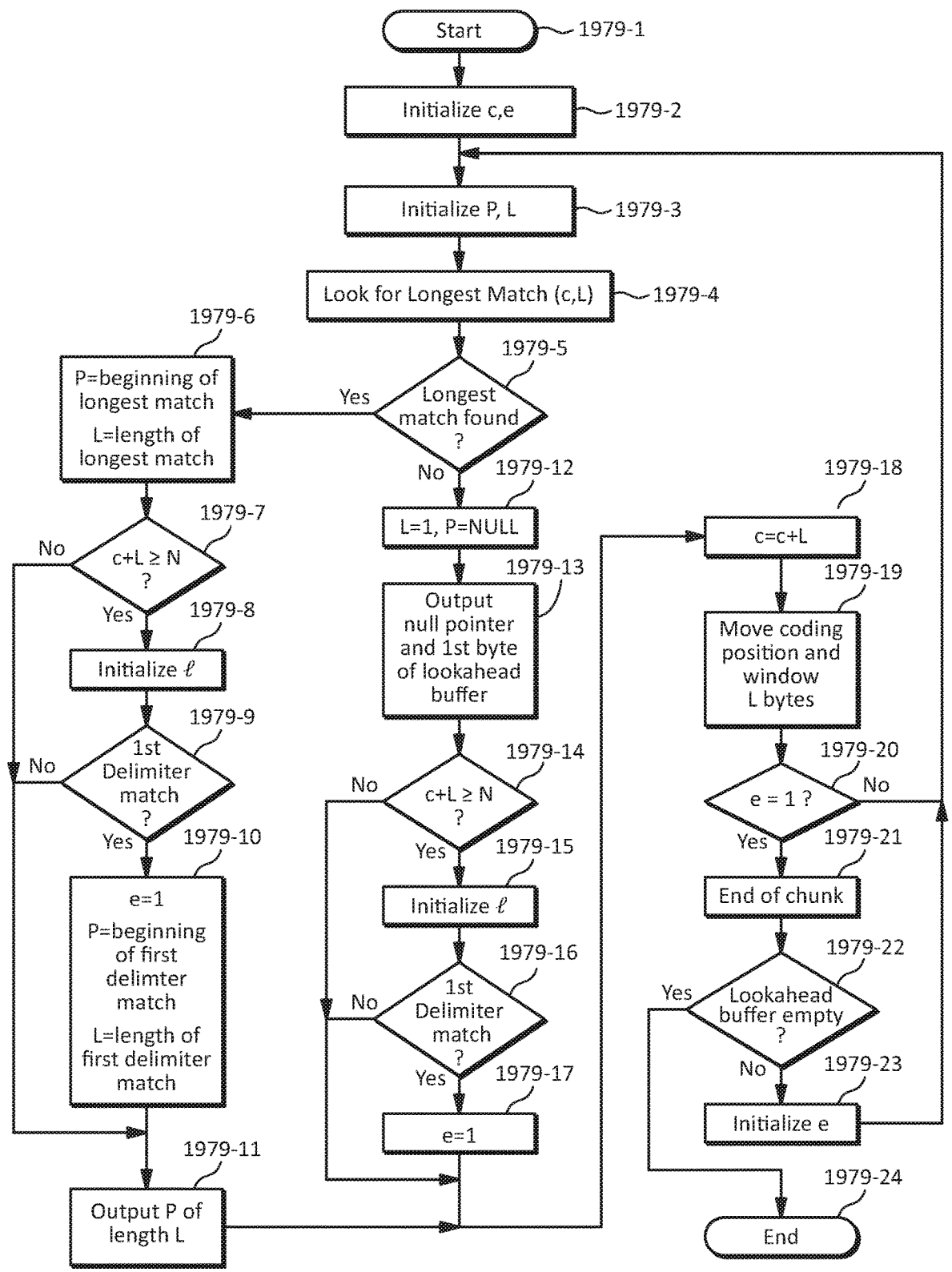
FIG. 19 illustrates another embodiment of an integrated chunking and compression method in accordance with example embodiments of the disclosure.

FIG. 19 illustrates another embodiment of an integrated chunking and compression method in accordance with example embodiments of the disclosure. The embodiment illustrated in FIG. 19 may be used, for example, with either or both of the embodiments illustrated in FIG. 15 and/or FIG. 17. In some embodiments, the method illustrated in FIG. 19 may implement a minimum largest chunk and/or a maximum smallest chunk. For example, depending on the implementation details, the embodiment illustrated in FIG. 19 may determine a minimum largest chunk when the longest match does not contain a delimiter, and a maximum smallest chunk when the longest match does contain a delimiter.

Referring to FIG. 19, the method may start at operation 1979-1. At operation 1979-2, which may be the beginning of a repeat sequence, the method may initialize a chunk size (c) and/or an early termination bit (e), for example, to zero. At operation 1979-3, the method may initialize a pointer P and a length L. At operation 1979-4, the method may look for a longest match (c, L) in a lookahead buffer.

At operation 1979-5, if a longest match is found, the method may take a first major branch down the left side of FIG. 19 as follows. At operation 1979-6, the method may set the pointer P to the beginning of the longest match and the length L to the length of the longest match. At operation 1979-7 the method may determine if the length of the current chunk size is greater than or equal to a default chunk size N (e.g., c+L≥N). If the current chunk size is not greater than or equal to the default chunk size N, the method may proceed to operation 1979-11 as described below. If, however, the current chunk size is greater than or equal to the default chunk size, the method may initialize a record delimiter length (l) at operation 1979-8. At operation 1979-9, if the method does not find a first delimiter match (c, l) in the lookahead buffer, the method may proceed to operation 1979-11 as described below. If, however, at operation 1979-9, the method finds a first delimiter match (c, l) in the lookahead buffer, the method may proceed to operation 1979-10 where the method may set the early termination bit to one (e=1), set the pointer P to the beginning of the first delimiter match in a sliding window, and/or set the length L to the length of the first delimiter match. At operation 1979-11, the method may output the pointer P and the length L. The method may proceed to a common branch down the right side of FIG. 19 beginning with operation 1979-18.

At operation 1979-5, if a longest match is not found, the method may take a second major branch down the center of FIG. 19 as follows. At operation 1979-12, the method may set the pointer P to the value of a null pointer and the length L to 1. At operation 1979-13, the method may output the null pointer P and the first byte of the lookahead buffer. At operation 1979-14, the method may determine if the length of the current chunk size is greater than or equal to a default chunk size N (e.g., c+L≥N). If the current chunk size is not greater than or equal to the default chunk size N, the method may proceed to the common branch down the right side of FIG. 19 beginning with operation 1979-18. If, however, at operation 1979-14, the current chunk size is greater than or equal to the default chunk size, the method may initialize a record delimiter length (l) at operation 1979-15. At operation 1979-16, if the method does not find a first delimiter match (c, l) in the lookahead buffer, the method may proceed to the common branch down the right side of FIG. 19 beginning with operation 1979-18. If, however, at operation 1979-16, the method finds a first delimiter match (c, l) in the lookahead buffer, the method may proceed to operation 1979-17 where the method may set the early termination bit to one (e=1). The method may proceed to the common branch down the right side of FIG. 19 beginning with operation 1979-18.

The common branch down the right side of FIG. 19 may proceed as follows. At operation 1979-18, the chunk size c may be updated by adding the length L (e.g., c=c+L), where L may be, for example, the length of the longest match, the length of the first delimiter match, or 1. At operation 1979-19, the coding position and window may be moved a distance L (e.g., L bytes). At operation 1979-20, if the early termination bit is not set (e=0), the method may return to operation 1979-3 to begin another iteration of the repeat sequence. If, however, the early termination bit is determined to be set (e=1), the method may indicate that the end of the current chunk has been found at operation 1979-21. At operation 1979-22, the method may determine if the lookahead buffer is empty. If the lookahead buffer is not empty, the method may proceed to operation 1979-23 where the early termination bit e may be reset to zero, and the method may return to operation 1979-3 to begin another iteration of the repeat sequence. However, if at operation 1979-22 the lookahead buffer is empty, the method may terminate at operation 1979-24.

Although the embodiments illustrated in FIG. 13, FIG. 14, FIG. 15, FIG. 16, FIG. 17, FIG. 18, and/or FIG. 19 may be described in the context of input data streams and/or stream-based compression algorithms, the principles may also be applied to any other type of input and/or compression algorithms such as batch-based (e.g., file-based) input data and/or compression algorithms based on blocks, files, and/or the like.

Table 2 illustrates an example embodiment of pseudo code for an integrated chunking and compression method in accordance with example embodiments of the disclosure. The embodiment illustrated in Table 2 may be used, for example, with either or both of the embodiments illustrated in FIG. 15 and/or FIG. 17. In some embodiments, the method illustrated in Table 2 may implement a minimum largest chunk and/or a maximum smallest chunk. For example, depending on the implementation details, the embodiment illustrated in Table 2 may determine a minimum largest chunk when the longest match does not contain a delimiter, and a maximum smallest chunk when the longest match does contain a delimiter.

TABLE 2

```
1   Start {
2     Initialize c, e
3     Repeat {
4       Initialize P, L
5       Find longest match (c, L) in lookahead buffer
6       if longest match is found {
7         P = beginning of longest match in window
8         L = length of longest match
9         If c+L>=N {
10          Initialize l
11          Find the 1st delimiter match (c, l) in lookahead buffer
12          If 1st delimiter match is found {
13            Set e=1
14            P = beginning of 1st delimiter match in window
15            L = length of 1st delimiter match (l)
16          }
17        }
18        Output P of length L
19      }
20      Else {
21        Set L=1, P=NULL
22        Output null pointer and 1st byte of lookahead buffer
23        If c+L>=N {
24          Initialize l
25          Find the 1st delimiter match (c, l) in lookahead buffer
26          If 1st delimiter match is found {
27            Set e=1
28          }
29        }
30      }
31      c = c + L
32      Move coding position and window L bytes
33      If e = 1 {
34        End of chunk
35        If lookadhead buffer empty
36          End
37        Else
38          Initialize e
39      }
40    } // end of repeat
41  } // end of start
```

Figure 20:
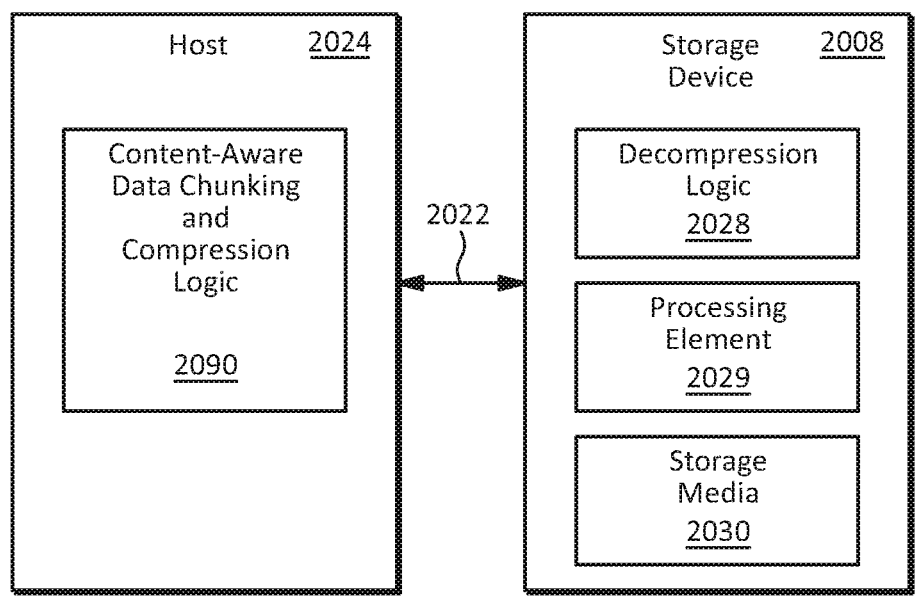
FIG. 20 illustrates an embodiment of a system with integrated chunking and compression in accordance with example embodiments of the disclosure.

FIG. 20 illustrates an embodiment of a system with integrated chunking and compression in accordance with example embodiments of the disclosure. The system illustrated in FIG. 20 may be used, for example, to implement any of the techniques described with respect to FIG. 13, FIG. 14, FIG. 15, FIG. 16, FIG. 17, FIG. 18, and/or FIG. 19.

Referring to FIG. 20, the system may include a host 2024 and a computational storage device 2008 that may communicate through a connection 2022. The host 2024 may include content-aware data chunking and compression logic 2090 (which may be referred to as chunking and compression logic, integrated chunking and compression logic, or integrated logic). The chunking and compression logic may be configured to provide one or more chunks of data to the storage device 2008. For example, the data chunking and compression logic 2090 may divide an object or other original data into one or more chunks of data prior to compression so the storage device 2008 may decompress a chunk of data and perform an operation on the decompressed chunk of data.

Because the chunking and compression logic 2090 may be content aware, in some embodiments, it may divide data into chunks based on boundaries between records. For example, the chunking and compression logic 2090 may look for a record delimiter in the data to divide the data into variable sized chunks such that a chunk may end with a record delimiter, and therefore, end with a complete record.

In some embodiments, the chunking and compression logic 2090 may include one or more lookahead buffers, window buffers, and/or the like, and may implement any of the techniques described with respect to FIG. 13, FIG. 14, FIG. 15, FIG. 16, FIG. 17, FIG. 18, and/or FIG. 19

The computational storage device 2008 may include decompression logic 2028, one or more processing elements 2029, and storage media 2030. The decompression logic 2028 may be configured to decompression a chunk of compressed data to a form on which the one or more processing elements 2029 may perform an operation. The one or more processing elements 2029 may be configured to perform any type of operation such as data selection (e.g., scanning, filtering, and/or the like), compute acceleration, graph processing, graphics processing, machine learning, and/or the like. The storage media 2030 may be used to store any data including or more modified chunks of data sent by the host 2024.

In some embodiments, the decompression logic 2028 and/or one or more processing elements 2029 may be configured to read and decompress one or more chunks of data from the storage media 2030 and return a specified subset of the data, or perform any other operation on the restored chunk of data, in response a request which may include a query (e.g., an expression) received at the storage device 2008.

In some embodiments, the computational storage device 2008 may further include indication logic that may be configured to provide one or more indications to the content-aware data chunking and compression logic 2090. The one or more indications may include information that may be used to determine how to divide original data into chunks as described above with respect to the embodiment illustrated in FIG. 5.

The host 2024 may be implemented with any component or combination of components as described above with respect to the embodiment illustrated in FIG. 4. The storage device 2008 may be implemented in any form factor, using any connector configuration, and any storage media as described above with respect to the embodiment illustrated in FIG. 4. The host 2024 and storage device 2008 may communicate using any type of storage interface and/or protocol, and may be implemented entirely or partially with, and/or used in connection with, a server chassis, server rack, dataroom, datacenter, edge datacenter, mobile edge datacenter, and/or any combinations thereof as described above with respect to the embodiment illustrated in FIG. 4. The communication connection 2022 may be implemented with any interconnect and/or network interfaces and/or protocols as described above with respect to the embodiment illustrated in FIG. 4. Any of the functionality, including any of the logic such as the content-aware data chunking and compression logic 2090, the decompression logic 2028, the one or more processing elements 2029, and/or the like, may be implemented with hardware, software or a combination thereof as described above with respect to the embodiment illustrated in FIG. 4. In some embodiments, one or more of the decompression logic 2028, processing elements 2029, and/or the like may be integrated with one or more other components of a storage device such as a storage device controller, a flash translation layer (FTL) and/or the like. The content-aware data chunking and compression logic 2090 and the decompression logic 2028 may implement any compression and/or decompression techniques such as LZ77, gzip, Snappy, and/or the like.

Figure 21:
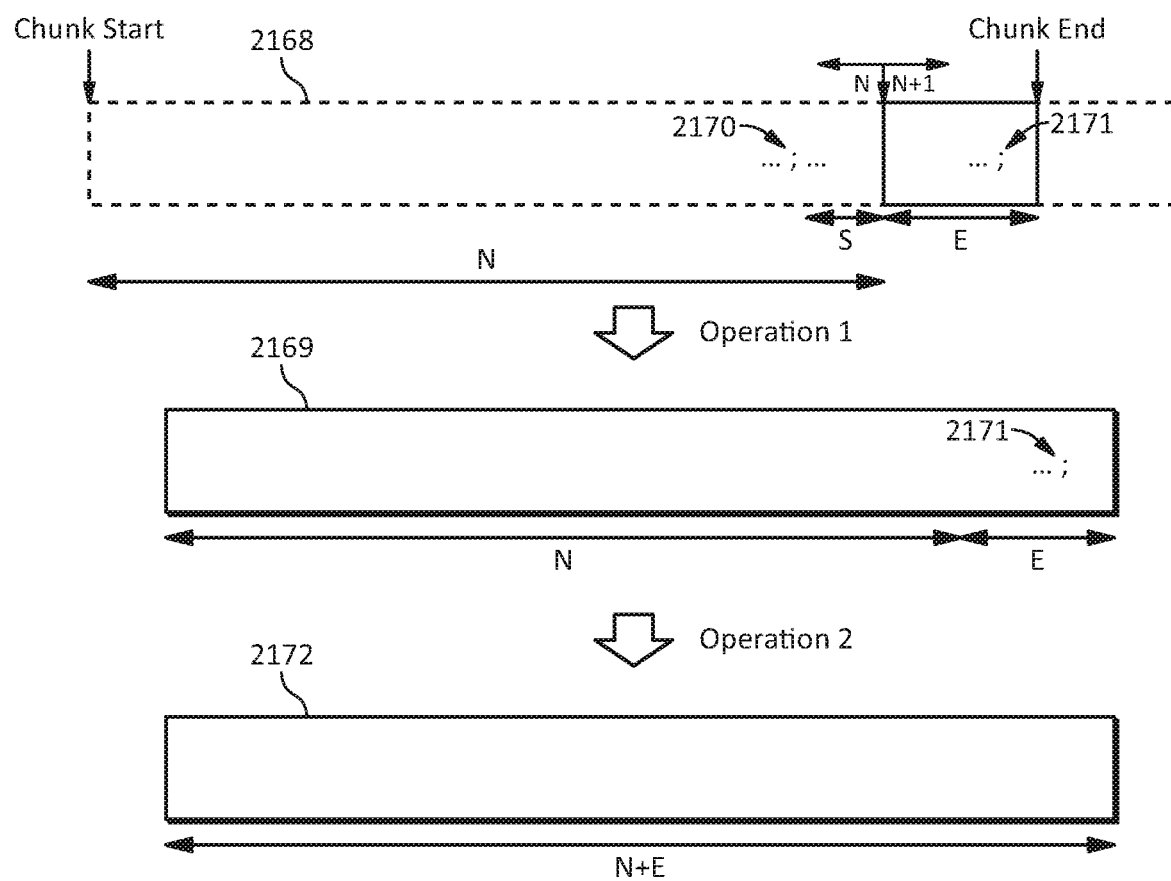
FIG. 21 illustrates an embodiment of a content-aware method for dividing data into chunks and encrypting data in accordance with example embodiments of the disclosure.

FIG. 21 illustrates an embodiment of a content-aware scheme for dividing data into chunks and encrypting data in accordance with example embodiments of the disclosure. In the embodiment illustrated in FIG. 21, unencrypted input data 2168 (which may be stored in a buffer) shown at the top of FIG. 21 may include one or more records that may each terminate with a delimiter which, in this example, may be a semicolon. In other embodiments, however, other delimiters such as brackets, carriage return-line feed (CR-LF) sequences, and/or the like, may be used. In some embodiments, one or more records may be included in an array (e.g., a JSON array), a document (e.g., a JSON document), and/or the like within the input data 2168. If a record ends at the end of an array, a document, and/or the like, a different delimiter may be used to indicate the end of the array, document, and/or the like, but the embodiment illustrated in FIG. 21 may also interpret the different delimiter as the end of a record.

During a first pass (Operation 1), the method may scan the input data 2168 and use it to generate a chunk of data until it reaches a default chunk size N. If the last data element in the chunk 2169 is a delimiter, the method may proceed to a second pass (Operation 2). If the last data element in the chunk is not a delimiter, the method may modify the size of the chunk so the end of the chunk aligns with the end of a delimiter. For example, the method may begin at position N+1 in a buffer holding the data 2168 and scan backward until it finds the delimiter 2170. The method may reduce the size of the chunk (e.g., shrink the chunk) until the delimiter 2170 is the last data element in the chunk. Thus, the chunk may be reduced by a size equal to the shrink space S so the chunk may only include one or more complete records.

Alternatively, the method may begin at position N+1 in a buffer holding the data 2168 and scan forward until it finds the delimiter 2171. The method may extend the size of the chunk until the delimiter 2171 is the last data element in the chunk 2169 as shown in the middle of FIG. 21. Thus, the chunk may be extended by a size equal to the extended space E so the chunk may only include one or more complete records.

In some embodiments, once the chunk size is determined, the method may proceed to a second pass (Operation 2) in which the self-contained chunk (e.g., chunk 2169), which may end with a delimiter and only include complete records, may be encrypted using one or more encryption algorithms to generate encrypted data 2172.

In some embodiments, because the size of a chunk of unencrypted data may be reduced or extended, the size of the chunk of unencrypted data 2169 may be variable, and thus, the size of the chunk of encrypted data 2172 may be variable.

Whether the method reduces or extends the length of the chunk may depend on various factors such as a maximum and/or optimal data size for an object or key-value storage device the chunk may be sent to, or a block size for a block-based storage device the chunk may be sent to. In the case of an object or key-value storage device, the resulting chunk of encrypted, self-contained data 2172 may be stored without further modification and/or processing.

Depending on the implementation details, the content-aware data chunking embodiment illustrated in FIG. 21 may improve the operation of a storage system such as that shown in FIG. 11, for example, because fewer or no records may be split between chunks on different storage devices, and thus, fewer or no fragments of records may be transferred between storage devices, storage nodes, storage servers, and/or the like, to enable components to restore chunks of data having complete records and/or perform operations on complete records.

The encryption scheme illustrated in FIG. 21 may be implemented, for example, using any of the systems illustrated in FIG. 4, FIG. 5, and/or FIG. 9, in which the chunking logic 426, 526, and/or 826 may include content-aware logic configured to determine a chunk size based on finding boundaries (e.g., delimiters) of records or other units of data in the unencrypted input data 2168.

Although the embodiment illustrated in FIG. 21 may improve the operation of a storage system, in some embodiments, and depending on the implementation details, the overhead associated with the use of two passes may increase the processing burden, especially when scanning relatively large objects.

Some additional content-aware data chunking techniques in accordance with example embodiments of the disclosure may integrate a chunking operation with an encryption operation that may scan the data to be chunked. Depending on the implementation details, this may improve the efficiency of the chunking operation because it may exploit a scanning operation that was already being performed for purposes of encryption. Thus, in some embodiments, it may reduce or eliminate overhead associated with two scanning passes.

Figure 22:
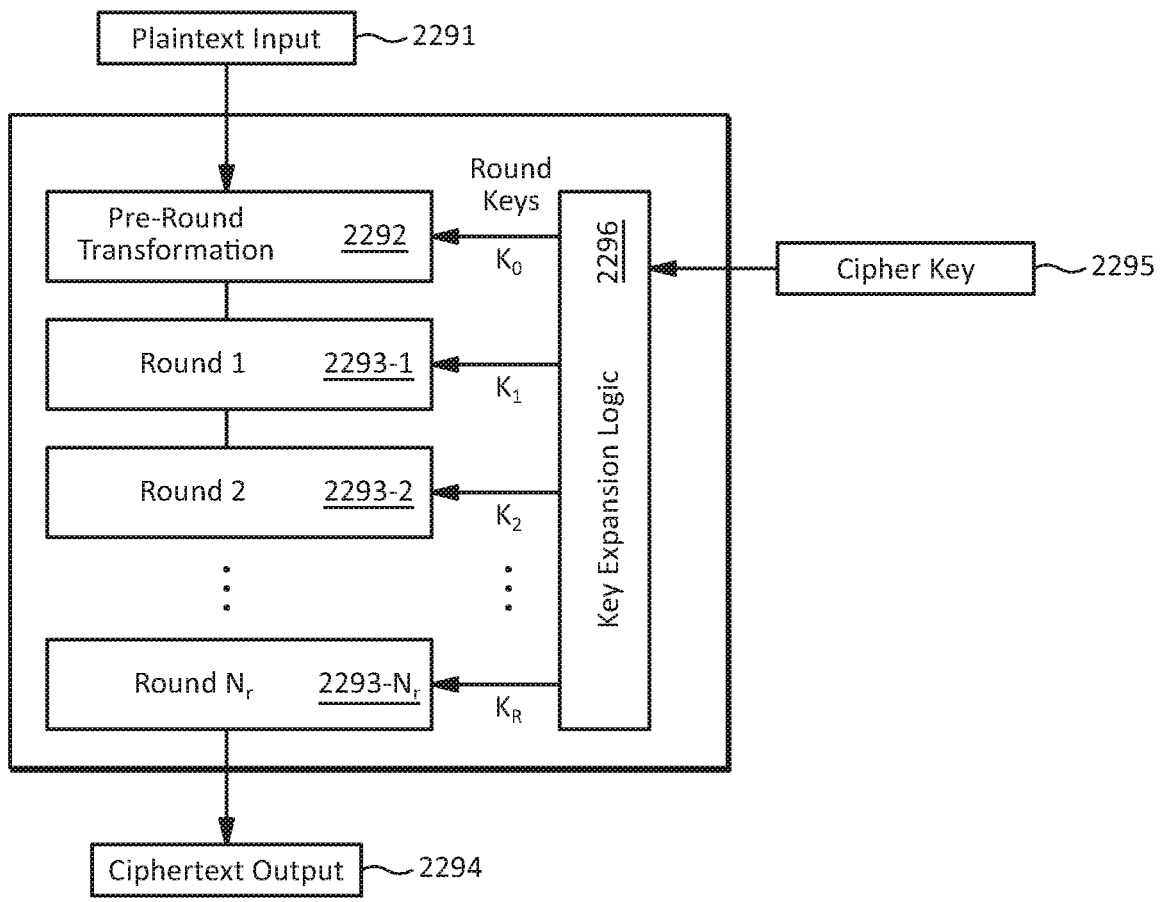
FIG. 22 illustrates an example embodiment of a block cipher method that may be used to encrypt data techniques in accordance with example embodiments of the disclosure.

FIG. 22 illustrates an example embodiment of a block cipher scheme that may be used to encrypt data techniques in accordance with example embodiments of the disclosure. The embodiment illustrated in FIG. 22 may be based, for example, on an AES algorithm. Data to be encrypted may be received as blocks (e.g., 128-bit blocks) of plaintext input data 2291, processed in a series of linked operations including a pre-round transformation 2292, one or more AES encryption rounds 2293-1, . . . , 2293-$N_r$ using round keys $K_0$, $K_1$, . . . , $K_R$ generated by key expansion logic 2296, and output as corresponding blocks (e.g., 128-bit blocks) of ciphertext output data 2294. The number of rounds R may be determined, for example, by the length of a cipher key 2295 (e.g., 128, 192, or 256 bits) used for the encryption rounds. In some embodiments, the size of the blocks of ciphertext output data 2294 may be the same size as the blocks of plaintext input data 2291.

In some embodiments, the terms plaintext and/or ciphertext may refer to not just to actual text, but to any data in any form such as images, audio, video, and/or the like.

Because input data may be scanned for encryption with a block cipher scheme such as that illustrated in FIG. 22, the embodiment illustrated in FIG. 22 may be integrated with a content-aware data chunking technique in accordance with example embodiments of the disclosure. Depending on the implementation details, this may improve the efficiency of the chunking operation because it may exploit a scanning operation that may already be performed for purposes of encryption. Thus, in some embodiments, it may reduce or eliminate overhead associated with two scanning passes because scanning for encryption and scanning for a delimiter may be performed at the same time.

Figure 23:
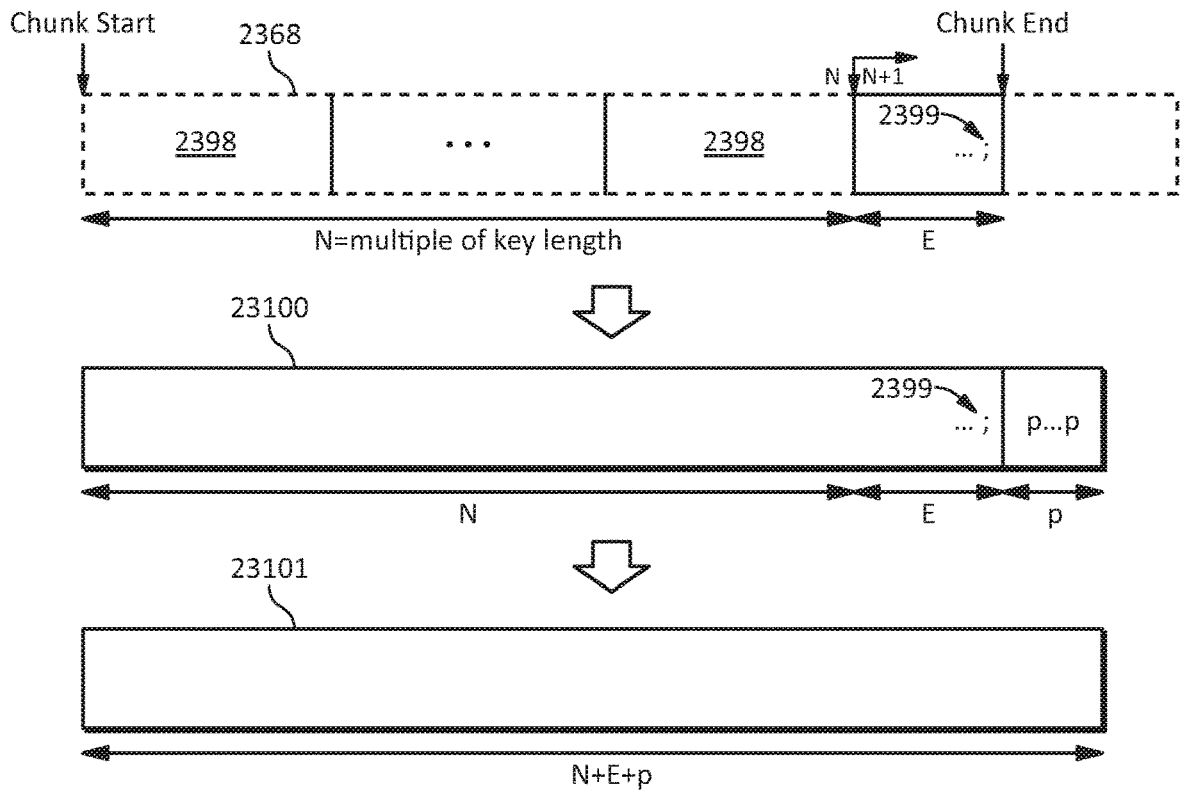
FIG. 23 illustrates an embodiment of an integrated data chunking and encryption scheme in accordance with example embodiments of the disclosure.
Figure 24:
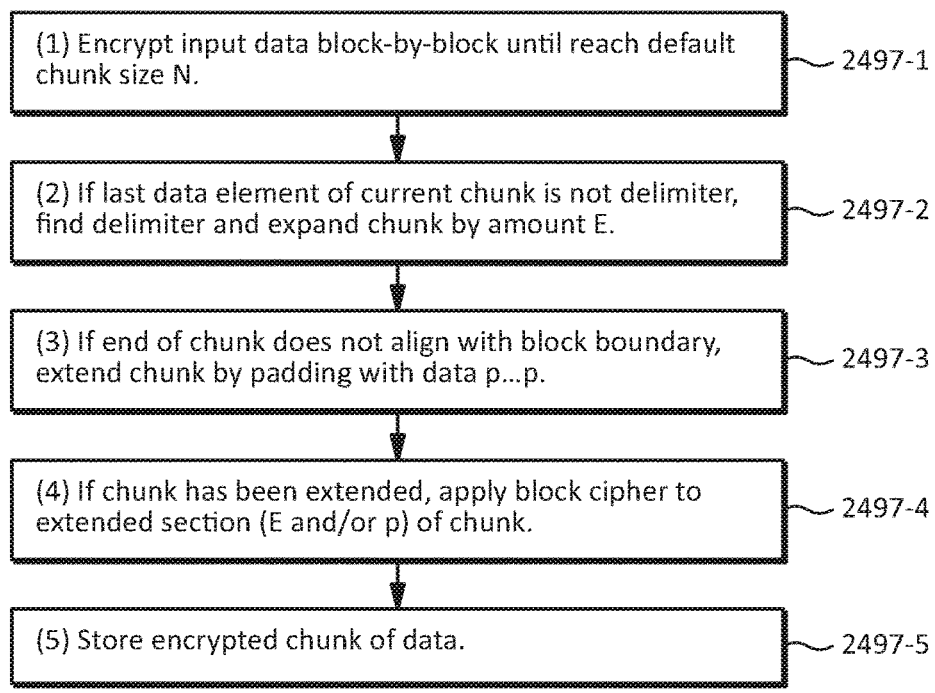
FIG. 24 illustrates an embodiment of an integrated data chunking and encryption method in accordance with example embodiments of the disclosure.

FIG. 23 illustrates an embodiment of an integrated data chunking and encryption scheme in accordance with example embodiments of the disclosure. FIG. 24 illustrates an embodiment of an integrated data chunking and encryption method in accordance with example embodiments of the disclosure. The embodiment illustrated in FIG. 24 may be used, for example, with the scheme illustrated in FIG. 23.

In the scheme illustrated in FIG. 23, a stream of unencrypted input data 2368 shown at the top of FIG. 23 may include one or more records that may each terminate with a delimiter which, in this example, may be a semicolon. In other embodiments, however, other delimiters such as brackets, carriage return-line feed (CR-LF) sequences, and/or the like, may be used. In some embodiments, one or more records may be included in an array (e.g., a JSON array), a document (e.g., a JSON document), and/or the like within the input data 2368. If a record ends at the end of an array, a document, and/or the like, a different delimiter may be used to indicate the end of the array, document, and/or the like, but the method illustrated in FIG. 23 may also interpret the different delimiter as the end of a record.

The scheme illustrated in FIG. 23 may be implemented with one or more of the following operations as illustrated in FIG. 24.

(1) At a first operation 2497-1, the method may scan the stream of input data 2368 and apply a block cipher, such as that illustrated in FIG. 22, to one or more portions (which may also be referred to as parts) 2398 of the stream of input data 2368 as shown in FIG. 23. The block cipher may be applied to the stream of input data 2368 on a block-by-block basis in which the size of the one or more parts 2398 may correspond to the block size used by the block cipher, which in turn, may correspond to a key length used by the block cipher. The stream of input data 2368 may be encrypted using the block cipher, for example, until a default chunk size N is reached. In some embodiments, the default chunk size N may be set to an even multiple of the block size (e.g. a key length) used by the block cipher.

(2) At a second operation 2497-2, if the last data element of the current chunk of data is not a delimiter, the method may continue scanning the stream of input data 2368 to find a delimiter 2399 and expand the chunk of data by an amount E until the delimiter 2399 is the last data element of the chunk as shown at the top of FIG. 23.

(3) At a third operation 2497-3, if the end of the chunk of data does not align with the end of a block used by the block cipher, the method may pad the chunk of data with padding elements "p" to further extend the chunk 23100 by an amount p such that the end of the chunk aligns with the end of a block as shown at the bottom of FIG. 23.

(4) At a fourth operation 2497-4, if the chunk has been extended, the block cipher may be applied to the block including the parts E and p (if any).

(5) At a fifth operation 2497-5, the resulting encrypted chunk of data 23101, which may have a variable length based on the position of the delimiter 2399 in the stream of input data, may be stored, for example, in a KV drive.

In some embodiments, the embodiments illustrated in FIG. 23 and/or FIG. 24 may be continued, for example, until the end of a user object in the stream of input data is reached. An object may be divided and encrypted into one or more chunks of encrypted data. Because (a) the size of the plaintext input data may be variable, (b) different default chunk sizes N may be used, and/or (c) a chunk may be extended to include a delimiter and/or one or more padding elements, the size of a chunk of encrypted data may be variable. In the case of an object or key-value storage device, the resulting chunk of encrypted, self-contained data may be stored without further modification and/or processing.

Depending on the implementation details, the content-aware data chunking embodiments illustrated in FIG. 23 and/or FIG. 24 may improve the operation of a storage system such as that shown in FIG. 11, for example, because fewer or no records may be split between chunks on different storage devices, and thus, fewer or no fragments of records may be transferred between storage devices, storage nodes, storage servers, and/or the like, to enable components to restore chunks of data having complete records and/or perform operations on complete records. Moreover, because the embodiments illustrated in FIG. 23 and/or FIG. 24 may exploit a scanning operation that was already being performed for purposes of encryption to perform data chunking, it may reduce or eliminate overhead associated with two scanning passes.

For purposes of illustration, the embodiments illustrated in FIG. 22, FIG. 23, and/or FIG. 24 may be described in the context of block ciphers such as AES. However, the principles may also be applied to schemes using stream ciphers such as RC4.

Figure 25:
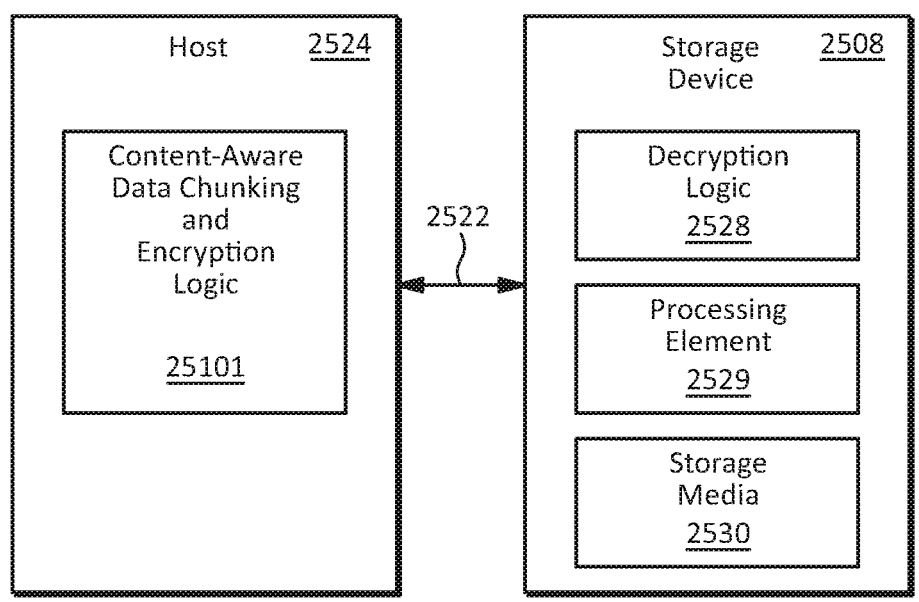
FIG. 25 illustrates an embodiment of a system with integrated chunking and encryption in accordance with example embodiments of the disclosure.

FIG. 25 illustrates an embodiment of a system with integrated chunking and encryption in accordance with example embodiments of the disclosure. The system illustrated in FIG. 25 may be used, for example, to implement any of the techniques described with respect to FIG. 22, FIG. 23, and/or FIG. 24.

Referring to FIG. 25, the system may include a host 2524 and a computational storage device 2508 that may communicate through a connection 2522. The host 2524 may include content-aware data chunking and encryption logic 25101 (which may be referred to as chunking and encryption logic, integrated chunking and encryption logic, or integrated logic). The chunking and encryption logic may be configured to provide one or more chunks of data to the storage device 2508. For example, the data chunking and encryption logic 25101 may divide an object or other original data into one or more chunks of data prior to encryption so the storage device 2508 may decrypt a chunk of data and perform an operation on the decrypted chunk of data.

Because the chunking and encryption logic 25101 may be content aware, in some embodiments, it may divide data into chunks based on boundaries between records. For example, the chunking and encryption logic 25101 may look for a record delimiter in the data to divide the data into variable sized chunks such that a chunk may end with a record delimiter, and therefore, end with a complete record.

The computational storage device 2508 may include decryption logic 2528, one or more processing elements 2529, and storage media 2530. The decryption logic 2528 may be configured to decryption a chunk of encrypted data to a form on which the one or more processing elements 2529 may perform an operation. The one or more processing elements 2529 may be configured to perform any type of operation such as data selection (e.g., scanning, filtering, and/or the like), compute acceleration, graph processing, graphics processing, machine learning, and/or the like. The storage media 2530 may be used to store any data including or more modified chunks of data sent by the host 2524.

In some embodiments, the decryption logic 2528 and/or one or more processing elements 2529 may be configured to read and decrypt one or more chunks of data from the storage media 2530 and return a specified subset of the data, or perform any other operation on the restored chunk of data, in response a request which may include a query (e.g., an expression) received at the storage device 2508.

In some embodiments, the computational storage device 2508 may further include indication logic that may be configured to provide one or more indications to the content-aware data chunking and decryption logic 25101. The one or more indications may include information that may be used to determine how to divide original data into chunks as described above with respect to the embodiment illustrated in FIG. 5.

The host 2524 may be implemented with any component or combination of components as described above with respect to the embodiment illustrated in FIG. 4. The storage device 2508 may be implemented in any form factor, using any connector configuration, and any storage media as described above with respect to the embodiment illustrated in FIG. 4. The host 2524 and storage device 2508 may communicate using any type of storage interface and/or protocol, and may be implemented entirely or partially with, and/or used in connection with, a server chassis, server rack, dataroom, datacenter, edge datacenter, mobile edge datacenter, and/or any combinations thereof as described above with respect to the embodiment illustrated in FIG. 4. The communication connection 2522 may be implemented with any interconnect and/or network interfaces and/or protocols as described above with respect to the embodiment illustrated in FIG. 4. Any of the functionality, including any of the logic such as the content-aware data chunking and encryption logic 25101, the decryption logic 2528, the one or more processing elements 2529, and/or the like, may be implemented with hardware, software or a combination thereof as described above with respect to the embodiment illustrated in FIG. 4. In some embodiments, one or more of the decryption logic 2528, processing elements 2529, and/or the like may be integrated with one or more other components of a storage device such as a storage device controller, a flash translation layer (FTL) and/or the like. The content-aware data chunking and encryption logic 25101 and the decryption logic 2528 may implement any encryption and/or decryption techniques such as Data Encryption Standard (DES), AES, and/or the like.

Although some embodiments may be described in the context of integrated data chunking and compression, encryption, and/or the like for use by computational storage devices, the principles are not limited to any particular application and may be applied for use in any data chunking applications, and for use with any types of devices including accelerators, network interface cards (NICs), and/or the like.

For purposes of illustration, embodiments that may implement integrated chunking and compression and integrated chunking and encryption may be shown separately, but the principles may be combined in accordance with example embodiments of the disclosure to implement schemes that may implement integrated data chunking, compression, and encryption.

The principles disclosed herein may be applied to integrate data chunking, not only into data compression and/or data encryption operations, but also into any type of operation that may scan data including, for example, filtering, erasure coding, searching, machine learning, graph processing, and/or the like. For example, in the embodiments illustrated in FIG. 20 and FIG. 25, the data chunking and compression logic 2090 and/or the data chunking and encryption logic 25101 may be adapted to integrate scanning, for purposes of chunking, with scanning for any other operation. Thus, in some embodiments, a method may include scanning input data, performing, based on the scanning, an operation using the input data to generate processed data, finding, based on the scanning, a delimiter in the input data, and generating, based on a position of the delimiter in the input data, a chunk of data using the processed data. In some embodiments, the data may include a stream of input data, and the operation may be a streaming-based operation. In some embodiments, the operation may be a block-based operation. In some embodiments, a system may include a host including host logic configured to perform a scanning operation on input data, perform, based on the scanning operation, a processing operation to generate processed data using the input data, find, based on the scanning operation, a delimiter in the input data, and generate, based on the delimiter, a chunk of data using the processed data. In some embodiments, the system may further include a device configured to receive the chunk of data from the host, the device including device logic configured to restore the chunk of data to generate a restored chunk of data, and perform an operation on the restored chunk of data.

Figure 26:
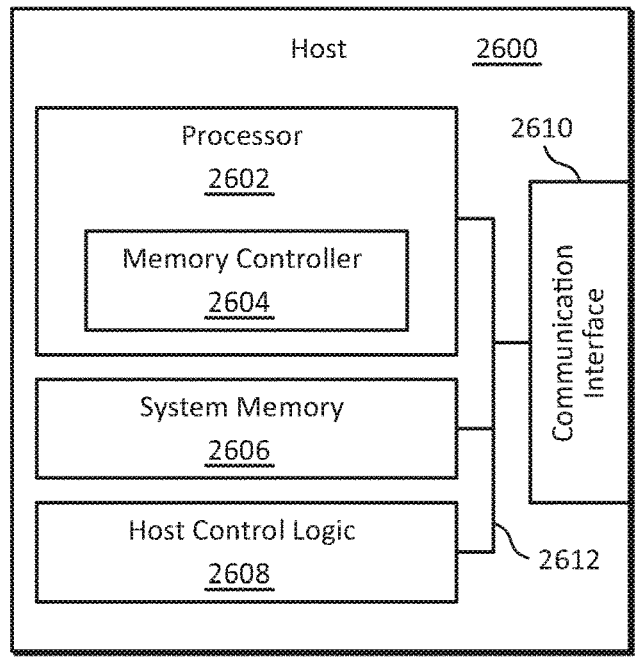
FIG. 26 illustrates an example embodiment of a host apparatus for a storage scheme with data chunk modification in accordance with example embodiments of the disclosure.

FIG. 26 illustrates an example embodiment of a host apparatus for a storage scheme with data chunk modification in accordance with example embodiments of the disclosure. The host 2600 illustrated in FIG. 26 may be used to implement any of the host functionality disclosed herein. The host 2600 may be implemented with any component or combination of components such as one or more clients, one or more object storage servers, one or more storage nodes, and/or the like, or a combination thereof.

The host apparatus 2600 illustrated in FIG. 26 may include a processor 2602, which may include a memory controller 2604, a system memory 2606, host control logic 2608, and/or communication interface 2610. Any or all of the components illustrated in FIG. 26 may communicate through one or more system buses 2612. In some embodiments, one or more of the components illustrated in FIG. 26 may be implemented using other components. For example, in some embodiments, the host control logic 2608 may be implemented by the processor 2602 executing instructions stored in the system memory 2606 or other memory.

The host control logic 2608 may include and/or implement any of the host functionality disclosed herein including data chunking logic 426, 526, and/or 826, data modification logic 427 and/or 527, compression logic 846, encryption logic 847, erasure coding logic 848, data selection logic 849, cluster management logic 850, node and device management logic 851, processing units 852, content-aware data chunking and compression logic 2090, content-aware data chunking and decryption logic 25101, and/or the like.

Figure 27:
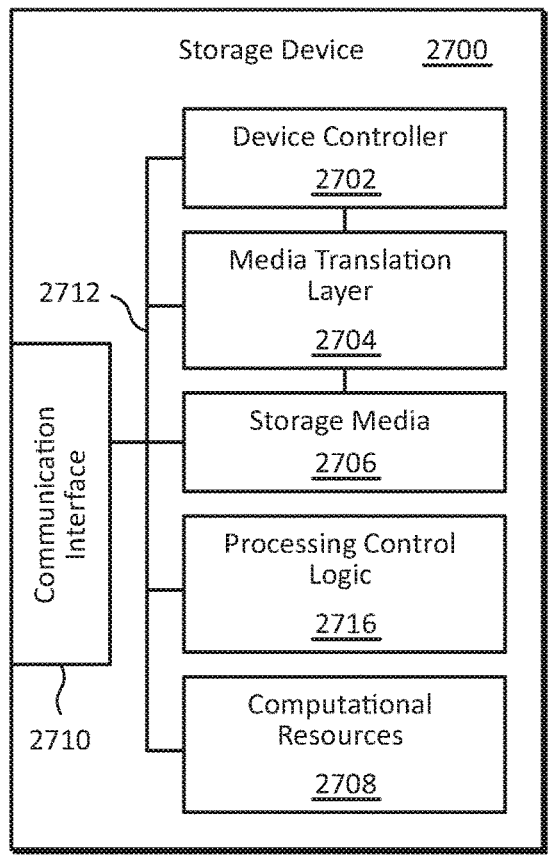
FIG. 27 illustrates an example embodiment of a storage device with data chunk modification in accordance with example embodiments of the disclosure.

FIG. 27 illustrates an example embodiment of a storage device with data chunk modification in accordance with example embodiments of the disclosure. The storage device 2700 illustrated in FIG. 27 may be used to implement any of the storage device functionality disclosed herein. The storage device 2700 may include a device controller 2702, a media translation layer 2704, a storage media 2706, computational resources 2708, processing control logic 2716, and a communication interface 2710. The components illustrated in FIG. 27 may communicate through one or more device buses 2712. In some embodiments that may use flash memory for some or all of the storage media 2706, the media translation layer 2704 may be implemented partially or entirely as a flash translation layer (FTL).

In some embodiments, the processing control logic 2716 may be used to implement any of the storage device functionality disclosed herein including data restoration logic 428 and/or 528, processing elements 429, 529, and/or 1429, indication logic 531, data selection engine 853, decryption logic 854, decompression logic 855, data selection logic 856, key-value logic 857, decompression logic 2028, one or more processing elements 2029, decryption logic 2528, the one or more processing elements 2529, and/or the like.

As mentioned above, any of the functionality described herein, including any of the host (e.g., client, storage server, storage node, and/or the like) functionality, storage device functionally, and/or the like, described herein may be implemented with hardware, software, or any combination thereof, including combinational logic, sequential logic, one or more timers, counters, registers, state machines, volatile memories such as DRAM and/or SRAM, nonvolatile memory and/or any combination thereof, CPLDs, FPGAs, ASICs, CPUs including CISC processors such as x86 processors and/or RISC processors such as ARM processors, GPUs, NPUs, and/or the like, executing instructions stored in any type of memory. In some embodiments, one or more components may be implemented as a system-on-chip (SOC).

Figure 28:
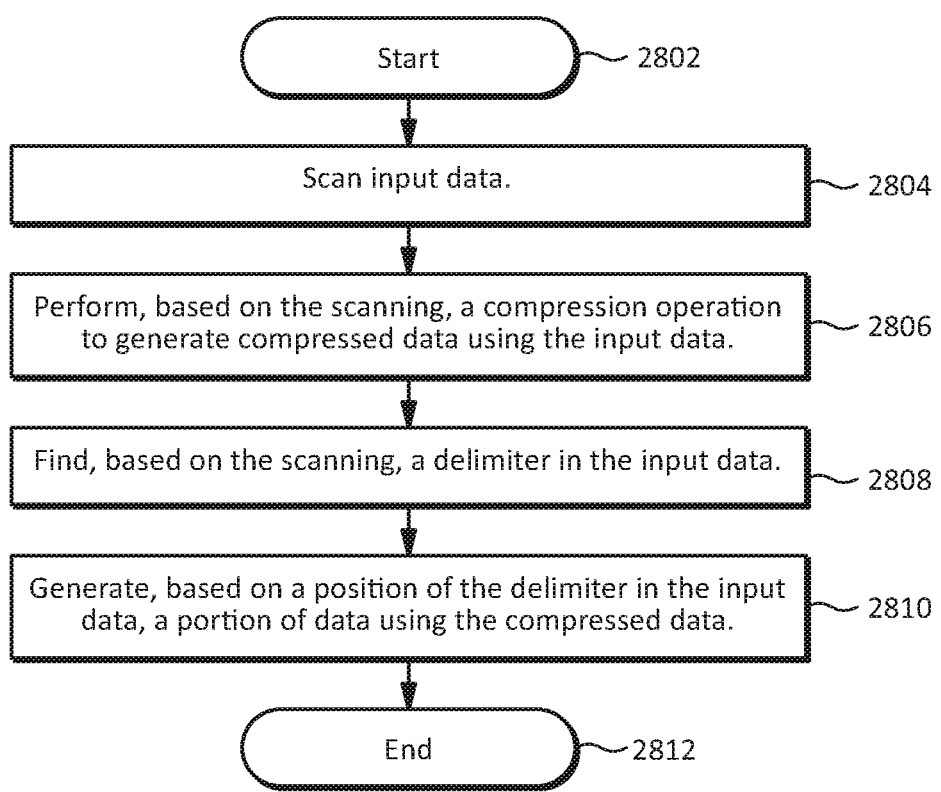
FIG. 28 illustrates an embodiment of a method for data compression in accordance with example embodiments of the disclosure.

FIG. 28 illustrates an embodiment of a method for data compression in accordance with example embodiments of the disclosure. The method may begin at operation 2802. At operation 2804, the method may scan input data. In some embodiments, the input data may be received as a stream of input data. At operation 2806, the method may perform, based on the scanning, a compression operation to generate compressed data using the input data. At operation 2808, the method may find, based on the scanning, a delimiter in the input data. For example, the input data may include one or more records, and a delimiter may indicate a boundary of a record. At operation 2810, the method may generate, based on a position of the delimiter in the input data, a portion of data using the compressed data. The method may end at operation 2812.

Figure 29:
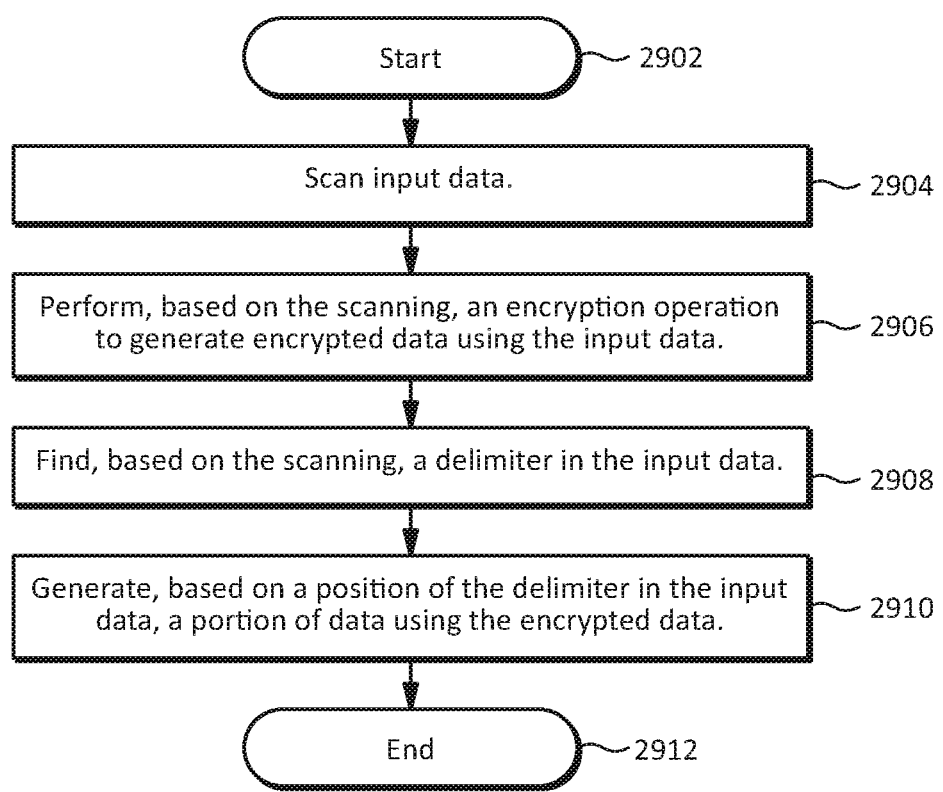
FIG. 29 illustrates an embodiment of a method for data encryption in accordance with example embodiments of the disclosure.

FIG. 29 illustrates an embodiment of a method for data encryption in accordance with example embodiments of the disclosure. The method may begin at operation 2902. At operation 2904, the method may scan input data. In some embodiments, the input data may be received as a stream of input data. At operation 2906, the method may perform, based on the scanning, an encryption operation to generate encrypted data using the input data. At operation 2908, the method may find, based on the scanning, a delimiter in the input data. For example, the input data may include one or more records, and a delimiter may indicate a boundary of a record. At operation 2910, the method may generate, based on a position of the delimiter in the input data, a portion of data using the encrypted data. The method may end at operation 2912.

Figure 30:
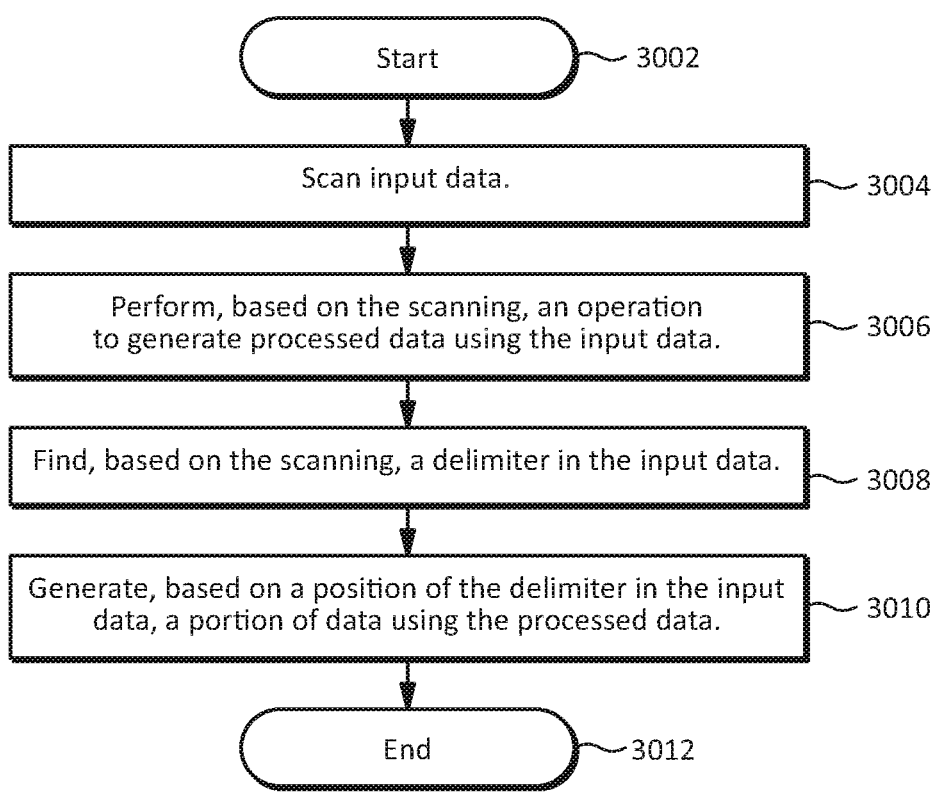
FIG. 30 illustrates an embodiment of a method for data chunking data in accordance with example embodiments of the disclosure.

FIG. 30 illustrates an embodiment of a method for data dividing data into one or more portions data in accordance with example embodiments of the disclosure. The method may begin at operation 3002. At operation 3004, the method may scan input data. In some embodiments, the input data may be received as a stream of input data. At operation 3006, the method may perform, based on the scanning, an operation on the input data to generate processed data. In some embodiments, the operation may be any operation that may scan data such as compression, encryption, filtering, erasure coding, searching, machine learning, graph processing, and/or the like. At operation 3008, the method may find, based on the scanning, a delimiter in the input data. For example, the input data may include one or more records, and a delimiter may indicate a boundary of a record. At operation 3010, the method may generate, based on a position of the delimiter in the input data, a portion of data using the processed data. The method may end at operation 3012.

The embodiments illustrated in FIG. 28, FIG. 29, and FIG. 30, as well as all of the other embodiments described herein, are example operations and/or components. In some embodiments, some operations and/or components may be omitted and/or other operations and/or components may be included. Moreover, in some embodiments, the temporal and/or spatial order of the operations and/or components may be varied. Although some components and/or operations may be illustrated as individual components, in some embodiments, some components and/or operations shown separately may be integrated into single components and/or operations, and/or some components and/or operations shown as single components and/or operations may be implemented with multiple components and/or operations.

Some embodiments disclosed above have been described in the context of various implementation details, but the principles of this disclosure are not limited to these or any other specific details. For example, some functionality has been described as being implemented by certain components, but in other embodiments, the functionality may be distributed between different systems and components in different locations and having various user interfaces. Certain embodiments have been described as having specific processes, operations, etc., but these terms also encompass embodiments in which a specific process, operation, etc. may be implemented with multiple processes, operations, etc., or in which multiple processes, operations, etc. may be integrated into a single process, step, etc. A reference to a component or element may refer to only a portion of the component or element. For example, a reference to a block may refer to the entire block or one or more subblocks. The use of terms such as "first" and "second" in this disclosure and the claims may only be for purposes of distinguishing the things they modify and may not indicate any spatial or temporal order unless apparent otherwise from context. In some embodiments, a reference to a thing may refer to at least a portion of the thing, for example, "based on" may refer to "based at least in part on," and/or the like. A reference to a first element may not imply the existence of a second element. The principles disclosed herein have independent utility and may be embodied individually, and not every embodiment may utilize every principle. However, the principles may also be embodied in various combinations, some of which may amplify the benefits of the individual principles in a synergistic manner.

The various details and embodiments described above may be combined to produce additional embodiments according to the inventive principles of this patent disclosure. Since the inventive principles of this patent disclosure may be modified in arrangement and detail without departing from the inventive concepts, such changes and modifications are considered to fall within the scope of the following claims.

The invention claimed is:

1. A method for data compression, the method comprising:
receiving input data in a first buffer;
finding a delimiter in the input data;
generating, based on a position of the delimiter in the input data, a first portion of data using a part of the input data, wherein a size of the first portion of data is determined based on the position of the delimiter in the input data, the size of the first portion of data is used to determine a size of a second portion of data in a second buffer; and
compressing the second portion of data.

2. The method of claim 1, wherein:
the input data comprises a record;
the delimiter indicates a boundary of the record; and
the first portion of data comprises the record.

3. The method of claim 1, wherein the position of the delimiter is in the part of the input data.

4. The method of claim 3, wherein the generating the first portion of data comprises generating the first portion of data based on a subset of the part of the input data.

5. The method of claim 1, wherein:
the part of the input data is a first part of the input data; and
the position of the delimiter is in a second part of the input data.

6. The method of claim 5, wherein the generating the portion of data comprises generating the first portion of data based on the first part of the input data and the second part of the input data.

7. The method of claim 1, wherein a size of the part of input data is based on a default portion size.

8. The method of claim 1, wherein the second buffer is a window.

9. A method for data compression, the method comprising:
scanning input data;
performing, based on the scanning, a compression operation to generate compressed data using the input data;
finding, based on the scanning, a delimiter in the input data, wherein a size of a first portion of data is determined based on a position of the delimiter in the input data, the size of the first portion of data is used to determine a size of a second portion of data in a second buffer; and
generating, based on the position of the delimiter in the input data, the first portion of data using the compressed data.

10. The method of claim 9, wherein
the input data comprises a record;
the delimiter indicates a boundary of the record; and
the portion of data comprises the record.

11. The method of claim 9, wherein the generating comprises generating the first portion of data based on a portion size.

12. The method of claim 11, wherein the portion size is a default portion size.

13. The method of claim 11, wherein the portion size is based on a default portion size and a length of a delimiter in the input data.

14. The method of claim 9, further comprising setting an indication based on a size of the compressed data.

15. The method of claim 14, wherein the generating comprises generating the first portion of data based on the indication and the delimiter.

16. The method of claim 14, wherein the scanning comprises scanning the input data based on the indication.

17. The method of claim 9, wherein the scanning comprises scanning the input data based on the delimiter.

18. The method of claim 9, wherein the performing comprises performing the compression operation based on the delimiter.

19. A system comprising:
a host comprising a memory for storing instructions; and
a processor configured to execute the instructions to:
perform a scanning operation on input data;
perform, based on the scanning operation, a data compression operation to generate compressed data using the input data;
find, based on the scanning operation, a delimiter in the input data; and
generate, based on the delimiter, a first portion of data using the compressed data, wherein a size of the first portion of data is determined based on a position of the delimiter in the input data, the size of the first portion of data is used to determine a size of a second portion of data in a second buffer.

20. The system of claim 19, further comprising a device configured to receive the first portion of data from the host, the device comprising device logic configured to:

decompress the first portion of data to generate a decompressed portion of data; and perform an operation on the decompressed portion of data.

* * * * *